United States Patent
Shimatsu

(10) Patent No.: US 12,200,963 B2
(45) Date of Patent: Jan. 14, 2025

(54) LIGHT EMITTING ELEMENT AND DISPLAY DEVICE

(71) Applicant: Sony Group Corporation, Tokyo (JP)

(72) Inventor: Tomohiko Shimatsu, Kanagawa (JP)

(73) Assignee: Sony Group Corporation, Tokyo (JP)

( * ) Notice: Subject to any disclaimer, the term of this patent is extended or adjusted under 35 U.S.C. 154(b) by 502 days.

(21) Appl. No.: 17/419,928

(22) PCT Filed: Jan. 31, 2020

(86) PCT No.: PCT/JP2020/003681
§ 371 (c)(1),
(2) Date: Jun. 30, 2021

(87) PCT Pub. No.: WO2020/162355
PCT Pub. Date: Aug. 13, 2020

(65) Prior Publication Data
US 2022/0085335 A1  Mar. 17, 2022

(30) Foreign Application Priority Data
Feb. 8, 2019 (JP) .................................. 2019-021477

(51) Int. Cl.
*H10K 50/858* (2023.01)
*H10K 50/852* (2023.01)
(Continued)

(52) U.S. Cl.
CPC ......... *H10K 50/858* (2023.02); *H10K 50/852* (2023.02); *H10K 50/856* (2023.02); *H10K 59/38* (2023.02)

(58) Field of Classification Search
CPC ........................... H10K 50/858; H10K 50/856
See application file for complete search history.

(56) References Cited

U.S. PATENT DOCUMENTS

2018/0269428 A1  9/2018  Uchida
2019/0251318 A1*  8/2019  Jung ...................... H10K 59/40
2020/0119113 A1*  4/2020  Lee ..................... H10K 50/8445

FOREIGN PATENT DOCUMENTS

| CN | 102187735 A | 9/2011 |
| CN | 102629622 A | 8/2012 |

(Continued)

OTHER PUBLICATIONS

Machine Translation of JP 2006147206 (Year: 2006).*
(Continued)

*Primary Examiner* — Eric K Ashbahian
*Assistant Examiner* — Halee Cramer
(74) *Attorney, Agent, or Firm* — Michael Best & Friedrich LLP

(57) ABSTRACT

A light emitting element includes a light emitting portion, an intermediate layer covering the light emitting portion, an optical path control unit disposed on or above the intermediate layer, and a coating layer covering at least the optical path control unit. Light emitted from the light emitting portion passes through the intermediate layer, and enters then exits from the optical path control unit. The coating layer includes first and second coating layer. The first coating layer covers a part of an outer surface of the optical path control unit on the intermediate layer side. The second coating layer covers the first coating layer and the rest of the outer surface of the optical path control unit. Values of refractive indices of materials constituting the optical path control unit, the first coating layer, and the second coating layer are different from each other.

17 Claims, 33 Drawing Sheets

(51) Int. Cl.
*H10K 50/856* (2023.01)
*H10K 59/38* (2023.01)

(56) References Cited

FOREIGN PATENT DOCUMENTS

| CN | 107852787 A | | 3/2018 |
|---|---|---|---|
| CN | 109148723 A | | 1/2019 |
| JP | 09-127309 A | | 5/1997 |
| JP | 2006147206 A | * | 6/2006 |
| JP | 2010-231010 A | | 10/2010 |
| JP | 2012007046 A | | 1/2012 |
| JP | 2013058447 A | | 3/2013 |
| JP | 2015-088418 A | | 5/2015 |
| JP | 2015206813 A | | 11/2015 |
| KR | 20100022296 A | | 3/2010 |

OTHER PUBLICATIONS

"Optical Power" Wikipedia (Year: 2004).*
Machine Translation (Year: 2006).*
Properties of Fluorocarbons (Year: 1947).*
International Search Report (PCT/ISA/210), International Application No. PCT/JP2020/003681, dated Mar. 16, 2020.
Notification of Transmittal of the International Search Report and the Written Opinion of the International Searching Authority, or the Declaration (PCT/ISA/220), International Application No. PCT/JP2020/003681, dated Mar. 31, 2020.
Written Opinion of the International Search Authority (PCT/ISA/237), International Application No. PCT/JP2020/003681, dated Mar. 31, 2020.

* cited by examiner

LIGHT EMITTING ELEMENT AND DISPLAY DEVICE

TECHNICAL FIELD

The present disclosure relates to a light emitting element and a display device including a plurality of the light emitting elements.

BACKGROUND ART

In recent years, development of a display device (organic EL display device) using an organic electroluminescence (EL) element as a light emitting element is progressing. This organic EL display device includes, for example, a plurality of light emitting elements in each of which an organic layer including at least a light emitting layer and a second electrode (upper electrode, for example, cathode electrode) are formed on a first electrode (lower electrode, for example, anode electrode) formed so as to be isolated for each pixel. In addition, for example, each of a red light emitting element, a green light emitting element, and a blue light emitting element is disposed as a sub-pixel. These sub-pixels constitute one pixel, and light emitted from the light emitting layer is emitted to the outside via the second electrode (upper electrode).

In such a display device, a lens member is disposed on a light emitting side of each of the light emitting elements in order to improve light extraction efficiency and increase front brightness. For example, Japanese Patent Application Laid-Open No. 2013-058447 discloses an organic EL light emitting device in which a color conversion member, a low refractive index layer, and a microlens are disposed in this order on a light extraction side of an organic EL element, and the low refractive index layer has a smaller refractive index than the color conversion member and the microlens.

CITATION LIST

Patent Document

Patent Document 1: Japanese Patent Application Laid-Open No. 2013-058447
Patent Document 2: Japanese Patent Application Laid-Open No. 2012-007046

SUMMARY OF THE INVENTION

Problems to be Solved by the Invention

In order to increase an optical power of a lens member, a difference in refractive index between a lens surface of the lens member and a member in contact with the lens surface is important. However, the above Patent Publication does not mention any member in contact with a lens surface. Japanese Patent Application Laid-Open No. 2012-007046 discloses an optical laminated sheet including an optical film that has been processed to have recesses and protrusions and a pressure-sensitive adhesive layer formed on the recessed and protruded surface of the optical film, in which the pressure-sensitive adhesive layer is formed in a part of the protruded portion of the optical film that has been processed to have recesses and protrusions, and 5% to 90% of the height of the protruded portion is filled with the pressure-sensitive adhesive layer. Here, the optical film constitutes a microlens, and an air layer exists between the protruded portions. Since an air layer having a refractive index of 1 exists between the protruded portions, it is possible to increase an optical power of the lens member. However, a difference in refractive index is too large, and in a case where the optical laminated sheet is applied to an organic EL display device, light extraction efficiency and front brightness cannot be increased disadvantageously.

Therefore, an object of the present disclosure is to provide a light emitting element having a configuration and a structure capable of increasing light extraction efficiency and front brightness, and a display device including such a light emitting element.

Solutions to Problems

A light emitting element according to any one of first to third aspects of the present disclosure for achieving the above object includes:
a light emitting portion;
an intermediate layer covering the light emitting portion;
an optical path control unit disposed on or above the intermediate layer; and
a coating layer covering at least the optical path control unit,
light emitted from the light emitting portion passes through the intermediate layer, enters the optical path control unit, and exits from the optical path control unit, and
the coating layer includes a first coating layer and a second coating layer.

In addition, in the light emitting element according to the first aspect of the present disclosure,
the first coating layer covers a part of an outer surface of the optical path control unit on the intermediate layer side,
the second coating layer covers the first coating layer and the rest of the outer surface of the optical path control unit, and
a value $n_0$ of a refractive index of a material constituting the optical path control unit, a value $n_1$ of a refractive index of a material constituting the first coating layer, and a value $n_2$ of a refractive index of a material constituting the second coating layer are different from each other.

Furthermore, in the light emitting element according to the second aspect of the present disclosure,
the first coating layer covers a part of an outer surface of the optical path control unit on the intermediate layer side,
the second coating layer covers the first coating layer and the rest of the outer surface of the optical path control unit, and
the first coating layer is constituted by a material different from a material constituting the second coating layer.

Moreover, in the light emitting element according to the third aspect of the present disclosure,
the first coating layer is in contact with an outer edge side of the optical path control unit on the outer surface of the optical path control unit,
the second coating layer is in contact with a central side of the optical path control unit on the outer surface of the optical path control unit, and
a value $n_0$ of a refractive index of a material constituting the optical path control unit, a value $n_1$ of a refractive index of a material constituting the first coating layer, and a value $n_2$ of a refractive index of a material constituting the second coating layer are different from each other, or
the first coating layer is constituted by a material different from a material constituting the second coating layer.

A display device according to either one of first and second aspects of the present disclosure for achieving the above object includes:

a first substrate and a second substrate; and a plurality of light emitting elements formed between the first substrate and the second substrate, each of the light emitting elements includes:

a light emitting portion;

an intermediate layer covering the light emitting portion;

an optical path control unit disposed on or above the intermediate layer; and a coating layer covering at least the optical path control unit, in each of the light emitting elements, light emitted from the light emitting portion passes through the intermediate layer, enters the optical path control unit, and exits from the optical path control unit, and the coating layer includes a first coating layer and a second coating layer.

In addition, in the display device according to the first aspect of the present disclosure, in each of the light emitting elements, the first coating layer covers a part of an outer surface of the optical path control unit on the intermediate layer side, the second coating layer covers the first coating layer and the rest of the outer surface of the optical path control unit, and a value $n_0$ of a refractive index of a material constituting the optical path control unit, a value $n_1$ of a refractive index of a material constituting the first coating layer, and a value $n_2$ of a refractive index of a material constituting the second coating layer are different from each other, or the first coating layer is constituted by a material different from a material constituting the second coating layer.

Furthermore, in the display device according to the second aspect of the present disclosure, in each of the light emitting elements, the first coating layer is in contact with an outer edge side of the optical path control unit on the outer surface of the optical path control unit, the second coating layer is in contact with a central side of the optical path control unit on the outer surface of the optical path control unit, and a value $n_0$ of a refractive index of a material constituting the optical path control unit, a value $n_1$ of a refractive index of a material constituting the first coating layer, and a value $n_2$ of a refractive index of a material constituting the second coating layer are different from each other, or the first coating layer is constituted by a material different from a material constituting the second coating layer.

BRIEF DESCRIPTION OF DRAWINGS

FIG. 19A illustrates a front view of the digital still camera, and FIG. 19B illustrates a rear view thereof.

MODE FOR CARRYING OUT THE INVENTION

Figure 1:
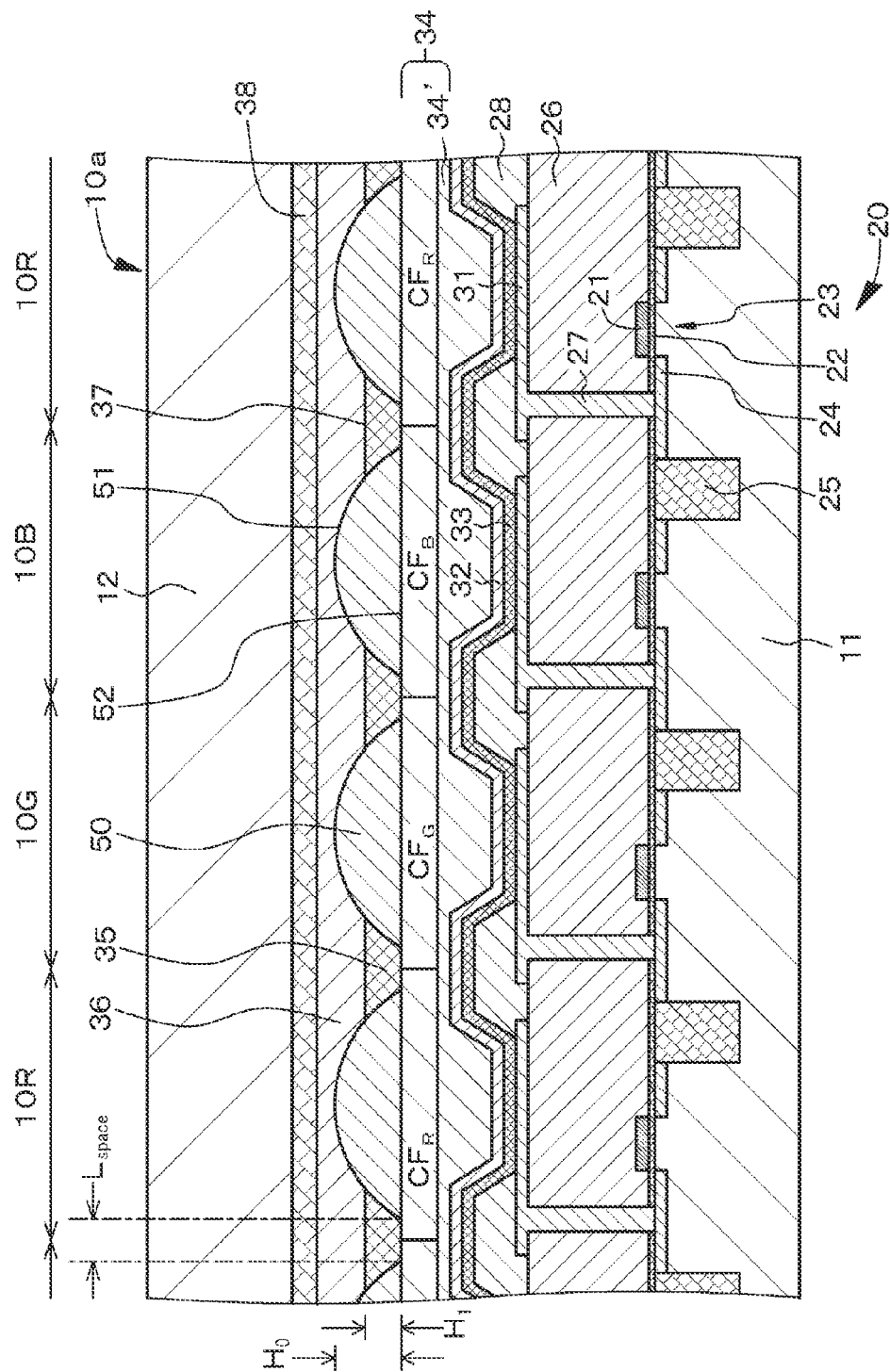
FIG. 1 is a schematic partial cross-sectional view of a display device of Example 1.

Hereinafter, the present disclosure will be described on the basis of Examples with reference to the drawings. However, the present disclosure is not limited to Examples, and various numerical values and materials in Examples are illustrative. Note that description will be made in the following order.

1. General description on light emitting element according to any one of first to third aspects of the present disclosure and display device according to either one of first and second aspects of the present disclosure
2. Example 1 (light emitting element according to any one of first to third aspects of the present disclosure and display device according to either one of first and second aspects of the present disclosure)
3. Example 2 (modification of Example 1)
4. Example 3 (another modification of Example 1)
5. Example 4 (still another modification of Example 1)
6. Example 5 (modification of Examples 1 to 4)
7. Others <Light Emitting Element According to any One of First to Third Aspects of the Present Disclosure and Display Device According to Either One of First and Second Aspects of the Present Disclosure>

In a light emitting element according to any one of first to third aspects of the present disclosure, and a light emitting element constituting a display device according to either one of first and second aspects of the present disclosure (hereinafter, these light emitting elements may be collectively referred to as "light emitting element and the like of the present disclosure") for convenience), a light emitting surface of an optical path control unit may be convex with respect to a top surface of an intermediate layer. Note that such a configuration is referred to as "light emitting element of first configuration" for convenience.

In the light emitting element of first configuration, a light incident surface of the optical path control unit may be in contact with the top surface of the intermediate layer. In addition, in the light emitting element of first configuration including such a preferable configuration, a first coating layer may cover a part of the light emitting surface of the optical path control unit on the intermediate layer side, a second coating layer may cover the first coating layer and the rest of the light emitting surface of the optical path control unit, and moreover in this case, the first coating layer may further cover the intermediate layer. Moreover, in the light emitting element of first configuration including these preferable configurations, the optical path control unit may have a positive optical power, or the optical path control unit may include a convex lens member. The first coating layer is formed on the intermediate layer. The second coating layer is located on the light emitting side of the first coating layer, and the same applies to a light emitting element of second configuration, a light emitting element of third configuration, and a light emitting element of fourth configuration, which will be described later.

Alternatively, in the light emitting element and the like of the present disclosure including the above preferable forms, the light incident surface of the optical path control unit may be convex toward the top surface of the intermediate layer. Note that such a configuration is referred to as "light emitting element of second configuration" for convenience.

In the light emitting element of second configuration, the light emitting surface of the optical path control unit may be flat. In addition, in the light emitting element of second configuration including such a preferable configuration, the first coating layer may cover a part of the light incident surface of the optical path control unit on the intermediate layer side, the second coating layer may cover the first coating layer and the rest of the light incident surface of the optical path control unit, and moreover, in the light emitting element of second configuration including these preferable configurations, the optical path control unit may have a positive optical power, or the optical path control unit may include a convex lens member. The first coating layer is formed on the intermediate layer, and the optical path control unit is formed on the first coating layer.

Moreover, if the refractive index of air is represented by $n_{air}$ in the light emitting element of first configuration including the various preferable configurations described above, $$n_{air} < n_1 < n_2 < n_0$$

is preferably satisfied. Here, $$0.25 \leq n_0 - n_1 \leq 0.50,$$

$$0.15 \leq n_0 - n_2 \leq 0.30, \text{ and}$$

$$0.10 \leq n_2 - n_1 \leq 0.30$$

are preferably satisfied, although not being limited thereto. Furthermore, if the refractive index of air is represented by $n_{air}$ in the light emitting element of second configuration including the various preferable configurations described above, $$n_{air} < n_2 < n_1 < n_0$$

is preferably satisfied. Here, $$0.25 \leq n_0 - n_2 \leq 0.50,$$

$$0.15 \leq n_0 - n_1 \leq 0.30, \text{ and}$$

$$0.10 \leq n_1 - n_2 \leq 0.30$$

are preferably satisfied, although not being limited thereto.

Alternatively, in the light emitting element and the like of the present disclosure including the above preferable forms, the light emitting surface of the optical path control unit may be concave with respect to the top surface of the intermediate layer. Note that such a configuration is referred to as "light emitting element of third configuration" for convenience.

In the light emitting element of third configuration, the light incident surface of the optical path control unit may be in contact with the top surface of the intermediate layer. In addition, in the light emitting element of third configuration including such a preferable configuration, the first coating layer may cover a part of the light emitting surface of the optical path control unit on the intermediate layer side, the second coating layer may cover the first coating layer and the rest of the light emitting surface of the optical path control unit, and moreover, in the light emitting element of third configuration including these preferable configurations, the optical path control unit may have a negative optical power, or the optical path control unit may include a concave lens member.

Alternatively, in the light emitting element and the like of the present disclosure including the above preferable forms, the light incident surface of the optical path control unit may be concave toward the top surface of the intermediate layer. Note that such a configuration is referred to as "light emitting element of fourth configuration" for convenience.

In the light emitting element of fourth configuration, the light emitting surface of the optical path control unit may be flat. In addition, in the light emitting element of fourth configuration including such a preferable configuration, the first coating layer may cover a part of the light incident surface of the optical path control unit on the intermediate layer side, the second coating layer may cover the first coating layer and the rest of the light incident surface of the optical path control unit, and moreover, in the light emitting element of fourth configuration including these preferable configurations, the optical path control unit may have a negative optical power, or the optical path control unit may include a concave lens member. The first coating layer is formed on the intermediate layer, and a part of the optical path control unit is also formed on the intermediate layer. Alternatively, the first coating layer is formed on the intermediate layer, and the optical path control unit is formed on the first coating layer.

Moreover, if the refractive index of air is represented by $n_{air}$ in the light emitting element of third configuration including the various preferable configurations described above, $n_{air} < n_0 < n_1 < n_2$ is preferably satisfied. Here, $0.15 \leq n_1 - n_0 \leq 0.30$, $0.25 \leq n_2 - n_0 \leq 0.50$, and $0.10 \leq n_2 - n_1 \leq 0.30$ are preferably satisfied, although not being limited thereto. Furthermore, if the refractive index of air is represented by $n_{air}$ in the light emitting element of fourth configuration including the various preferable configurations described above, $n_{air} < n_0 < n_2 < n_1$ is preferably satisfied. Here, $0.15 \leq n_2 - n_0 \leq 0.30$, $0.25 \leq n_1 - n_0 \leq 0.50$, and $0.10 \leq n_1 - n_2 \leq 0.30$ are preferably satisfied, although not being limited thereto.

In the light emitting element and the like of the present disclosure including the various preferable forms and configurations described above, when the thickness of the convex lens member constituting the optical path control unit along an optical axis or the thickness of the concave lens member along an optical axis (a distance along the optical axis of two opposing lens surfaces of the concave lens member) is referred to as the "height of the optical path control unit" for convenience, the height $H_0$ of the optical path control unit and a minimum distance $L_0$ between optical path control units constituting adjacent light emitting elements may satisfy $0 \leq L_0/H_0 \leq 0.5$.

Furthermore, if the size of the light emitting element (length of one side of a pixel or a sub-pixel) is 1.00, $L_0$ is preferably 0.1 or less.

Alternatively, in the light emitting element and the like of the present disclosure including the various preferable forms and configurations described above, an optical path control unit and an optical path control unit constituting adjacent light emitting elements may be in contact with each other, or there may be a gap between an optical path control unit and an optical path control unit constituting adjacent light emitting elements. In the former case, it is only required to adopt a honeycomb structure in which the planar shape of the optical path control unit is a regular hexagon. Furthermore, in the former case, an optical path control unit and an optical path control unit constituting adjacent light emitting elements may be in contact with each other so as to overlap each other.

Moreover, in the light emitting element and the like of the present disclosure including the various preferable forms and configurations described above, the height $H_0$ of the optical path control unit and the thickness $H_1$ of the first coating layer covering a part of the outer surface of the optical path control unit on the intermediate layer side may satisfy $0.10 \leq H_1/H_0 \leq 0.90$, desirably $0.30 \leq H_1/H_0 \leq 0.70$.

Moreover, in the light emitting element and the like of the present disclosure including the various preferable forms and configurations described above, the intermediate layer may include a wavelength selection portion, or the wavelength selection portion may be formed on a light emitting side of the optical path control unit and the coating layer. An orthophoto image of the optical path control unit for the light emitting portion may coincide with an orthophoto image of the wavelength selection portion for the light emitting portion, or may be included in the orthophoto image of the wavelength selection portion for the light emitting portion. By adopting the latter configuration, occurrence of color mixing between adjacent light emitting elements can be reliably suppressed. Moreover, in these cases, in a light emitting element in which a value of distance $D_0$ (described later) is not 0, a normal passing through the center of the wavelength selection section may coincide with a normal passing through the center of the light emitting portion. Alternatively, in the light emitting element in which a value of distance $D_0$ is not 0, the normal passing through the center of the wavelength selection portion may coincide with a normal passing through the center of the optical path control unit. By adopting the latter configuration, occurrence of color mixing between adjacent light emitting elements can be reliably suppressed. Furthermore, a light absorption layer (black matrix layer) may be formed between wavelength selection portions of adjacent light emitting elements. The center of the wavelength selection portion refers to an area center of gravity point of a region occupied by the wavelength selection portion. Alternatively, in a case where the planar shape of the wavelength selection portion is a circle, an ellipse, a square, a rectangle, or a regular polygon, the center of each of these figures corresponds to the center of the wavelength selection portion. In a case where a part of each of these figures is cut off, the center of a figure that complements the cut off portion corresponds to the center of the wavelength selection portion. In a case of a figure in which these figures are connected to each other, the center of a figure obtained by removing a connected portion and complementing the removed portion corresponds to the center of the wavelength selection portion. Also by forming a light absorption layer (black matrix layer) between wavelength selection portions of adjacent light emitting elements, occurrence of color mixing between adjacent light emitting elements can be reliably suppressed. The wavelength selection portion can be constituted by, for example, a color filter layer. The color filter layer is constituted by a resin to which a coloring agent containing a desired pigment or dye is added. By selecting a pigment or a dye, adjustment is performed such that light transmittance in a target wavelength range of red, green, blue, or the like is high, and light transmittance in the other wavelength ranges is low. Alternatively, the wavelength selection portion can also be constituted by a photonic crystal, a wavelength selection element to which plasmon is applied (a color filter layer having a conductor lattice structure in which a lattice-shaped hole structure is formed in a conductor thin film, for example, see Japanese Patent Application Laid-Open No. 2008-177191), a thin film containing an inorganic material such as amorphous silicon, or quantum dots. Hereinafter, the color filter layer will be described as a representative of the wavelength selection portion, but the wavelength selection portion is not limited to the color filter layer. Note that the size of the wavelength selection portion (for example, color filter layer) may be appropriately changed according to light emitted by a light emitting element. In a case where a light absorption layer (black matrix layer) is disposed between wavelength selection portions (for example, color filter layers) of adjacent light emitting elements, the size of the light absorption layer (black matrix layer) may be appropriately changed according to light emitted by the light emitting elements. Furthermore, the size of the wavelength selection portion (for example, color filter layer) may be appropriately changed according to a distance (offset amount) do between a normal passing through the center of the light emitting portion and a normal passing through the center of the color filter layer. The planar shape of the wavelength selection portion (for example, color filter layer) may be the same as the planar shape of the optical path control unit, may be similar thereto, or may be different therefrom.

Moreover, in the display device of the present disclosure including the preferable forms and configurations described above, a light absorption layer (black matrix layer) may be formed between optical path control units of adjacent light emitting elements. Also by forming a light absorption layer (black matrix layer) between optical path control units of adjacent light emitting elements, occurrence of color mixing between adjacent light emitting elements can be reliably suppressed.

For example, the light absorption layer (black matrix layer) is constituted by a black resin film (specifically, for example, a black polyimide-based resin) having an optical density of 1 or more, mixed with a black coloring agent, or a thin film filter utilizing interference of a thin film. For example, the thin film filter is formed by laminating two or more thin films containing metal, metal nitride, or metal oxide, and attenuates light by utilizing interference of a thin film. Specific examples of the thin film filter include a thin film filter obtained by alternately laminating Cr and chromium(III) oxide ($Cr_2O_3$).

Moreover, in the light emitting element and the like of the present disclosure including the various preferable forms and configurations described above, the top surface of the first coating layer may be flat, or may be concave toward the intermediate layer.

Moreover, in the light emitting element and the like of the present disclosure including the various preferable forms and configurations described above, the light emitting portion may include an organic electroluminescence layer. That is, the display device of the present disclosure including the various preferable forms and configurations described above may be constituted by an organic electroluminescence display device (organic EL display device). The light emitting element may be constituted by an organic electroluminescence element (organic EL element) Here, the display device of the present disclosure is a top emission type display device that emits light from the second substrate.

In the light emitting element and the like of the present disclosure including the various preferable forms and configurations described above, the optical path control unit may be constituted not only by a convex lens member (on-chip microconvex lens) or a concave lens member (on-chip microconcave lens) as described above, but also by a light reflecting member. In the following description, the convex lens member and the concave lens member may be collectively referred to as a "lens member". The lens member may be a spherical lens or an aspherical lens. Furthermore, the convex lens member may be constituted by a plano-convex lens, and the concave lens member may be constituted by a plano-concave lens. Moreover, the lens member may be a refraction type lens or a diffraction type lens.

In addition, in each of the light emitting elements, if a distance (offset amount) between a normal LN passing through the center of the light emitting portion and a normal LN' passing through the center of the optical path control unit is represented by $D_0$, a form in which values of distance (offset amount) $D_0$ are not 0 in at least some of the light emitting elements constituting the display device may be adopted. Furthermore, in the display device, a reference point (reference region) is assumed, and the distance $D_0$ may depend on a distance $D_1$ from the reference point (reference region) to the normal LN passing through the center of the light emitting portion. Note that the reference point (reference region) can spread to some extent. Here, the various normals are vertical lines with respect to a light emitting surface of the display device. The center of the light emitting portion refers to an area center of gravity point of a region where a first electrode is in contact with an organic layer (described later). The first electrode may be in contact with a part of the organic layer, or the organic layer may be in contact with a part of the first electrode. Specifically, the size of the first electrode may be smaller than that of the organic layer. Alternatively, the size of the first electrode may be the same as that of the organic layer, and an insulating layer may be formed in a part between the first electrode and the organic layer. Alternatively, the size of the first electrode may be larger than that of the organic layer.

Whether light (image) emitted from the entire display device is a focusing type or a divergent type depends on the specifications of the display device, and also depends on the degree of viewing angle dependence or wide viewing angle characteristics required for the display device.

In the light emitting element and the like of the present disclosure including the various preferable forms and configurations described above, in a case where the optical path control unit is constituted by a convex lens member (on-chip microconvex lens), that is, in the light emitting element of first configuration or the light emitting element of second configuration, examples of materials constituting the optical path control unit, the first coating layer, and the second coating layer include the following materials.

[Light Emitting Element of First Configuration]
Optical Path Control Unit
  Acrylic transparent resin (refractive index: 1.54)
  Epoxy-based transparent resin (refractive index: 1.55)
  $TiO_2$ dispersed acrylic transparent resin (refractive index: 1.72)
  SiN (refractive index: 1.74)
First Coating Layer
  Hollow silica-containing fluorine-based low refractive index transparent resin (refractive index: 1.25)
  Fluorine-based low refractive index transparent resin (refractive index: 1.38)
  Acrylic transparent resin (refractive index: 1.54)
  Epoxy-based transparent resin (refractive index: 1.55)
Second Coating Layer
  Fluorine-based low refractive index transparent resin (refractive index: 1.38)
  Acrylic transparent resin (refractive index: 1.54)
  Epoxy-based transparent resin (refractive index: 1.55)
  $Al_2O_3$ dispersed acrylic transparent resin (refractive index 1.64)
[Light Emitting Element of Second Configuration]
Optical Path Control Unit
  Acrylic transparent resin (refractive index: 1.54)
  Epoxy-based transparent resin (refractive index: 1.55)
  $TiO_2$ dispersed acrylic transparent resin (refractive index: 1.72)
  SiN (refractive index: 1.74)
First Coating Layer
  Fluorine-based low refractive index transparent resin (refractive index: 1.38)
  Acrylic transparent resin (refractive index: 1.54)
  Epoxy-based transparent resin (refractive index: 1.55)
  $Al_2O_3$ dispersed acrylic transparent resin (refractive index 1.64)
Second Coating Layer
  Hollow silica-containing fluorine-based low refractive index transparent resin (refractive index: 1.25)
  Fluorine-based low refractive index transparent resin (refractive index: 1.38)
  Acrylic transparent resin (refractive index: 1.54)
  Epoxy-based transparent resin (refractive index: 1.55)

Meanwhile, in a case where the optical path control unit is constituted by a concave lens member (on-chip microconcave lens), that is, in the light emitting element of third configuration or the light emitting element of fourth configuration, examples of materials constituting the optical path control unit, the first coating layer, and the second coating layer include the following materials.

[Light Emitting Element of Third Configuration]
Optical Path Control Unit
  Hollow silica-containing fluorine-based low refractive index transparent resin (refractive index: 1.25)
  Fluorine-based low refractive index transparent resin (refractive index: 1.38)
  $SiO_2$ (refractive index: 1.52)
  Acrylic transparent resin (refractive index: 1.54)
First Coating Layer
  Fluorine-based low refractive index transparent resin (refractive index: 1.38)
  Acrylic transparent resin (refractive index: 1.54)
  Epoxy-based transparent resin (refractive index: 1.55)
  $Al_2O_3$ dispersed acrylic transparent resin (refractive index 1.64)
Second Coating Layer
  Acrylic transparent resin (refractive index: 1.54)
  Epoxy-based transparent resin (refractive index: 1.55)
  $TiO_2$ dispersed acrylic transparent resin (refractive index: 1.72)
  SiN (refractive index: 1.74)
[Light Emitting Element of Fourth Configuration]
Optical Path Control Unit
  Hollow silica-containing fluorine-based low refractive index transparent resin (refractive index: 1.25)
  Fluorine-based low refractive index transparent resin (refractive index: 1.38)
  $SiO_2$ (refractive index: 1.52)
  Acrylic transparent resin (refractive index: 1.54)
First Coating Layer
  Acrylic transparent resin (refractive index: 1.54)
  Epoxy-based transparent resin (refractive index: 1.55)
  $TiO_2$ dispersed acrylic transparent resin (refractive index: 1.72)
  SiN (refractive index: 1.74)
Second Coating Layer
  Fluorine-based low refractive index transparent resin (refractive index: 1.38)
  Acrylic transparent resin (refractive index: 1.54)
  Epoxy-based transparent resin (refractive index: 1.55)
  $Al_2O_3$ dispersed acrylic transparent resin (refractive index 1.64)

The lens member can be obtained by melt-flowing a transparent resin material constituting the lens member, can be obtained by etching back the transparent resin material, can be obtained by a combination of a photolithography technique using a gray tone mask and an etching method, or can be obtained by a method for forming the transparent resin material into a lens shape on the basis of a nanoimprint method. Examples of a material constituting the lens member (microlens) include a high refraction resin material (for a convex lens), a high refraction inorganic film (for a convex lens), a low refraction resin material (for a concave lens), and a low refraction inorganic film (for a concave lens).

Examples of a method for forming the first coating layer include a spin coating method, a spray coating method, a curtain coating method, and various roll coating methods. Examples of a method for forming the second coating layer include a spin coating method, a spray coating method, a curtain coating method, various roll coating methods, and a dip coating method. In a case where the first coating layer is formed on the basis of a coating method, a material having low viscosity and favorable wettability is preferably selected. Furthermore, the first coating layer desirably has a certain strength from a viewpoint of imparting strength to the display device. The second coating layer desirably has a high sealing property from a viewpoint of imparting high reliability to the display device. Furthermore, the second coating layer can also serve as a sealing resin layer. In this case, examples of a method for forming the second coating layer include a vacuum injection method and a liquid crystal dropping method.

Moreover, in the light emitting element of first configuration, examples of a combination of [a material constituting the optical path control unit, a material constituting the first coating layer, and a material constituting the second coating layer] include:

[an acrylic transparent resin, a hollow silica-containing fluorine-based low refractive index transparent resin, and a fluorine-based low refractive index transparent resin];

[an epoxy-based transparent resin, a hollow silica-containing fluorine-based low refractive index transparent resin, and a fluorine-based low refractive index transparent resin];

[a $TiO_2$ dispersed acrylic transparent resin, a fluorine-based low refractive index transparent resin, and an acrylic transparent resin]; and

[a SiN inorganic film, a fluorine-based low refractive index transparent resin, and an acrylic transparent resin] without being limited thereto. In the light emitting element of second configuration, examples of a combination of [a material constituting the optical path control unit, a material constituting the first coating layer, and a material constituting the second coating layer] include:

[an acrylic transparent resin, a fluorine-based low refractive index transparent resin, and a hollow silica-containing fluorine-based low refractive index transparent resin];

[an epoxy-based transparent resin, a fluorine-based low refractive index transparent resin, a hollow silica-containing fluorine-based low refractive index transparent resin];

[a $TiO_2$ dispersed acrylic transparent resin, an acrylic transparent resin, and a fluorine-based low refractive index transparent resin]; and

[a SiN inorganic film, an acrylic transparent resin, and a fluorine-based low refractive index transparent resin] without being limited thereto. In the light emitting element of third configuration, examples of a combination of [a material constituting the optical path control unit, a material constituting the first coating layer, and a material constituting the second coating layer] include:

[a fluorine-based low refractive index transparent resin, an acrylic transparent resin, and a SiN inorganic film];

[an acrylic transparent resin, an $Al_2O_3$ dispersed acrylic transparent resin, and a $TiO_2$ dispersed acrylic transparent resin];

[a $SiO_2$ inorganic film, an $Al_2O_3$ dispersed acrylic transparent resin, and a SiN inorganic film]; and

[a hollow silica-containing fluorine-based low-refractive index transparent resin, a fluorine-based low-refractive index transparent resin, and an acrylic transparent resin]. In the light emitting element of fourth configuration, examples of a combination of [a material constituting the optical path control unit, a material constituting the first coating layer, and a material constituting the second coating layer] include:

[a fluorine-based low refractive index transparent resin, a SiN inorganic film, and an acrylic transparent resin];

[an acrylic transparent resin, a $TiO_2$ dispersed acrylic transparent resin, and an $Al_2O_3$ dispersed acrylic transparent resin];

[a $SiO_2$ inorganic film, a SiN inorganic film, and an $Al_2O_3$ dispersed acrylic transparent resin]; and

[a hollow silica-containing fluorine-based low-refractive index transparent resin, an acrylic transparent resin, and a fluorine-based low refractive index transparent resin] without being limited thereto.

In the light emitting element according to the second aspect of the present disclosure and a light emitting element constituting the display device according to the second aspect of the present disclosure, examples of the light reflecting member constituting the optical path control unit include a simple metal or an alloy of a metal such as aluminum (Al) or silver (Ag) and a dielectric multilayer film. In the light emitting element and the like of the present disclosure, examples of the light reflecting member include a material having a refractive index that makes light emitted from the light emitting portion totally reflected by the light reflecting member when the light passes through the intermediate layer and the coating layer and collides with the light reflecting member. Specifically, the optical path control unit may be constituted by, for example, the light reflecting member that fills a space between the coating layers. The light reflecting member preferably has a forward taper shape (a shape extending from a light incident surface side toward a light emitting surface side). A cross section of a forward-tapered slope obtained by cutting the light reflecting member in a virtual plane including an axis of the light reflecting member may be constituted by a curved line or a line segment.

In the display device of the present disclosure, examples of an arrangement of pixels (or sub-pixels) include a delta arrangement, a stripe arrangement, a diagonal arrangement, a rectangle arrangement, and a pentile arrangement. An arrangement of the wavelength selection portions only needs to be a delta arrangement, a stripe arrangement, a diagonal arrangement, a rectangle arrangement, or a pentile arrangement according to the arrangement of pixels (or sub-pixels).

Hereinafter, focusing on the light emitting portion, a form in which the light emitting portion constituting the light emitting element includes an organic electroluminescence layer, that is, a form in which the display device of the present disclosure is constituted by an organic electroluminescence display device (organic EL display device) will be described.

The organic EL display device includes:

a first substrate; a second substrate; and a plurality of light emitting elements located between the first substrate and the second substrate and arranged two-dimensionally, each of the light emitting elements disposed on a base body formed on the first substrate includes at least:

a first electrode;

a second electrode; and an organic layer sandwiched between the first electrode and the second electrode (including a light emitting layer constituted by an organic electroluminescence layer), and light emitted from the organic layer is emitted to the outside via the second substrate.

An intermediate layer is formed on the second electrode, an optical path control unit is disposed on the intermediate layer, and a coating layer covers at least the optical path control unit. The first electrode is disposed for each of the light emitting elements. The organic layer is disposed for each of the light emitting elements, or is disposed while being shared by the light emitting elements. The second electrode may be an electrode shared by the plurality of light emitting elements. That is, the second electrode may be a so-called solid electrode. The first substrate is disposed below or under the base body, and the second substrate is disposed above the second electrode. The light emitting elements are formed on the first substrate side, and a light emitting portion is disposed on the base body.

In addition, the organic layer may emit white light. In this case, the organic layer may be constituted by at least two light emitting layers that emit different colors. Specifically, the organic layer may have a laminated structure obtained by laminating three layers of a red light emitting layer that emits red light (wavelength: 620 nm to 750 nm), a green light emitting layer that emits green light (wavelength: 495 nm to 570 nm), and a blue light emitting layer that emits blue light (wavelength: 450 nm to 495 nm), and emits white light as a whole. Alternatively, the organic layer may have a structure obtained by laminating two layers of a blue light emitting layer that emits blue light and a yellow light emitting layer that emits yellow light, and emits white light as a whole. Alternatively, the organic layer may have a structure obtained by laminating two layers of a blue light emitting layer that emits blue light and an orange light emitting layer that emits orange light, and emits white light as a whole. The organic layer may be shared by the plurality of light emitting elements, or may be individually disposed in each of the light emitting elements. By combining such an organic layer (light emitting portion) that emits white light with a red color filter layer (or an intermediate layer that functions as a red color filter layer), a red light emitting element is constituted. By combining an organic layer (light emitting portion) that emits white light with a green color filter layer (or an intermediate layer that functions as a green color filter layer), a green light emitting element is constituted. By combining an organic layer (light emitting portion) that emits white light with a blue color filter layer (or an intermediate layer that functions as a blue color filter layer), a blue light emitting element is constituted. A combination of sub-pixels such as a red light emitting element, a green light emitting element, and a blue light emitting element constitutes one pixel. In some cases, a red light emitting element, a green light emitting element, a blue light emitting element, and a light emitting element that emits white light (or fourth color light) (or a light emitting element that emits complementary color light) may constitute one pixel. In a form constituted by at least two light emitting layers that emit light of different colors, there is actually a case where the light emitting layers that emit light of different colors are mixed and are not clearly separated into the layers.

Alternatively, the organic layer may be constituted by one light emitting layer. In this case, for example, the light emitting element may be constituted by, a red light emitting element having an organic layer including a red light emitting layer, a green light emitting element having an organic layer including a green light emitting layer, or a blue light emitting element having an organic layer including a blue light emitting layer. In a case of a display device of color display, these three kinds of light emitting elements (sub-pixels) constitute one pixel. Alternatively, the light emitting element may be constituted by a laminated structure formed by a red light emitting element having an organic layer including a red light emitting layer, a green light emitting element having an organic layer including a green light emitting layer, and a blue light emitting element having an organic layer including a blue light emitting layer. Note that it is not necessary to form a color filter layer in principle, but the color filter layer may be disposed for improving color purity.

The base body is formed on or above the first substrate. Examples of a material constituting the base body include an insulating material such as $SiO_2$, SiN, or SiON. The base body can be formed by a forming method suitable for a material constituting the base body, specifically, for example, on the basis of a known method such as various CVD methods, various coating methods, various PVD methods including a sputtering method and a vacuum vapor deposition method, various printing methods including a screen printing method, a plating method, an electrodeposition method, an immersion method, or a sol-gel method.

Under or below the base body, a light emitting element driving unit is disposed, without being limited thereto. For example, the light emitting element driving unit includes a transistor (specifically, for example, MOSFET) formed on a silicon semiconductor substrate constituting the first substrate or a thin film transistor (TFT) disposed on various substrates each constituting the first substrate. The transistor and the TFT constituting the light emitting element driving unit may be connected to the first electrode via a contact hole (contact plug) formed in the base body and the like. The light emitting element driving unit may have a known circuit configuration. The second electrode is connected to the light emitting element driving unit via a contact hole (contact plug) formed in the base body and the like at an outer periphery of the display device. The light emitting elements are formed on the first substrate side. The second electrode may be an electrode shared by the plurality of light emitting elements. That is, the second electrode may be a so-called solid electrode.

The first substrate or the second substrate may be constituted by a silicon semiconductor substrate, a high strain point glass substrate, a soda glass ($Na_2O \cdot CaO \cdot SiO_2$) substrate, a borosilicate glass ($Na_2O \cdot B_2O_3 \cdot SiO_2$) substrate, a forsterite ($2MgO \cdot SiO_2$) substrate, a lead glass ($Na_2O \cdot PbO \cdot SiO_2$) substrate, various glass substrates each having an insulation material layer formed on a surface thereof, a quartz substrate, a quartz substrate having an insulation material layer formed on a surface thereof, or an organic polymer such as polymethyl methacrylate (PMMA), polyvinyl alcohol (PVA), polyvinyl phenol (PVP), polyether sulfone (PES), polyimide, polycarbonate, polyethylene terephthalate (PET), or polyethylene naphthalate (PEN) (having a form of a polymer material such as a plastic film, a plastic sheet, or a plastic substrate constituted by a polymer material and having flexibility). Materials constituting the first substrate and the second substrate may be the same as or different from each other. Provided that the second substrate needs to be transparent to light emitted from the light emitting element because the display device of the present disclosure is a top emission type display device.

In a case where the first electrode is caused to function as an anode electrode, examples of a material constituting the first electrode include a metal having high work function, such as platinum (Pt), gold (Au), silver (Ag), chromium (Cr), tungsten (W), nickel (Ni), copper (Cu), iron (Fe), cobalt (Co), or tantalum (Ta), or an alloy thereof (for example, an Ag—Pd—Cu alloy containing silver as a main component and containing 0.3% by mass to 1% by mass of palladium (Pd) and 0.3% by mass to 1% by mass of copper (Cu), an Al—Nd alloy, an Al—Cu alloy, or an Al—Cu—Ni alloy). Moreover, in a case of using a conductive material having a small work function value and high light reflectivity, such as aluminum (Al) or an alloy containing aluminum, by improving hole injection characteristics, for example, by disposing an appropriate hole injection layer, the first electrode can be used as an anode electrode. The thickness of the first electrode may be 0.1 μm to 1 μm, for example. Alternatively, in a case where a light reflecting layer described later is disposed, examples of a material constituting the first electrode include various transparent conductive materials such as a transparent conductive material including, for a base layer, indium oxide, indium-tin oxide (ITO, including Sn-doped $In_2O_3$, crystalline ITO, and amorphous ITO), indium zinc oxide (IZO), indium-gallium oxide (IGO), indium-doped gallium-zinc oxide (IGZO, In-GaZnOa), IFO (F-doped $In_2O_3$), ITiO (Ti-doped $In_2O_3$), InSn, InSnZnO, tin oxide ($SnO_2$), ATO (Sb-doped $SnO_2$), FTO (F-doped $SnO_2$), zinc oxide (ZnO), aluminum oxide-doped zinc oxide (AZO), gallium-doped zinc oxide (GZO), B-doped ZnO, AlMgZnO (aluminum oxide and magnesium oxide-doped zinc oxide), antimony oxide, titanium oxide, NiO, spinel type oxide, oxide having a $YbFe_2O_4$ structure, gallium oxide, titanium oxide, niobium oxide, nickel oxide, or the like. Alternatively, the first electrode may have a structure obtained by laminating a transparent conductive material having excellent hole injection characteristics, such as an oxide of indium and tin (ITO) or an oxide of indium and zinc (IZO) on a dielectric multilayer film or a reflective film having high light reflectivity, including aluminum (Al) or an alloy thereof (for example, an Al—Cu—Ni alloy). Meanwhile, in a case where the first electrode is caused to function as a cathode electrode, the first electrode is desirably constituted by a conductive material having a small work function value and high light reflectivity. However, by improving electron injection characteristics, for example, by disposing an appropriate electron injection layer in a conductive material having high light reflectivity used as an anode electrode, the first electrode can also be used as a cathode electrode.

In a case where the second electrode is caused to function as a cathode electrode, a material constituting the second electrode (a semi-light transmitting material or a light transmitting material) is desirably constituted by a conductive material having a small work function value so as to be able to transmit emitted light and inject an electron into an organic layer (light emitting layer) efficiently. Examples of the material constituting the second electrode include a metal having a small work function and an alloy thereof, such as aluminum (Al), silver (Ag), magnesium (Mg), calcium (Ca), sodium (Na), strontium (Sr), an alkali metal or an alkaline earth metal and silver (Ag) [for example, an alloy of magnesium (Mg) and silver (Ag) (Mg—Ag alloy)], an alloy of magnesium-calcium (Mg—Ca alloy), or an alloy of aluminum (Al) and lithium (Li) (Al—Li alloy). Among these materials, a Mg—Ag alloy is preferable, and a volume ratio between magnesium and silver may be Mg:Ag=5:1 to 30:1, for example. Alternatively, as a volume ratio between magnesium and calcium may be Mg:Ca=2:1 to 10:1, for example. The thickness of the second electrode may be 4 nm to 50 nm, preferably 4 nm to 20 nm, and more preferably 6 nm to 12 nm, for example. Alternatively, the material constituting the second electrode may be at least one material selected from the group consisting of Ag—Nd—Cu, Ag—Cu, Au, and Al—Cu. Alternatively, the second electrode can have a laminated structure constituted by, from the organic layer side, the material layer described above and a so-called transparent electrode (for example, thickness $3 \times 10^{-8}$ m to $1 \times 10^{-6}$ m) including, for example, ITO or IZO. A bus electrode (auxiliary electrode) including a low resistance material such as aluminum, an aluminum alloy, silver, a silver alloy, copper, a copper alloy, gold, or a gold alloy may be disposed in the second electrode to reduce resistance as the whole second electrode. Average light transmittance of the second electrode is 50% to 90%, and preferably 60% to 90%. Meanwhile, in a case where the second electrode is caused to function as an anode electrode, the second electrode is desirably constituted by a conductive material that transmits emitted light and has a large work function value.

Examples of a method for forming the first electrode or the second electrode include a combination of a vapor deposition method including an electron beam vapor deposition method, a hot filament vapor deposition method, and a vacuum vapor deposition method, a sputtering method, a chemical vapor deposition method (CVD method), an MOCVD method, and an ion plating method with an etching method; various printing methods such as a screen printing method, an inkjet printing method, and a metal mask printing method; a plating method (an electroplating method or an electroless plating method); a lift-off method; a laser ablation method; and a sol-gel method. According to various printing methods and a plating method, the first electrode or the second electrode having a desired shape (pattern) can be formed directly. Note that, in a case where the second electrode is formed after the organic layer is formed, the second electrode is preferably formed particularly on the basis of a film formation method in which energy of film formation particles is small, such as a vacuum vapor deposition method, or a film formation method such as an MOCVD method from a viewpoint of preventing the organic layer from being damaged. When the organic layer is damaged, non-light emitting pixels (or non-light emitting sub-pixels) called "dark spots" due to generation of a leak current may be generated.

The organic layer includes a light emitting layer containing an organic light emitting material. Specifically, for example, the organic layer may be constituted by a laminated structure of a hole transport layer, a light emitting layer, and an electron transport layer, a laminated structure of a hole transport layer and a light emitting layer serving also as an electron transport layer, a laminated structure of a hole injection layer, a hole transport layer, a light emitting layer, an electron transport layer, and an electron injection layer, or the like. Examples of a method for forming the organic layer include a physical vapor deposition method (PVD method) such as a vacuum vapor deposition method; a printing method such as a screen printing method or an inkjet printing method; a laser transfer method in which an organic layer on a laser absorption layer is separated by irradiating a laminated structure of the laser absorption layer and the organic layer formed on a transfer substrate with a laser and the organic layer is transferred; and various coating methods. In a case where the organic layer is formed on the basis of the vacuum vapor deposition method, for example, using a so-called metal mask, the organic layer can be obtained by depositing a material that has passed through an opening disposed in the metal mask.

A light shielding portion may be disposed between a light emitting element and a light emitting element. Specific examples of a light shielding material constituting the light shielding portion include a material capable of shielding light, such as titanium (Ti), chromium (Cr), tungsten (W), tantalum (Ta), aluminum (Al), or $MoSi_2$. The light shielding portion can be formed by a vapor deposition method including an electron beam vapor deposition method, a hot filament vapor deposition method, and a vacuum vapor deposition method, a sputtering method, a CVD method, an ion plating method, and the like.

As described above, an intermediate layer (also referred to as a protective layer) is formed between the second electrode and the second substrate. In some cases, as described above, the intermediate layer may function as a color filter layer. Such an intermediate layer only needs to be constituted by a known color resist material. In a light emitting element that emits white light, it is only required to dispose a transparent filter layer. By making the intermediate layer also function as a color filter layer in this way, the organic layer and the intermediate layer are close to each other. Therefore, even if light emitted from a light emitting element is widened, color mixing can be effectively prevented, and viewing angle characteristics are improved. Provided that the color filter layer may be disposed on or above the intermediate layer independently of the intermediate layer.

Examples of a material constituting the intermediate layer (protective layer) include an acrylic resin, an epoxy-based resin, and various inorganic materials (for example, SiN, SiON, SiO, $Al_2O_3$, and $TiO_2$) The intermediate layer can be formed on the basis of a known method such as various CVD methods, various coating methods, various PVD methods including a sputtering method and a vacuum vapor deposition method, or various printing methods including a screen printing method. The intermediate layer may be shared by the plurality of light emitting elements, or may be individually disposed in each of the light emitting elements.

On an outermost surface (specifically, for example, an outer surface of the second substrate) that emits light in the display device, an ultraviolet absorbing layer, a contamination preventing layer, a hard coat layer, and an antistatic layer may be formed, or a protective member (for example, cover glass) may be disposed.

In the display device, an insulating layer and an interlayer insulating layer are formed. Examples of an insulating material constituting the insulating layer and the interlayer insulating layer include a $SiO_X$-based material (material constituting a silicon-based oxide film) such as $SiO_2$, non-doped silicate glass (NSG), borophosphosilicate glass (BPSG), PSG, BSG, AsSG, SbSG, PbSG, spin on glass (SOG), low temperature oxide (LTO, low temperature CVD-$SiO_2$), low melting point glass, or glass paste; a SiN-based material including a SiON-based material; SiOC; SiOF; and SiCN. Alternatively, examples of the material include an inorganic insulating material such as titanium oxide ($TiO_2$), tantalum oxide ($Ta_2O_5$), aluminum oxide ($Al_2O_3$), magnesium oxide (MgO), chromium oxide ($CrO_x$), zirconium oxide ($ZrO_2$), niobium oxide ($Nb_2O_5$), tin oxide ($SnO_2$), or vanadium oxide ($VO_x$). Alternatively, examples of the insulating material further include various resins such as a polyimide-based resin, an epoxy-based resin, and an acrylic resin; and a low dielectric constant insulating material such as SiOCH, organic SOG, or a fluorine-based resin (for example, a material having a dielectric constant k ($=\varepsilon/\varepsilon_0$) of 3.5 or less, for example, and specific examples thereof include fluorocarbon, a cycloperfluorocarbon polymer, benzocyclobutene, a cyclic fluorine-based resin, polytetrafluoroethylene, amorphous tetrafluoroethylene, polyaryl ether, fluorinated aryl ether, fluorinated polyimide, amorphous carbon, parylene (polyparaxylylene), and fluorinated fullerene). Examples of the insulating material further include Silk (trademark of The Dow Chemical Co., coating type low dielectric constant interlayer insulation film material) and Flare (trademark of Honeywell Electronic Materials Co., polyallyl ether (PAE)-based material). In addition, these materials can be used singly or in appropriate combination thereof. In some cases, the base body may be constituted by the materials described above. The insulating layer, the interlayer insulating layer, and the base body can be formed on the basis of a known method such as various CVD methods, various coating methods, various PVD methods including a sputtering method and a vacuum vapor deposition method, various printing methods such as a screen printing method, a plating method, an electrodeposition method, an immersion method, or a sol-gel method.

In order to further improve a light extraction efficiency, the organic EL display device preferably has a resonator structure. Specifically, light emitted from the light emitting layer is caused to resonate between a first interface constituted by an interface between the first electrode and the organic layer (or an interface constituted by an interface between the light reflecting layer and the interlayer insulating layer in a structure in which the interlayer insulating layer is disposed under the first electrode, and the light reflecting layer is disposed under the interlayer insulating layer) and a second interface constituted by an interface between the second electrode and the organic layer, and a part of the light is emitted from the second electrode. In addition, if a distance from a maximum emission position of the light emitting layer to the first interface is represented by $L_1$, an optical distance thereof is represented by $OL_1$, a distance from the maximum emission position of the light emitting layer to the second interface is represented by $L_2$, an optical distance thereof is represented by $OL_2$, and $m_1$ and $m_2$ each represent an integer, the following formulas (1-1) and (1-2) may be satisfied.

$$0.7\{-\Phi_1/(2\pi)+m_1\} \le 2 \times OL_1/\lambda \le 1.2\{-\Phi_1/(2\pi)+m_1\} \quad (1\text{-}1)$$

$$0.7\{-\Phi_2/(2\pi)+m_2\} \le 2 \times OL_2/\lambda 1.2\{-\Phi_2/(2\pi)+m_2\} \quad (1\text{-}2)$$

Here, $\lambda$: Maximum peak wavelength of a spectrum of light generated in light emitting layer (or a desired wavelength among wavelengths of light generated in light emitting layer)

$\Phi_1$: Phase shift amount (unit: radian) of light reflected on first interface Provided that $-2n<\Phi_1 \le 0$ is satisfied.

$\Phi_2$: Phase shift amount (unit: radian) of light reflected on second interface Provided that $-2n<\Phi_2 \le 0$ is satisfied.

Here, a value of $m_1$ is a value of 0 or more, and a value of $m_2$ is a value of 0 or more independently of a value of $m_1$. Examples of $(m_1,m_2)$ include $(m_1,m_2)=(0, 0)$, $(m_1,m_2)=(0, 1)$, $(m_1,m_2)=(1, 0)$, and $(m_1,m_2)=(1, 1)$.

The distance $L_1$ from the maximum emission position of the light emitting layer to the first interface means an actual distance (physical distance) from the maximum emission position of the light emitting layer to the first interface, and the distance $L_2$ from the maximum emission position of the light emitting layer to the second interface means an actual distance (physical distance) from the maximum emission position of the light emitting layer to the second interface. Furthermore, the optical distance is also called an optical path length, and generally means n×L when a light beam passes through a medium having a refractive index n for a distance L. The same applies to the following description. Therefore, if an average refractive index is represented by $n_{ave}$, the following relations are satisfied.

$$OL_1 = L_1 \times n_{ave}$$

$$OL_2 = L_2 \times n_{ave}$$

Here, the average refractive index $n_{ave}$ is obtained by summing up a product of the refractive index and the thickness of each layer constituting the organic layer (or the organic layer, the first electrode, and the interlayer insulating layer), and dividing the resulting sum by the thickness of the organic layer (or the organic layer, the first electrode, and the interlayer insulating layer).

It is only required to design each of the light emitting elements by determining a desired wavelength λ (specifically, for example, wavelengths of red light, green light, and blue light) among wavelengths of light generated in the light emitting layer and determining various parameters such as $OL_1$ and $OL_2$ in each of the light emitting elements on the basis of formulas (1-1) and (1-2).

The first electrode or the light reflecting layer and the second electrode absorb a part of incident light and reflect the rest. Therefore, a phase shift occurs in the reflected light. The phase shift amounts $\Phi_1$ and $\Phi_2$ can be determined by measuring values of a real number part and an imaginary number part of a complex refractive index of a material constituting the first electrode or the light reflecting layer and the second electrode, for example, using an ellipsometer, and performing calculation based on these values (refer to, for example, "Principles of Optic", Max Born and Emil Wolf, 1974 (PERGAMON PRESS)). Alternatively, in a case where the first electrode absorbs a part of incident light and reflects the rest, the refractive indices of the organic layer, the interlayer insulating layer, and the like can also be determined by measurement with an ellipsometer.

Examples of a material constituting the light reflecting layer include aluminum, an aluminum alloy (for example, Al—Nd or Al—Cu), an Al/Ti laminated structure, an Al—Cu/Ti laminated structure, chromium (Cr), silver (Ag), and a silver alloy (for example, Ag—Cu, Ag—Pd—Cu, or Ag—Sm—Cu). In addition, for example, the light reflecting layer can be formed by a vapor deposition method including an electron beam vapor deposition method, a thermal filament vapor deposition method, and a vacuum vapor deposition method, a sputtering method, a CVD method, an ion plating method; a plating method (an electroplating method or an electroless plating method); a lift-off method; a laser ablation method; a sol-gel method; and the like. For example, a base layer containing TiN is preferably formed in order to control a crystal state of a light reflecting layer to be formed depending on a material constituting the light reflecting layer.

As described above, in the organic EL display device having a resonator structure, actually, a red light emitting element constituted by an organic layer that emits white light [in some cases, a red light emitting element constituted by combining the organic layer that emits white light with a red color filter layer (or an intermediate layer that functions as the red color filter layer)] causes red light emitted from the light emitting layer to resonate, and emits reddish light (light having a light spectrum peak in a red region) from the second electrode. Furthermore, a green light emitting element constituted by an organic layer that emits white light [in some cases, a green light emitting element constituted by combining the organic layer that emits white light with a green color filter layer (or an intermediate layer that functions as the green color filter layer)] causes green light emitted from the light emitting layer to resonate, and emits greenish light (light having a light spectrum peak in a green region) from the second electrode. Moreover, a blue light emitting element constituted by an organic layer that emits white light [in some cases, a blue light emitting element constituted by combining the organic layer that emits white light with a blue color filter layer (or an intermediate layer that functions as the blue color filter layer)] causes blue light emitted from the light emitting layer to resonate, and emits bluish light (light having a light spectrum peak in a blue region) from the second electrode. In other words, it is only required to design each of the light emitting elements by determining a desired wavelength λ (specifically, wavelengths of red light, green light, and blue light) among wavelengths of light generated in the light emitting layer and determining various parameters such as $OL_1$ and $OL_2$ in each of the red light emitting element, the green light emitting element, and the blue light emitting element on the basis of formulas (1-1) and (1-2). For example, paragraph [0041] of Japanese Patent Application Laid-Open No. 2012-216495 discloses an organic EL element having a resonator structure using an organic layer as a resonance portion, and describes that the film thickness of the organic layer is preferably 80 nm or more and 500 nm or less, and more preferably 150 nm or more and 350 nm or less because a distance from a light emitting point (light emitting surface) to a reflection surface can be appropriately adjusted. Normally, a value of $(L_1+L_2=L_0)$ is different among the red light emitting element, the green light emitting element, and the blue light emitting element.

In an organic EL display device, the thickness of a hole transport layer (hole supply layer) and the thickness of an electron transport layer (electron supply layer) are desirably substantially equal to each other. Alternatively, the thickness of the electron transport layer (electron supply layer) may be larger than that of the hole transport layer (hole supply layer). As a result, an electron can be supplied sufficiently to the light emitting layer in an amount necessary for a high efficiency at a low driving voltage. In other words, by disposing a hole transport layer between the first electrode corresponding to an anode electrode and the light emitting layer, and forming the hole transport layer with a film thickness smaller than that of the electron transport layer, supply of holes can be increased. In addition, this makes it possible to obtain a carrier balance with no excess or deficiency of holes and electrons and a sufficiently large carrier supply amount. Therefore, a high luminous efficiency can be obtained. Furthermore, due to no excess or deficiency of holes and electrons, the carrier balance hardly collapses, drive deterioration is suppressed, and an emission lifetime can be prolonged.

The display device can be used, for example, as a monitor device constituting a personal computer, a monitor device incorporated in a television receiver, a mobile phone, a personal digital assistant (PDA), or a game machine, or a display device incorporated in a projector. Alternatively, the display device can be applied to an electronic view finder (EVF), a head mounted display (HMD), or a display device for virtual reality (VR), mixed reality (MR), or augmented reality (AR). Alternatively, the organic EL display device can constitute an image display device in electronic paper such as an electronic book or electronic newspaper, a bulletin board such as a signboard, a poster, or a blackboard, rewritable paper substituted for printer paper, a display unit of a home appliance, a card display unit of a point card and the like, an electronic advertisement, or an electronic POP. The display device of the present disclosure can be used as a light emitting device, and can constitute various lighting devices including a backlight device for a liquid crystal display device and a planar light source device.

Example 1

Figure 2:
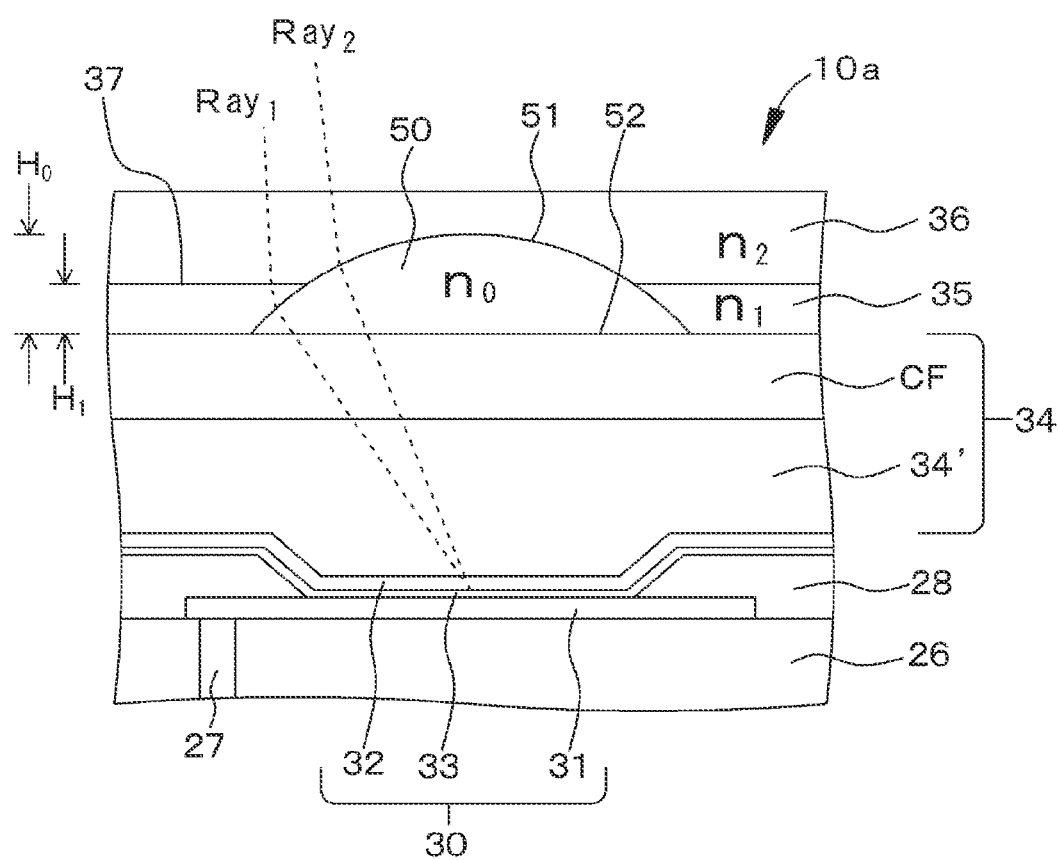
FIG. 2 is a schematic partial cross-sectional view of a light emitting element of Example 1 for explaining a behavior of a light beam emitted from a light emitting portion.

Example 1 relates to a light emitting element according to any one of first to third aspects of the present disclosure, and a display device according to either one of first and second aspects of the present disclosure, and more specifically relates to the light emitting element of first configuration. FIG. 1 illustrates a schematic partial cross-sectional view of the display device of Example 1. FIG. 2 illustrates a schematic partial cross-sectional view of the light emitting element of Example 1 for explaining a behavior of a light beam emitted from a light emitting portion for explaining a behavior of a light beam emitted from a light emitting portion. Note that hatching lines are omitted in FIG. 2 and FIGS. 4, 6, and 8 described later.

A light emitting element 10 (10R, 10G, 10B) of Example 1 or any one of Examples 2 to 5 described later will be described on the basis of the light emitting element according to either one of the first and second aspects of the present disclosure.

The light emitting element 10 (10R, 10G, 10B) includes:
a light emitting portion 30;
an intermediate layer 34 covering the light emitting portion 30;
an optical path control unit 50 disposed on or above the intermediate layer 34; and
a coating layer covering at least the optical path control unit 50,
light emitted from the light emitting portion 30 passes through the intermediate layer 34, enters the optical path control unit 50, and exits from the optical path control unit 50,
the coating layer includes a first coating layer 35 and a second coating layer 36,
the first coating layer 35 covers a part of an outer surface of the optical path control unit 50 on the intermediate layer 34 side, and
the second coating layer 36 covers the first coating layer 35 and the rest of the outer surface of the optical path control unit 50.

In addition, a value $n_0$ of a refractive index of a material constituting the optical path control unit 50, a value $n_1$ of a refractive index of a material constituting the first coating layer 35, and a value $n_2$ of a refractive index of a material constituting the second coating layer 36 are different from each other, or the first coating layer 35 is constituted by a material different from a material constituting the second coating layer 36.

Alternatively, the light emitting element 10 (10R, 10G, 10B) of Example 1 or any one of Examples 2 to 5 described later will be described on the basis of the light emitting element according to the third aspect of the present disclosure.

The light emitting element 10 (10R, 10G, 10B) includes:
a light emitting portion 30;
an intermediate layer 34 covering the light emitting portion 30;
an optical path control unit 50 disposed on or above the intermediate layer 34; and
a coating layer covering at least the optical path control unit 50,
light emitted from the light emitting portion 30 passes through the intermediate layer 34, enters the optical path control unit 50, and exits from the optical path control unit 50,
the coating layer includes a first coating layer 35 and a second coating layer 36,
the first coating layer 35 is in contact with an outer edge side of the optical path control unit 50 on an outer surface of the optical path control unit 50, and
the second coating layer 36 is in contact with a central side of the optical path control unit 50 on the outer surface of the optical path control unit 50. In addition, a value $n_0$ of a refractive index of a material constituting the optical path control unit 50, a value $n_1$ of a refractive index of a material constituting the first coating layer 35, and a value $n_2$ of a refractive index of a material constituting the second coating layer 36 are different from each other, or
the first coating layer 35 is constituted by a material different from a material constituting the second coating layer 36.

In the light emitting element 10 (10R, 10G, 10B) of Example 1 or any one of Examples 2 to 5 described later, the light emitting portion 30 having a refractive index of 1.8 as the entire organic layer includes an organic electroluminescence layer (light emitting layer) 33. That is, the display device is constituted by an organic electroluminescence display device (organic EL display device), and the light emitting element is constituted by an organic electroluminescence element (organic EL element). Furthermore, the display device is a top emission type display device that emits light from a second substrate 12 having a refractive index of 1.45. The light emitting portion 30 further includes a first electrode 31 and a second electrode 32.

That is, the display device of Example 1 or any one of Examples 2 to 5 described later includes:
a first substrate 11 and the second substrate 12; and
a plurality of light emitting elements (specifically, a plurality of light emitting elements arranged two-dimensionally) formed between the first substrate 11 and the second substrate 12, and
each of the light emitting elements is constituted by the light emitting element 10 (10R, 10G, 10B) of Example 1 or any one of Examples 2 to 5 described later.

In addition, each light emitting element (10R, 10G, 10B) disposed on a base body 26 formed on the first substrate 11 includes at least:
the first electrode 31;
the second electrode 32; and
the organic layer (including a light emitting layer constituted by an organic electroluminescence layer) 33 sandwiched between the first electrode 31 and the second electrode 32, and
in Example 1, light emitted from the organic layer 33 is emitted to the outside via the second substrate 12. As described above, the light emitting portion 30 includes the first electrode 31, the organic layer 33, and the second electrode 32.

In Example 1, the optical path control unit 50 is disposed on the intermediate layer 34.

In the light emitting element 10 (10R, 10G, 10B) of Example 1, if the refractive index of air is represented by $n_{air}$, $$n_{air} < n_1 < n_2 < n_0$$

is satisfied. Here, specifically $$0.25 \le n_0 - n_1 \le 0.50,$$

$$0.15 \le n_0 - n_2 \le 0.30, \text{ and}$$

$$0.10 \le n_2 - n_1 \le 0.30$$

are satisfied. Specifically, in the light emitting element 10 (10R, 10G, 10B) of Example 1, the optical path control unit 50 is constituted by an acrylic transparent resin (refractive index: 1.54), the first coating layer 35 is constituted by a hollow silica-containing fluorine-based low refractive index transparent resin (refractive index: 1.25), and the second coating layer 36 is constituted by a fluorine-based low refractive index transparent resin (refractive index: 1.38).

In a light emitting element 10a of Example 1, a light emitting surface (outer surface) 51 of the optical path control unit 50 is convex with respect to a top surface of the intermediate layer 34. A light incident surface 52 of the optical path control unit 50 is in contact with the top surface of the intermediate layer 34. The first coating layer 35 covers a part of the light emitting surface (outer surface) 51 of the optical path control unit 50 on the intermediate layer side, and the second coating layer 36 covers the first coating layer 35 and the rest of the light emitting surface (outer surface) 51 of the optical path control unit 50. Alternatively, the first coating layer 35 is in contact with an outer edge side of the optical path control unit 50 on the outer surface of the optical path control unit 50, and the second coating layer 36 is in contact with a central side of the optical path control unit 50 on the outer surface of the optical path control unit 50. The second coating layer 36 is located on a light emitting side of the first coating layer 35. The first coating layer 35 further covers the intermediate layer 34. Furthermore, the optical path control unit 50 has a positive optical power, or the optical path control unit 50 is constituted by a convex lens member (on-chip microconvex lens), specifically, a plano-convex lens. The light emitting surface (outer surface) 51 constitutes a lens surface. The first coating layer 35 is formed on the intermediate layer 34.

In the light emitting element 10a of Example 1, the intermediate layer 34 formed on the second electrode 32 includes a color filter layer CF (red color filter layer $CF_R$, green color filter layer $CF_G$, blue color filter layer $CF_B$) containing a known material. That is, the intermediate layer 34 includes an upper intermediate layer constituted by the color filter layer CF and a lower intermediate layer 34' disposed under the color filter layer CF. The lower intermediate layer 34' contains an acrylic resin. On the color filter layer $CF_R$, $CF_G$, $CF_B$ constituting the upper intermediate layer, the optical path control unit (lens member, on-chip microconvex lens) 50 is disposed. The same can be applied to a light emitting element 10b of Example 2, a light emitting element 10c of Example 3, and a light emitting element 10d of Example 4.

|  | Refractive index |
| --- | --- |
| Second substrate 12 | 1.45 |
| Optical path control unit 50 | 1.54 ($=n_0$) |
| First coating layer 35 | 1.25 ($=n_1$) |
| Second coating layer 36 | 1.38 ($=n_2$) |
| Color filter layer CF | 1.7 |
| Lower intermediate layer 34 | 1.8 |
| Organic layer | 1.8 |

The second coating layer 36 is bonded to the second substrate 12 via a sealing resin layer 38. Examples of a material constituting the sealing resin layer 38 include a thermosetting adhesive such as an acrylic adhesive, an epoxy-based adhesive, a urethane-based adhesive, a silicone-based adhesive, or a cyanoacrylate-based adhesive, and an ultraviolet curable adhesive. The color filter layer $CF_R$, $CF_G$, $CF_B$ is an on-chip color filter layer (OCCF) formed on the first substrate side. In addition, this makes it possible to shorten a distance between the organic layer 33 and the color filter layer CF, to suppress color mixing caused by incidence of light emitted from the organic layer 33 on an adjacent color filter layer CF of another color, and to design a wide range of lenses of the optical path control unit 50.

Figure 17A:
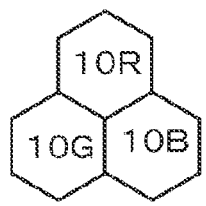
FIGS. 17A, 17B, 17C, and 17D are diagrams schematically illustrating an arrangement of light emitting elements in the display device of Example 1.
Figure 17B:
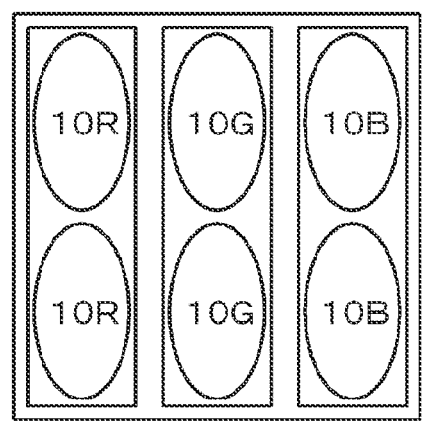
Figure 17C:
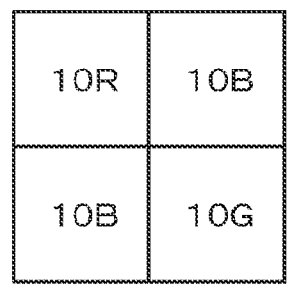
Figure 17D:
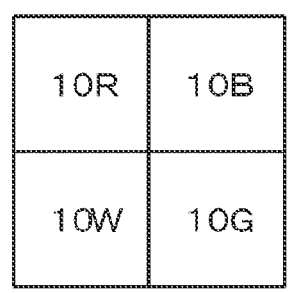

In the light emitting element 10 of Example 1 constituted by an organic EL element, the organic layer 33 has a laminated structure of a red light emitting layer, a green light emitting layer, and a blue light emitting layer. One pixel is constituted by three light emitting elements of the red light emitting element 10R, the green light emitting element 10G, and the blue light emitting element 10B. The organic layer 33 constituting the light emitting element 10 emits white light, and each light emitting element 10R, 10G, 10B is constituted by a combination of the organic layer 33 that emits white light and the color filter layer $CF_R$, $CF_G$, $CF_B$. The red light emitting element 10R to display a red color includes the red color filter layer $CF_R$. The green light emitting element 10G to display a green color includes the green color filter layer $CF_G$. The blue light emitting element 10B to display a blue color includes the blue color filter layer $CF_B$. The red light emitting element 10R, the green light emitting element 10G, and the blue light emitting element 10B have the same configuration and structure except for the color filter layers and positions of the light emitting layers. The number of pixels is, for example, 1920×1080. One light emitting element (display element) constitutes one sub-pixel, and the number of light emitting elements (specifically, organic EL elements) is three times the number of pixels. In the display device of Example 1, examples of an arrangement of sub-pixels include a delta arrangement illustrated in FIG. 17A. Provided that examples of the arrangement of sub-pixels also include a stripe arrangement as illustrated in FIGS. 17B and 17C. In some cases, as illustrated in FIG. 17D, the red light emitting element 10R, the green light emitting element 10G, the blue light emitting element 10B, and a light emitting element 10W that emits white light (or a light emitting element that emits complementary color light) may constitute one pixel. In the light emitting element 10W that emits white light, it is only required to dispose a transparent filter layer instead of disposing a color filter layer.

A light emitting element driving unit is disposed below the base body (interlayer insulating layer) 26 containing $SiO_2$ and formed on the basis of a CVD method. The light emitting element driving unit may have a known circuit configuration. The light emitting element driving unit is constituted by a transistor (specifically, MOSFET) formed on a silicon semiconductor substrate corresponding to the first substrate 11. The transistor 20 constituted by MOSFET includes a gate insulating layer 22 formed on the first substrate 11, a gate electrode 21 formed on the gate insulating layer 22, a source/drain region 24 formed on the first substrate 11, a channel forming region 23 formed between the source/drain regions 24, and an element isolating region 25 surrounding the channel forming region 23 and the source/drain region 24. The transistor 20 is electrically connected to the first electrode 31 via a contact plug 27 disposed in the base body 26. Note that one transistor 20 is illustrated for one light emitting element driving unit in the drawings.

The second electrode 32 is connected to the light emitting element driving unit via a contact hole (contact plug) (not illustrated) formed in the base body (interlayer insulating layer) 26 at an outer periphery of the display device. An auxiliary electrode connected to the second electrode 32 may be disposed below the second electrode 32 in the outer periphery of the display device, and the auxiliary electrode may be connected to the light emitting element driving unit.

The first electrode 31 functions as an anode electrode, and the second electrode 32 functions as a cathode electrode. The first electrode 31 is constituted by a light reflecting material layer, specifically, for example, a laminated structure formed by an Al—Nd alloy layer, an Al—Cu alloy layer, an Al—Ti alloy layer, and an ITO layer, and the second electrode 32 is constituted by a transparent conductive material such as ITO. The first electrode 31 is formed on the base body (interlayer insulating layer) 26 on the basis of a combination of a vacuum vapor deposition method and an etching method. Furthermore, the second electrode 32 is formed by a film formation method in which energy of film formation particles is small, such as a vacuum vapor deposition method, and is not patterned. The organic layer 33 is not patterned, either. Provided that the present disclosure is not limited thereto, and the organic layer 33 may be patterned. That is, the organic layer 33 may be painted separately for each sub-pixel, the organic layer 33 of the red light emitting element may be constituted by an organic layer that emits red light, the organic layer 33 of the green light emitting element may be constituted by an organic layer that emits green light, and the organic layer 33 of the blue light emitting element may be constituted by an organic layer that emits blue light.

In Example 1, the organic layer 33 has a laminated structure of a hole injection layer (HIL), a hole transport layer (HTL), a light emitting layer, an electron transport layer (ETL), and an electron injection layer (EIL). The light emitting layer is constituted by at least two light emitting layers that emit different colors, and as described above, light emitted from the organic layer 33 is white. Specifically, the organic layer has a structure in which three layers of a red light emitting layer that emits red light, a green light emitting layer that emits green light, and a blue light emitting layer that emits blue light are laminated. The organic layer may have a structure in which two layers of a blue light emitting layer that emits blue light and a yellow light emitting layer that emits yellow light are laminated or a structure in which two layers of a blue light emitting layer that emits blue light and an orange light emitting layer that emits orange light are laminated.

The hole injection layer increases a hole injection efficiency, functions as a buffer layer for preventing leakage, and has a thickness of about 2 nm to 10 nm, for example. The hole injection layer includes a hexaazatriphenylene derivative represented by the following formula (A) or (B), for example. Note that contact of an end face of the hole injection layer with the second electrode becomes a main cause of occurrence of brightness variation among pixels, leading to deterioration in display image quality.

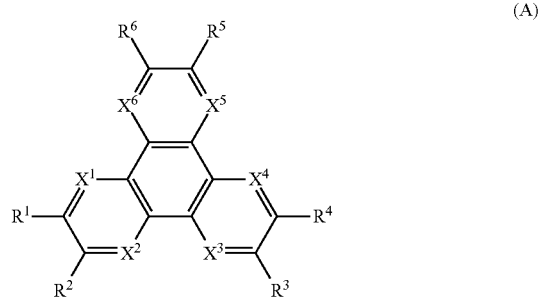

(A)

Here, $R^1$ to $R^6$ each independently represent a substituent selected from a hydrogen atom, a halogen atom, a hydroxy group, an amino group, an arulamino group, a substituted or unsubstituted carbonyl group having 20 or less carbon atoms, a substituted or unsubstituted carbonyl ester group having 20 or less carbon atoms, a substituted or unsubstituted alkyl group having 20 or less carbon atoms, a substituted or unsubstituted alkenyl group having 20 or less carbon atoms, a substituted or unsubstituted alkoxy group having 20 or less carbon atoms, a substituted or unsubstituted aryl group having 30 or less carbon atoms, a substituted or unsubstituted heterocyclic group having 30 or less carbon atoms, a nitrile group, a cyano group, a nitro group, and a silyl group, and adjacent $R^m$s (m=1 to 6) may be bonded to each other via a cyclic structure. Furthermore, $X^1$ to $X^6$ each independently represent a carbon atom or a nitrogen atom.

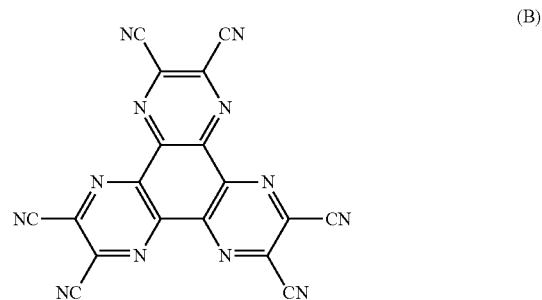 [SMILES: N#Cc1nc2c3nc(C#N)c(C#N)nc3c3nc(C#N)c(C#N)nc3c2nc1C#N]

(B)

The hole transport layer is a layer that increases a hole transport efficiency to the light emitting layer. When an electric field is applied to the light emitting layer, recombination of electrons and holes occurs to generate light. The electron transport layer is a layer that increases an electron transport efficiency to the light emitting layer, and the electron injection layer is a layer that increases an electron injection efficiency to the light emitting layer.

The hole transport layer includes 4,4',4"-tris(3-methylphenylphenylamino) triphenylamine (m-MTDATA) or α-naphthylphenyl diamine (αNPD) having a thickness of about 40 nm, for example.

The light emitting layer is a light emitting layer that generates white light by color mixing, and is formed by laminating a red light emitting layer, a green light emitting layer, and a blue light emitting layer as described above, for example.

In the red light emitting layer, by application of an electric field, a part of holes injected from the first electrode 31 and a part of electrons injected from the second electrode 32 are recombined to generate red light. Such a red light emitting layer contains at least one kind of material among a red light emitting material, a hole transport material, an electron transport material, and a both charge transport material, for example. The red light emitting material may be a fluorescent material or a phosphorescent material. The red light emitting layer having a thickness of about 5 nm is formed by mixing 30% by mass of 2,6-bis[(4'-methoxydiphenylamino) styryl]-1,5-dicyanonaphthalene (BSN) with 4,4-bis(2,2-diphenylvinin) biphenyl (DPVBi), for example.

In the green light emitting layer, by application of an electric field, a part of holes injected from the first electrode 31 and a part of electrons injected from the second electrode 32 are recombined to generate green light. Such a green light emitting layer contains at least one kind of material among a green light emitting material, a hole transport material, an electron transport material, and a both charge transport material, for example. The green light emitting material may be a fluorescent material or a phosphorescent material. The green light emitting layer having a thickness of about 10 nm is formed by mixing 5% by mass of coumarin 6 with DPVBi, for example.

In the blue light emitting layer, by application of an electric field, a part of holes injected from the first electrode 31 and a part of electrons injected from the second electrode 32 are recombined to generate blue light. Such a blue light emitting layer contains at least one kind of material among a blue light emitting material, a hole transport material, an electron transport material, and a both charge transport material, for example. The blue light emitting material may be a fluorescent material or a phosphorescent material. The blue light emitting layer having a thickness of about 30 nm is formed by mixing 2.5% by mass of 4,4'-bis[2-{4-(N,N-diphenylamino) phenyl} vinyl] biphenyl (DPAVBi) with DPVBi, for example.

The electron transport layer having a thickness of about 20 nm includes 8-hydroxyquinoline aluminum (Alq3), for example. The electron injection layer having a thickness of about 0.3 nm includes LiF, $Li_2O$, or the like, for example.

Provided that the materials constituting the layers are illustrative, and are not limited to these materials. Furthermore, for example, the light emitting layer may be constituted by a blue light emitting layer and a yellow light emitting layer, or may be constituted by a blue light emitting layer and an orange light emitting layer.

The light emitting element 10 has a resonator structure using the organic layer 33 as a resonance portion. The thickness of the organic layer 33 is preferably $8 \times 10^{-8}$ m or more and $5 \times 10^{-7}$ m or less, and more preferably $1.5 \times 10^{-7}$ m or more and $3.5 \times 10^{-7}$ m or less in order to appropriately adjust a distance from a light emitting surface to a reflecting surface (specifically, a distance from a light emitting surface to each of the first electrode 31 and the second electrode 32). In an organic EL display device having a resonator structure, actually, the red light emitting element 10R causes a red light beam emitted from the light emitting layer to resonate, and emits reddish light (light having a light spectrum peak in a red region) from the second electrode 32. Furthermore, the green light emitting element 10G causes a green light beam emitted from the light emitting layer to resonate, and emits greenish light (light having a light spectrum peak in a green region) from the second electrode 32. Moreover, the blue light emitting element 10B causes a blue light beam emitted from the light emitting layer to resonate, and emits bluish light (light having a light spectrum peak in a blue region) from the second electrode 32.

Hereinafter, an outline of a method for manufacturing the light emitting element 10 of Example 1 illustrated in FIG. 1 will be described.

[Step-100]

First, a light emitting element driving unit is formed on a silicon semiconductor substrate (first substrate 11) on the basis of a known MOSFET manufacturing process.

[Step-110]

Subsequently, the base body (interlayer insulating layer) 26 is formed on the entire surface on the basis of a CVD method.

[Step-120]

Then, in a portion of the base body 26 positioned above one of source/drain regions of the transistor 20, a connection hole is formed on the basis of a photolithography technique and an etching technique. Subsequently, a metal layer is formed on the base body 26 including the connection hole, for example, on the basis of a sputtering method. Thereafter, the metal layer is patterned on the basis of the photolithography technique and the etching technique, and the first electrode 31 can be thereby formed on a part of the base body 26. The first electrode 31 is isolated for each of the light emitting elements. At the same time, the contact hole (contact plug) 27 for electrically connecting the first electrode 31 to the transistor 20 can be formed in the connection hole.

[Step-130]

Next, the insulating layer 28 is formed on the entire surface, for example, on the basis of a CVD method. Thereafter, the insulating layer 28 is left on the base body 26 between the first electrode 31 and the first electrode 31 on the basis of the photolithography technique and the etching technique.

[Step-140]

Thereafter, the organic layer 33 is formed on the first electrode 31 and the insulating layer 28 by a PVD method such as a vacuum vapor deposition method or a sputtering method, or a coating method such as a spin coating method or a die coating method, for example. In some cases, the organic layer 33 may be patterned into a desired shape.

[Step-150]

Subsequently, the second electrode 32 is formed on the entire surface on the basis of a vacuum vapor deposition method or the like, for example. In some cases, the second electrode 32 may be patterned into a desired shape. In this way, the organic layer 33 and the second electrode 32 can be formed on the first electrode 31.

[Step-160]

Figure 18A:
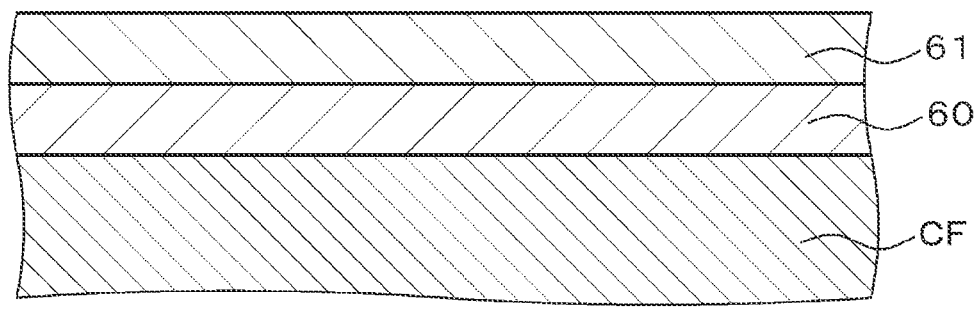
FIGS. 18A, 18B, and 18C are schematic partial end views of a base body and the like for explaining a method for manufacturing a lens member in the light emitting element of Example 1 illustrated in FIG. 1.
Figure 18B:
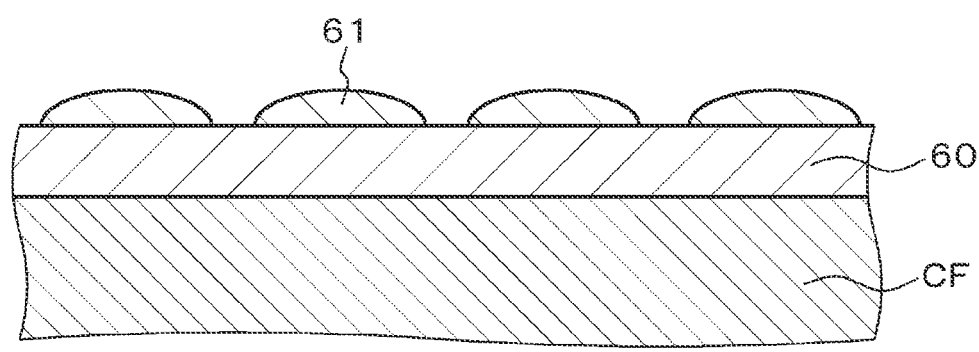
Figure 18C:
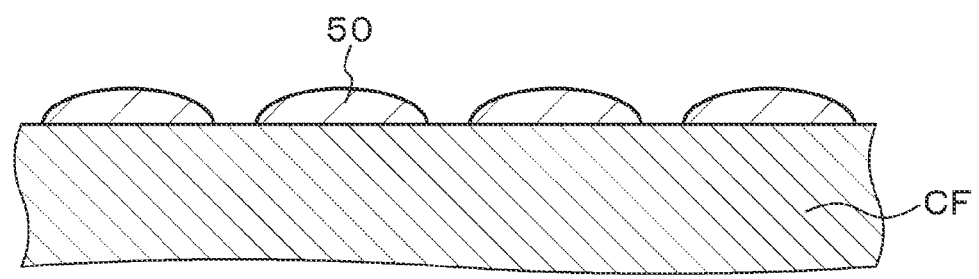

Then, the lower intermediate layer 34' is formed on the entire surface on the basis of a coating method. Thereafter, a top surface of the lower intermediate layer 34' is flattened. Since the lower intermediate layer 34' can be formed on the basis of a coating method, there are few restrictions on a processing process, a material selection range is wide, and a high refractive index material can be used. Thereafter, the color filter layer $CF_R$, $CF_G$, $CF_B$ constituting the upper intermediate layer is formed on the lower intermediate layer 34' by a known method, and the optical path control unit 50 is further formed on the color filter layer CF ($CF_R$, $CF_G$, $CF_B$). Specifically, as illustrated in FIG. 18A, a lens member forming layer 60 for forming the optical path control unit 50 is formed on the color filter layer CF, and a resist material layer 61 is formed on the lens member forming layer 60. Then, the resist material layer 61 is patterned and further heated to form the resist material layer 61 into a lens member shape (see FIG. 18B). Subsequently, the resist material layer 61 and the lens member forming layer 60 are etched back to transfer the shape formed for the resist material layer 61 to the lens member forming layer 60 (see FIG. 18C). In this way, the optical path control unit 50 can be obtained.

[Step-170]

Then, the first coating layer 35 and the second coating layer 36 are sequentially formed on the color filter layer $CF_R$, $CF_G$, $CF_R$ and the optical path control unit 50, and the second coating layer 36 is flattened. The first coating layer 35 is formed on the basis of a spin coating method, and the second coating layer 36 is formed on the basis of the spin coating method. A top surface of the first coating layer 35 (an interface 37 between the first coating layer 35 and the second coating layer 36) is flat. Subsequently, the second coating layer 36 and the second substrate 12 are bonded to each other with the sealing resin layer 38 containing an acrylic adhesive. In this way, the light emitting element (organic EL element) 10a illustrated in FIG. 1 and the display device of Example 1 can be obtained. As described above, by disposing the color filter layer CF on the first substrate side instead of disposing the color filter layer CF on the second substrate side, that is, by forming a so-called OCCF type, a distance between the organic layer 33 and the color filter layer CF can be shortened, and the design width and the degree of freedom in design of the optical path control unit 50 are widened. By forming the so-called OCCF type, a problem is unlikely to occur in alignment with the organic layer 33.

In the light emitting element 10a of Example 1, as illustrated in FIG. 2, for example, a light beam $Ray_1$ (indicated by a dotted line) emitted from the center of the light emitting portion 30 and directed to the vicinity of a periphery of the optical path control unit 50 is bent in a direction directed to the center of the optical path control unit 50 at an interface between the optical path control unit 50 and the first coating layer 35 (light emitting surface (outer surface) 51 of the optical path control unit 50) because $n_0 > n_1$ is satisfied. Although depending on the shape of the optical path control unit 50, the light beam $Ray_1$ directed to the vicinity of the periphery of the optical path control unit 50 has a large incident angle with respect to the interface between the optical path control unit 50 and the first coating layer 35 (light emitting surface (outer surface) 51 of the optical path control unit 50), but is largely bent in a direction directed to the center of the optical path control unit 50 because a difference in refractive index of $n_0$-$n_1$ is large. As a result of the above, the light beam $Ray_1$ emitted from the center of the light emitting portion 30 and directed to the vicinity of the periphery of the optical path control unit 50 is further bent in a direction directed to the center of the optical path control unit 50.

Meanwhile, a light beam $Ray_2$ (indicated by a dotted line) emitted from the center of the light emitting portion 30 and directed to a central side of the optical path control unit 50 rather than the vicinity of the periphery of the optical path control unit 50 is bent in a direction directed to the center of the optical path control unit 50 at an interface between the optical path control unit 50 and the second coating layer 36 (light emitting surface (outer surface) 51 of the optical path control unit 50) because $n_0 > n_2$ is satisfied. Although depending on the shape of the optical path control unit 50, the light beam $Ray_2$ directed to the central side of the optical path control unit 50 has an incident angle that is not so large with respect to the interface between the optical path control unit 50 and the second coating layer 36 (light emitting surface (outer surface) 51 of the optical path control unit 50), and is therefore sufficiently bent in a direction directed to the center of the optical path control unit 50 even if a difference in refractive index of $n_0$-$n_2$ is not large. As a result of the above, the light beam $Ray_2$ emitted from the center of the light emitting portion 30 and directed to the vicinity of the periphery of the optical path control unit 50 is further bent in a direction directed to the center of the optical path control unit 50.

By setting the size of a pixel to 6.8 μm×6.8 μm, constituting one pixel by four sub-pixels (a red light emitting sub-pixel 10R, a green light emitting sub-pixel 10G, a blue light emitting sub-pixel 10B, and a white light emitting sub-pixel 10W) as illustrated in FIG. 17D, setting the size of one sub-pixel to 3.4 μm×3.4 μm, and assuming that there is a gap $L_{space}$ between the optical path control unit 50 and the optical path control unit 50 constituting light emitting elements in adjacent sub-pixels, front brightness of one pixel was determined on the basis of simulation. As described above, $n_0=1.54$, $n_1=1.25$, and $n_2=1.38$ were satisfied. The gap $L_{space}=0.00$ μm means that there is no gap. Furthermore, the thickness (height of the optical path control unit 50) $H_0$ along an optical axis of a convex lens member constituting the optical path control unit 50 was 1.7 μm. The thickness ($H_1$) of the first coating layer 35 was 0.7 μm. The planar shape of a bottom surface of the optical path control unit 50 was an ellipse (minor axis/major axis=0.78). Front brightness is a standardized value if a value of front brightness is 1.00 in a case of Comparative Example 1 in which a coating layer is constituted by one layer having a refractive index of 1.38. Table 1 illustrates the determined values of front brightness. Furthermore, Table 1 also illustrates standardized front brightness of a light emitting element in Comparative Example 2 in which $n_0=1.54$, $n_1=1.00$ (assuming an air layer), and $n_2=1.38$ were satisfied. The shape of the lens surface (light emitting surface (outer surface) 51) was determined by setting a in the following formula to a=2.5, setting a minor axis (X) of a bottom surface of the lens to 3.40 μm (−1.70 μm≤X≤1.70 μm), setting a major axis (X) of the bottom surface of the lens to 4.36 μm (−2.18 μm≤X≤2.18 μm), and setting a maximum lens height ($Y_{max}$) to 1.70 μm. The height (Y) of the lens satisfies 0.00 μm≤Y≤1.70 μm.

$$t=(\tfrac{1}{2})[1+[\{1-\exp(-a(2x-1))\}/\{1+\exp(-a(2x-1))\}]\times[\{1+\exp(-a)\}/\{1-\exp(-a)\}]]$$

Provided that 0≤x≤1 is satisfied.

$$y=-2t^3+3t^2,$$

$$X=x-1, \text{ and}$$

$$Y=y-0.5$$

are satisfied.

Provided that a range of 0≤X≤0.5 and a range of −0.5X≤0 are symmetric with respect to the Y axis.

TABLE 1

| $L_{space}$ | Example 1 | Comparative Example 2 |
| --- | --- | --- |
| 0.68 μm | 1.03 | 0.97 |
| 0.34 μm | 1.05 | 1.03 |
| 0.00 μm | 1.06 | 1.04 |

Table 1 indicates that front brightness can be increased by appropriately selecting values of $n_0$, $n_1$, and $n_2$, and that the smaller a value of gap $L_{space}$ is, the more front brightness can be increased. However, Table 1 also indicates that a too small value of $n_1$ makes an increase in front brightness impossible.

That is, if the height of the optical path control unit 50 is represented by $H_0$ and a minimum distance between the optical path control units 50 constituting adjacent light emitting elements is represented by $L_0$ (corresponding to gap $L_{space}$), $$0 \leq L_0/H_0 \leq 0.5$$

is preferably satisfied. Furthermore, as a result of simulations in which the thickness $H_1$ of the first coating layer 35 was changed variously, it has been found that $0.10 \leq H_1/H_0 \leq 0.90$ is satisfied, and desirably, $0.30 \leq H_1/H_0 \leq 0.70$ is preferably satisfied.

As described above, in the light emitting element of Example 1 or a light emitting element constituting the display device of Example 1, a value $n_0$ of a refractive index of a material constituting the optical path control unit, a value $n_1$ of a refractive index of a material constituting the first coating layer, and a value $n_2$ of a refractive index of a material constituting the second coating layer are different from each other. Therefore, light emitted in the light emitting portion passes through the intermediate layer, enters the optical path control unit, and is emitted from the optical path control unit. By appropriately selecting values of refractive index $n_1$, $n_2$, and $n_3$ of the optical path control unit, the first coating layer, and the second coating layer, specifically, by setting these values so as to satisfy $n_0 > n_2 > n_1 > n_{air}$, an optical path of light passing through the first coating layer and the second coating layer, and an optical path of light passing through the second coating layer can be appropriate. As a result, a light extraction efficiency and front brightness of the light emitting element or the display device can be increased, and occurrence of color mixing can be suppressed.

Alternatively, in the light emitting element of Example 1 or a light emitting element constituting the display device of Example 1, the first coating layer is constituted by a material different from a material constituting the second coating layer. Therefore, light emitted in the light emitting portion passes through the intermediate layer, enters the optical path control unit, and is emitted from the optical path control unit. By appropriately selecting materials constituting the first coating layer and the second coating layer, an optical path of light emitted from the optical path control unit and passing through the first coating layer and the second coating layer, and an optical path of light passing through the second coating layer can be appropriate. As a result, a light extraction efficiency and front brightness of the light emitting element or the display device can be increased, and occurrence of color mixing can be suppressed.

Example 2

Figure 3:
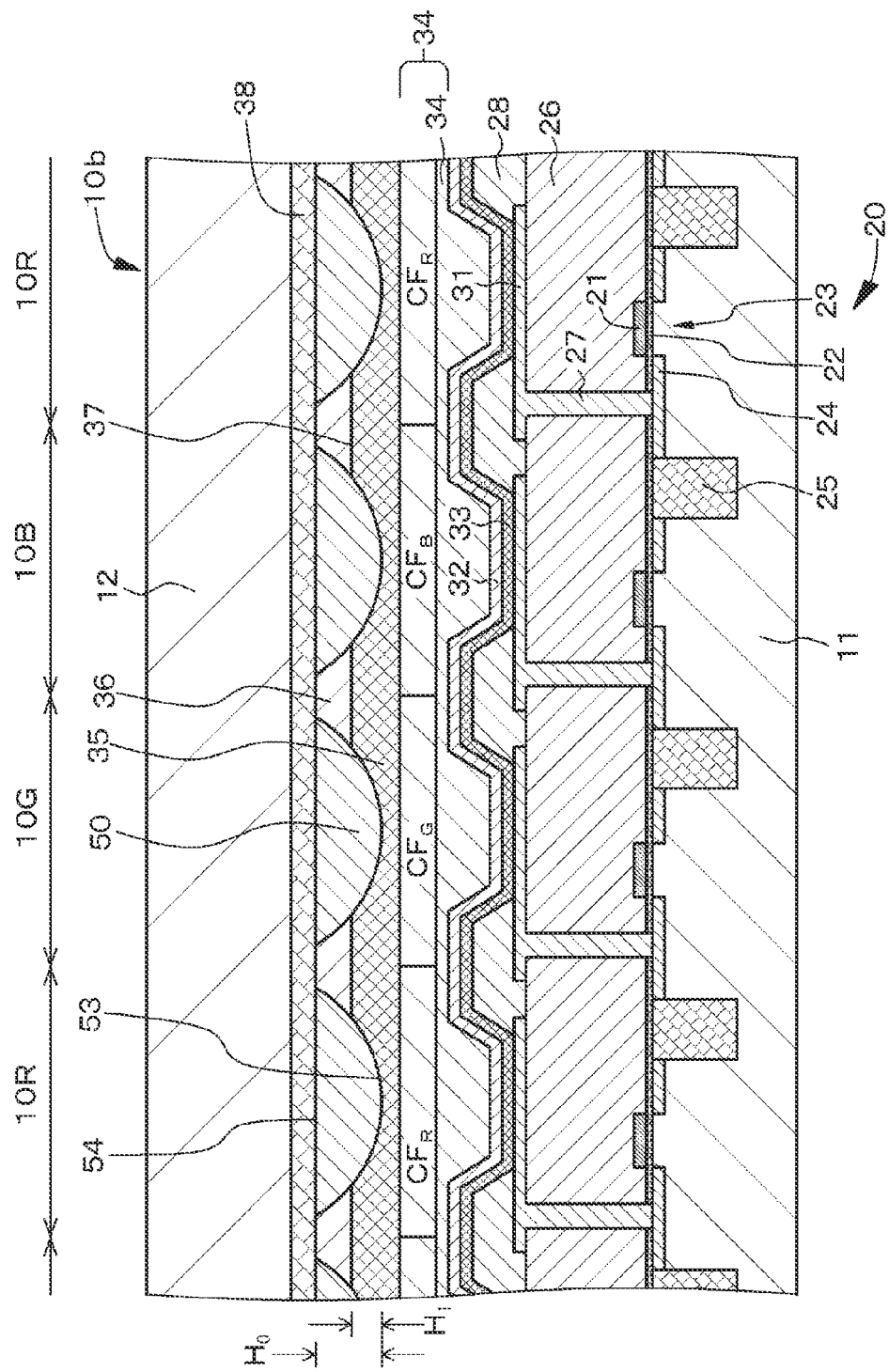
FIG. 3 is a schematic partial cross-sectional view of a display device of Example 2.
Figure 4:
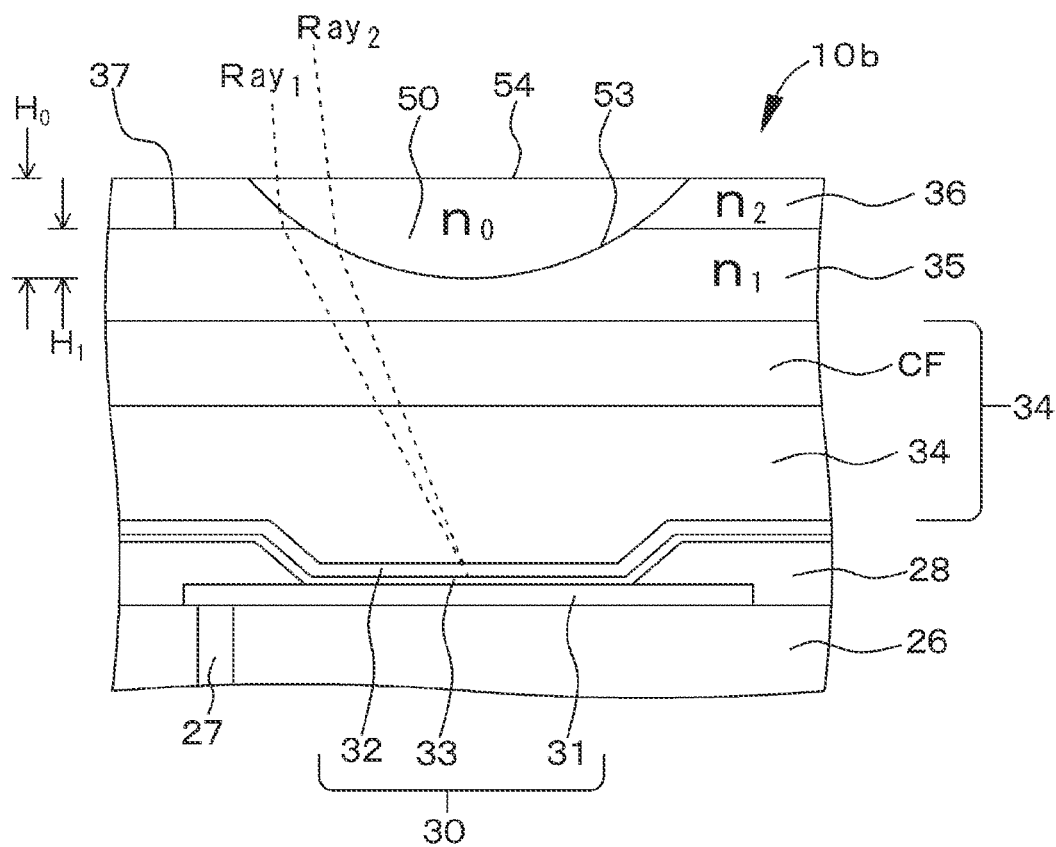
FIG. 4 is a schematic partial cross-sectional view of a light emitting element of Example 2 for explaining a behavior of a light beam emitted from a light emitting portion.

Example 2 is a modification of Example 1, and relates to the light emitting element of second configuration. FIG. 3 illustrates a schematic partial cross-sectional view of a display device of Example 2. FIG. 4 illustrates a schematic partial cross-sectional view of the light emitting element of Example 2 for explaining a behavior of a light beam emitted from a light emitting portion.

In the light emitting element of Example 2, a light incident surface (outer surface) 53 of the optical path control unit 50 is convex toward a top surface of the intermediate layer 34. In the light emitting element of Example 2, a light emitting surface 54 of the optical path control unit 50 is flat. The first coating layer 35 covers a part of the light incident surface (outer surface) 53 of the optical path control unit 50 on the intermediate layer side, and the second coating layer 36 covers the first coating layer 35 and the rest of the light incident surface (outer surface) 53 of the optical path control unit 50. The first coating layer 35 is formed on the intermediate layer 34, and the optical path control unit 50 is formed on the first coating layer 35. Moreover, the optical path control unit 50 has a positive optical power, or the optical path control unit 50 is constituted by a convex lens member. The light incident surface (outer surface) 53 constitutes a lens surface.

In the light emitting element 10 (10R, 10G, 10B) of Example 2, $n_{air} < n_2 < n_1 < n_0$ is satisfied. Here, specifically $0.25 \le n_0 - n_2 \le 0.50$, $0.15 \le n_1 - n_1 \le 0.30$, and $0.10 \le n_1 - n_2 \le 0.30$ are satisfied. Specifically, in the light emitting element 10 (10R, 10G, 10B) of Example 2, the optical path control unit 50 is constituted by an acrylic transparent resin (refractive index: 1.54), the first coating layer 35 is constituted by a fluorine-based low refractive index transparent resin (refractive index: 1.38), and the 2 coating layer 36 is constituted by a hollow silica-containing fluorine-based low refractive index transparent resin (refractive index: 1.25).

In the light emitting element 10b of Example 2, as illustrated in FIG. 4, for example, a light beam $Ray_1$ (indicated by a dotted line) emitted from the center of the light emitting portion 30 and directed to the vicinity of a periphery of the optical path control unit 50 is bent in a direction directed to the center of the optical path control unit 50 at an interface between the optical path control unit 50 and the second coating layer 36 (light incident surface (outer surface) 53 of the optical path control unit 50) because $n_0 > n_2$ is satisfied. Although depending on the shape of the optical path control unit 50, the light beam $Ray_1$ directed to the vicinity of the periphery of the optical path control unit 50 has a large incident angle with respect to the interface between the optical path control unit 50 and the second coating layer 36 (light incident surface (outer surface) 53 of the optical path control unit 50), but is largely bent in a direction directed to the center of the optical path control unit 50 because a difference in refractive index of $n_0 - n_2$ is large. As a result of the above, the light beam $Ray_1$ emitted from the center of the light emitting portion 30 and directed to the vicinity of the periphery of the optical path control unit 50 is further bent in a direction directed to the center of the optical path control unit 50.

Meanwhile, a light beam $Ray_2$ (indicated by a dotted line) emitted from the center of the light emitting portion 30 and directed to a central side of the optical path control unit 50 rather than the vicinity of the periphery of the optical path control unit 50 is bent in a direction directed to the center of the optical path control unit 50 at an interface between the optical path control unit 50 and the first coating layer 35 (light incident surface (outer surface) 53 of the optical path control unit 50) because $n_0 > n_1$ is satisfied. Although depending on the shape of the optical path control unit 50, the light beam $Ray_2$ directed to the central side of the optical path control unit 50 has an incident angle that is not so large with respect to the interface between the optical path control unit 50 and the first coating layer 35 (light incident surface (outer surface) 53 of the optical path control unit 50), and is therefore sufficiently bent in a direction directed to the center of the optical path control unit 50 even if a difference in refractive index of $n_0 - n_1$ is not large. As a result of the above, the light beam $Ray_2$ emitted from the center of the light emitting portion 30 and directed to the vicinity of the periphery of the optical path control unit 50 is further bent in a direction directed to the center of the optical path control unit 50.

Example 3

Figure 5:
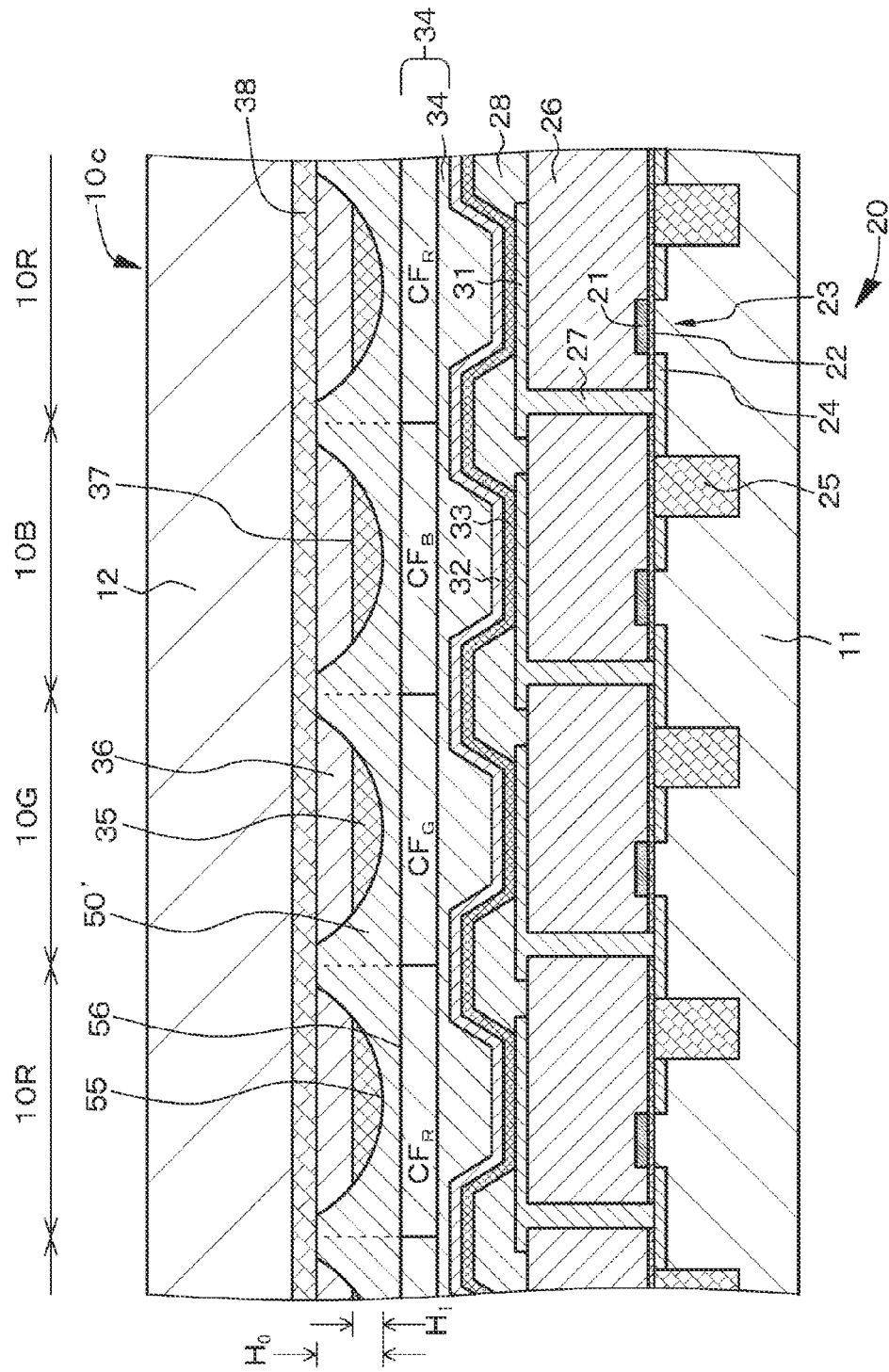
FIG. 5 is a schematic partial cross-sectional view of a display device of Example 3.
Figure 6:
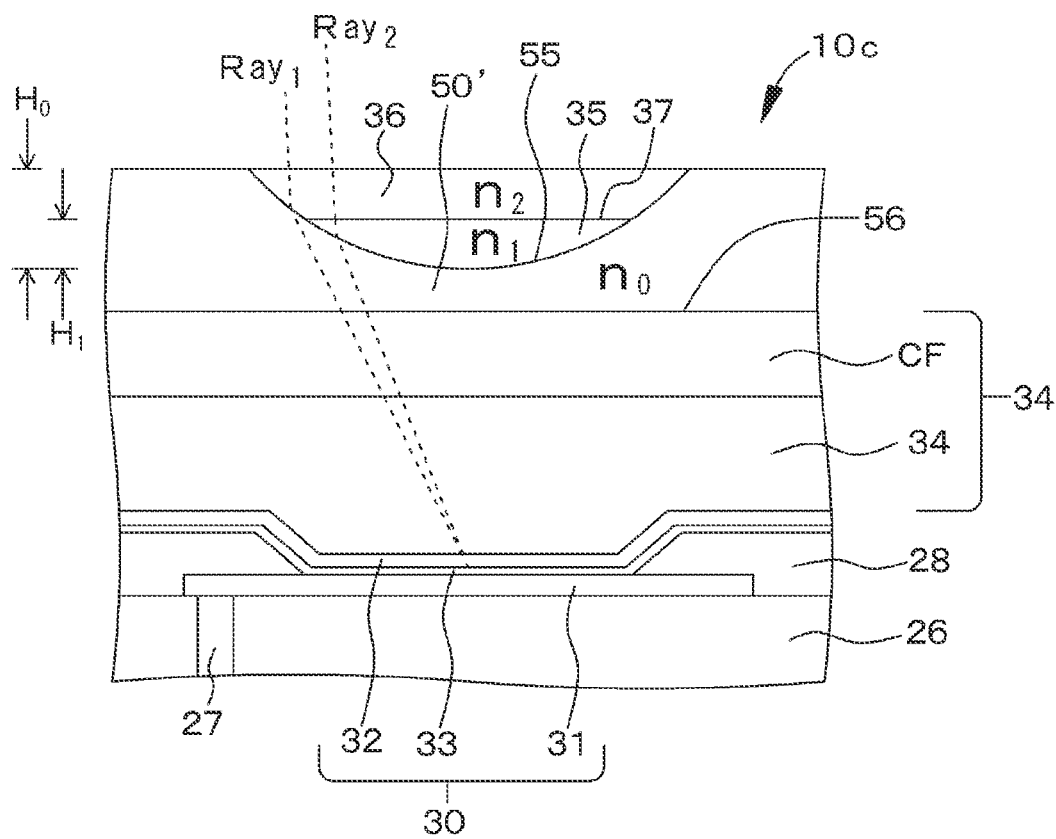
FIG. 6 is a schematic partial cross-sectional view of a light emitting element of Example 3 for explaining a behavior of a light beam emitted from a light emitting portion.

Example 3 is also a modification of Example 1, and relates to the light emitting element of third configuration. FIG. 5 illustrates a schematic partial cross-sectional view of a display device of Example 3. FIG. 6 illustrates a schematic partial cross-sectional view of the light emitting element of Example 3 for explaining a behavior of a light beam emitted from a light emitting portion.

In the light emitting element 10 (10R, 10G, 10B) of Example 3, if the refractive index of air is represented by $n_{air}$, $$n_{air} < n_0 < n_1 < n_2$$

is satisfied. Here, specifically $$0.15 \leq n_1 - n_0 \leq 0.30,$$

$$0.25 \leq n_2 - n_0 \leq 0.50, \text{ and}$$

$$0.10 \leq n_2 - n_1 \leq 0.30$$

are satisfied. In the light emitting element 10 (10R, 10G, 10B) of Example 3, an optical path control unit 50' is constituted by a fluorine-based low refractive index transparent resin (refractive index: 1.38), the first coating layer 35 is constituted by an acrylic low refractive index transparent resin (refractive index: 1.54), and the second coating layer 36 is constituted by SiN (refractive index: 1.74).

In the light emitting element of Example 3, a light emitting surface (outer surface) 55 of the optical path control unit 50' is concave with respect to a top surface of the intermediate layer 34. A light incident surface 56 of the optical path control unit 50' is in contact with the top surface of the intermediate layer 34. The first coating layer 35 covers a part of the light emitting surface (outer surface) 55 of the optical path control unit 50' on the intermediate layer side, and the second coating layer 36 covers the first coating layer 35 and the rest of the light emitting surface (outer surface) 55 of the optical path control unit 50'. Moreover, the optical path control unit 50' has a negative optical power, or the optical path control unit 50' is constituted by a concave lens member. The light emitting surface (outer surface) 55 constitutes a lens surface.

In the light emitting element 10c of Example 3, as illustrated in FIG. 6, for example, a light beam Ray$_1$ (indicated by a dotted line) emitted from the center of the light emitting portion 30 and directed to the vicinity of a periphery of the optical path control unit 50' is bent in a direction directed to the center of the optical path control unit 50' at an interface between the optical path control unit 50' and the second coating layer 36 (light emitting surface (outer surface) 55 of the optical path control unit 50') because $n_2 > n_0$ is satisfied. Although depending on the shape of the optical path control unit 50', the light beam Ray$_1$ directed to the vicinity of the periphery of the optical path control unit 50' has a large incident angle with respect to the interface between the optical path control unit 50' and the second coating layer 36 (light emitting surface (outer surface) 55 of the optical path control unit 50'), but is largely bent in a direction directed to the center of the optical path control unit 50' because a difference in refractive index of $n_2 - n_0$ is large. As a result of the above, the light beam Ray$_1$ emitted from the center of the light emitting portion 30 and directed to the vicinity of the periphery of the optical path control unit 50' is further bent in a direction directed to the center of the optical path control unit 50'.

Meanwhile, a light beam Ray$_2$ (indicated by a dotted line) emitted from the center of the light emitting portion 30 and directed to a central side of the optical path control unit 50' rather than the vicinity of the periphery of the optical path control unit 50' is bent in a direction directed to the center of the optical path control unit 50' at an interface between the optical path control unit 50' and the first coating layer 35 (light emitting surface (outer surface) 55 of the optical path control unit 50') because $n_1 > n_0$ is satisfied. Although depending on the shape of the optical path control unit 50', the light beam Ray$_2$ directed to the central side of the optical path control unit 50' has an incident angle that is not so large with respect to the interface between the optical path control unit 50' and the first coating layer 35 (light emitting surface (outer surface) 55 of the optical path control unit 50'), and is therefore sufficiently bent in a direction directed to the center of the optical path control unit 50' even if a difference in refractive index of $n_1 - n_0$ is not large. As a result of the above, the light beam Ray$_2$ emitted from the center of the light emitting portion 30 and directed to the central side of the optical path control unit 50' is further bent in a direction directed to the center of the optical path control unit 50'.

Example 4

Figure 7:
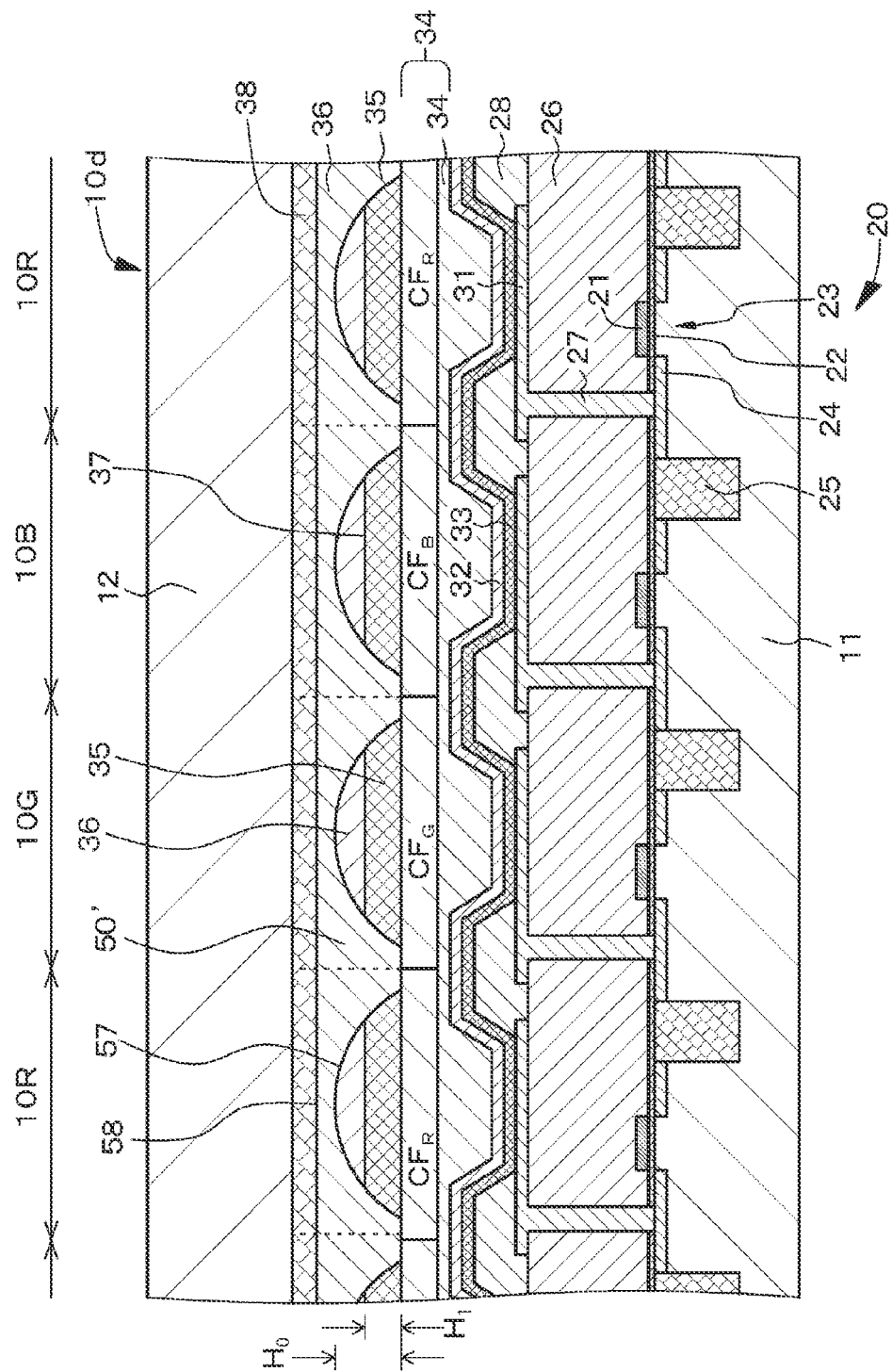
FIG. 7 is a schematic partial cross-sectional view of a display device of Example 4.
Figure 8:
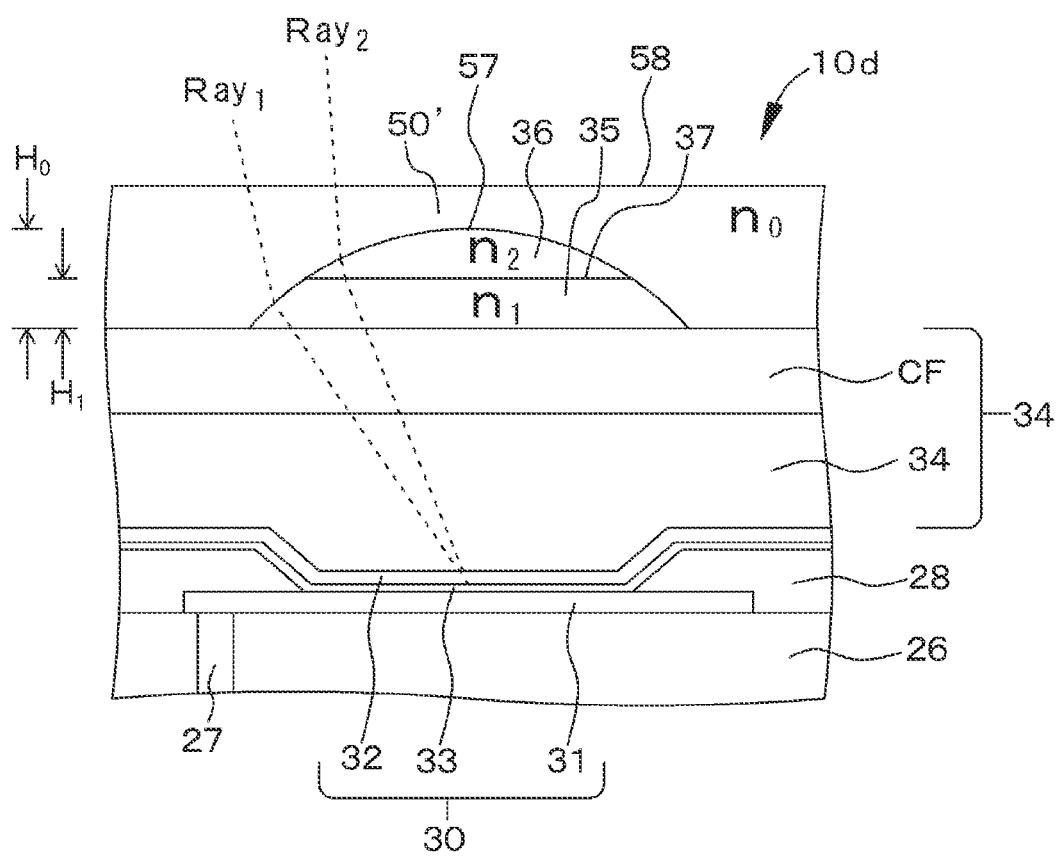
FIG. 8 is a schematic partial cross-sectional view of a light emitting element of Example 4 for explaining a behavior of a light beam emitted from a light emitting portion.

Example 4 is also a modification of Example 1, and relates to the light emitting element of fourth configuration. FIG. 7 illustrates a schematic partial cross-sectional view of a display device of Example 4. FIG. 8 illustrates a schematic partial cross-sectional view of the light emitting element of Example 4 for explaining a behavior of a light beam emitted from a light emitting portion.

In the light emitting element 10 (10R, 10G, 10B) of Example 4, if the refractive index of air is represented by $n_{air}$, $$n_{air} < n_0 < n_2 < n_1$$

is satisfied. Here, specifically $$0.15 \leq n_2 - n_0 \leq 0.30,$$

$$0.25 \leq n_1 - n_0 \leq 0.50, \text{ and}$$

$$0.10 \leq n_1 - n_2 \leq 0.30$$

are satisfied. In the light emitting element 10 (10R, 10G, 10B) of Example 4, the optical path control unit 50' is constituted by a fluorine-based low refractive index transparent resin (refractive index: 1.38), the first coating layer 35 is constituted by SiN (refractive index: 1.74), and the second coating layer 36 is constituted by an acrylic low refractive index transparent resin (refractive index: 1.54).

In the light emitting element of Example 4, a light incident surface (outer surface) 57 of the optical path control unit 50' is concave toward a top surface of the intermediate layer 34. A light emitting surface 58 of the optical path control unit 50' is flat. Moreover, the first coating layer 35 covers a part of the light incident surface (outer surface) 57 of the optical path control unit 50' on the intermediate layer side, and the second coating layer 36 covers the first coating layer 35 and the rest of the light incident surface (outer surface) 57 of the optical path control unit 50'. The first coating layer 35 is formed on the intermediate layer 34, and a part of the optical path control unit 50 is also formed on the intermediate layer 34. In some cases, the first coating layer 35 may be formed on the intermediate layer 34, and the optical path control unit 50 may be formed on the first coating layer 35. Moreover, the optical path control unit 50' has a negative optical power, or the optical path control unit 50' is constituted by a concave lens member. The light incident surface (outer surface) 57 constitutes a lens surface.

In the light emitting element 10d of Example 4, as illustrated in FIG. 8, for example, a light beam Ray$_1$ (indicated by a dotted line) emitted from the center of the light emitting portion 30 and directed to the vicinity of a periphery of the optical path control unit 50' is bent in a direction directed to the center of the optical path control unit 50' at an interface between the first coating layer 35 and the optical path control unit 50' (light incident surface (outer surface) 57 of the optical path control unit 50') because $n_1 > n_0$ is satisfied. Although depending on the shape of the optical path control unit 50', the light beam Ray$_1$ directed to the vicinity of the periphery of the optical path control unit 50' has a large incident angle with respect to the interface between the optical path control unit 50' and the first coating layer 35 (light incident surface (outer surface) 57 of the optical path control unit 50'), but is largely bent in a direction directed to the center of the optical path control unit 50' because a difference in refractive index of $n_1-n_0$ is large. As a result of the above, the light beam Ray$_1$ emitted from the center of the light emitting portion 30 and directed to the vicinity of the periphery of the optical path control unit 50' is further bent in a direction directed to the center of the optical path control unit 50'.

Meanwhile, a light beam Ray$_2$ (indicated by a dotted line) emitted from the center of the light emitting portion 30 and directed to a central side of the optical path control unit 50' rather than the vicinity of the periphery of the optical path control unit 50' is bent in a direction directed to the center of the optical path control unit 50' at the interface 37 between the first coating layer 35 and the second coating layer 36 because $n_1 > n_2$ is satisfied. In addition, moreover, the light beam Ray$_2$ is bent in a direction directed to the center of the optical path control unit 50' at an interface between the optical path control unit 50' and the second coating layer 36 (light incident surface (outer surface) 57 of the optical path control unit 50') because $n_2 > n_0$ is satisfied. Although depending on the shape of the optical path control unit 50', the light beam Ray$_2$ directed to the central side of the optical path control unit 50' has an incident angle that is not so large with respect to the interface between the optical path control unit 50' and the second coating layer 36 (light incident surface (outer surface) 57 of the optical path control unit 50'), and is therefore sufficiently bent in a direction directed to the center of the optical path control unit 50' even if a difference in refractive index of $n_2-n_0$ is not large. As a result of the above, the light beam Ray$_1$ emitted from the center of the light emitting portion 30 and directed to the central side of the optical path control unit 50' is further bent in a direction directed to the center of the optical path control unit 50'.

Example 5

Example 5 is a modification of Examples 1 to 4. In Example 5, a relationship among a normal LN passing through the center of a light emitting portion, a normal LN' passing through the center of an optical path control unit, and a normal LN" passing through the center of a wavelength selection portion, and Modification thereof will be described.

In a display panel constituting a display device of Example 5, a reference point (reference region) P is assumed, and the distance Do depends on the distance $D_1$ from the reference point (reference region) P to the normal LN passing through the center of the light emitting portion.

In addition, the reference point P may be assumed in the display panel constituting the display device, and in this case, a configuration in which the reference point P is not located in the central region of the display panel may be adopted, or the reference point P may be located in the central region of the display panel. Moreover, in these cases, one reference point P may be assumed, or a plurality of reference points P may be assumed. In addition, in these cases, a configuration in which values of distance $D_0$ are 0 in some of the light emitting elements, and values of distance $D_0$ are not 0 in the remaining light emitting elements may be adopted.

Alternatively, in a case where one reference point P is assumed, a configuration in which the reference point P is not included in the central region of the display panel may be adopted, or the reference point P may be included in the central region of the display panel. Furthermore, in a case where a plurality of reference points P is assumed, a configuration in which at least one reference point P is not included in the central region of the display panel may be adopted.

Alternatively, the reference point P may be assumed outside the display panel, and in this case, one reference point P may be assumed, or a plurality of reference points P may be assumed. In addition, in these cases, a configuration in which values of distance $D_0$ are not 0 in all the light emitting elements may be adopted.

Moreover, light that has been emitted from the light emitting elements and has passed through the optical path control units may converge (be condensed) on a certain region in a space outside the display device. Alternatively, light that has been emitted from the light emitting elements and has passed through the optical path control units may be diverged in a space outside the display device. Alternatively, light that has been emitted from the light emitting elements and has passed through the optical path control units may be parallel light.

Moreover, in the display device of Example 5, a value of distance (offset amount) Do may vary depending on a position occupied by the light emitting element on the display panel. Specifically, a form may be adopted in which a reference point P is set, the plurality of light emitting elements is arranged in a first direction and a second direction different from the first direction, and if a distance from the reference point P to the normal LN passing through the center of the light emitting portion is represented by $D_1$, values of distance $D_0$ in the first and second directions are represented by $D_{0-X}$ and $D_{0-Y}$, respectively, and values of distance $D_1$ in the first and second directions are represented by $D_{1-X}$ and $D_{1-Y}$, respectively, $D_{0-X}$ changes linearly with respect to a change of $D_{1-X}$, and $D_{0-Y}$ changes linearly with respect to a change of $D_{1-Y}$, or $D_{0-X}$ changes linearly with respect to a change of $D_{1-X}$, and $D_{0-Y}$ changes non-linearly with respect to a change of or $D_{0-X}$ changes non-linearly with respect to a change of $D_{1-X}$, and $D_{0-Y}$ changes linearly with respect to a change of $D_{1-Y}$, or $D_{0-X}$ changes non-linearly with respect to a change of $D_{1-X}$, and $D_{0-Y}$ changes non-linearly with respect to a change of $D_{1-Y}$.

Alternatively, in the display device of Example 5, a form may be adopted in which a reference point P is set, and if a distance from the reference point P to a normal LN passing through the center of the light emitting portion is represented by $D_1$, a value of distance $D_0$ increases as a value of distance $D_1$ increases.

Here, the phrase that $D_{0-X}$ changes linearly with respect to a change of $D_{1-X}$, and $D_{0-Y}$ changes linearly with respect to a change of $D_{1-Y}$ means that $$D_{0-X} = k_X \cdot D_{1-X} \text{ and}$$

$$D_{0-Y} = k_Y \cdot D_{1-Y}$$

are satisfied. Provided that $k_X$ and $k_Y$ are constants. That is, $D_{0-X}$ and $D_{0-Y}$ each change on the basis of a linear function. Meanwhile, the phrase that $D_{0-X}$ changes non-linearly with respect to a change of $D_{1-X}$, and $D_{0-Y}$ changes linearly with respect to a change of $D_{1-Y}$ means that $$D_{0-X}=f_X(D_{1-X}) \text{ and}$$

$$D_{0-Y}=f_Y(D_{1-Y})$$

are satisfied. Here, $f_X$ and $f_Y$ are functions that are not linear functions (for example, quadratic functions).

Alternatively, a change of $D_{0-X}$ with respect to a change of $D_{1-X}$ and a change of $D_{0-Y}$ with respect to a change of $D_{1-Y}$ may be step-like changes. In addition, in this case, when the step-like change is viewed as a whole, the change may change linearly, or the change may change non-linearly. Moreover, when the display panel is divided into M×N regions, in one region, a change of $D_{0-X}$ with respect to a change of $D_{1-X}$ and a change of $D_{0-Y}$ with respect to a change of $D_{1-Y}$ may be unchanged or constant changes. The number of light emitting elements in one region may be 10×10, without being limited thereto.

Moreover, in the display device of Example 5, an orthophoto image of the optical path control unit may coincide with an orthophoto image of the wavelength selection portion, or may be included in the orthophoto image of the wavelength selection portion. By adopting the latter configuration, occurrence of color mixing between adjacent light emitting elements can be reliably suppressed. Moreover, in these cases, in the light emitting element in which a value of distance Do is not 0, (a) a form in which the normal LN" passing through the center of the wavelength selection portion coincides with the normal LN passing through the center of the light emitting portion, (b) a form in which the normal LN" passing through the center of the wavelength selection portion coincides with the normal LN' passing through the center of the optical path control unit, or (c) a form in which the normal LN" passing through the center of the wavelength selection portion does not coincide with the normal LN passing through the center of the light emitting portion, and the normal LN" passing through the center of the wavelength selection portion does not coincide with the normal LN' passing through the center of the optical path control unit may be adopted. By adopting the latter configuration (b) or (c), occurrence of color mixing between adjacent light emitting elements can be reliably suppressed.

Figure 9:
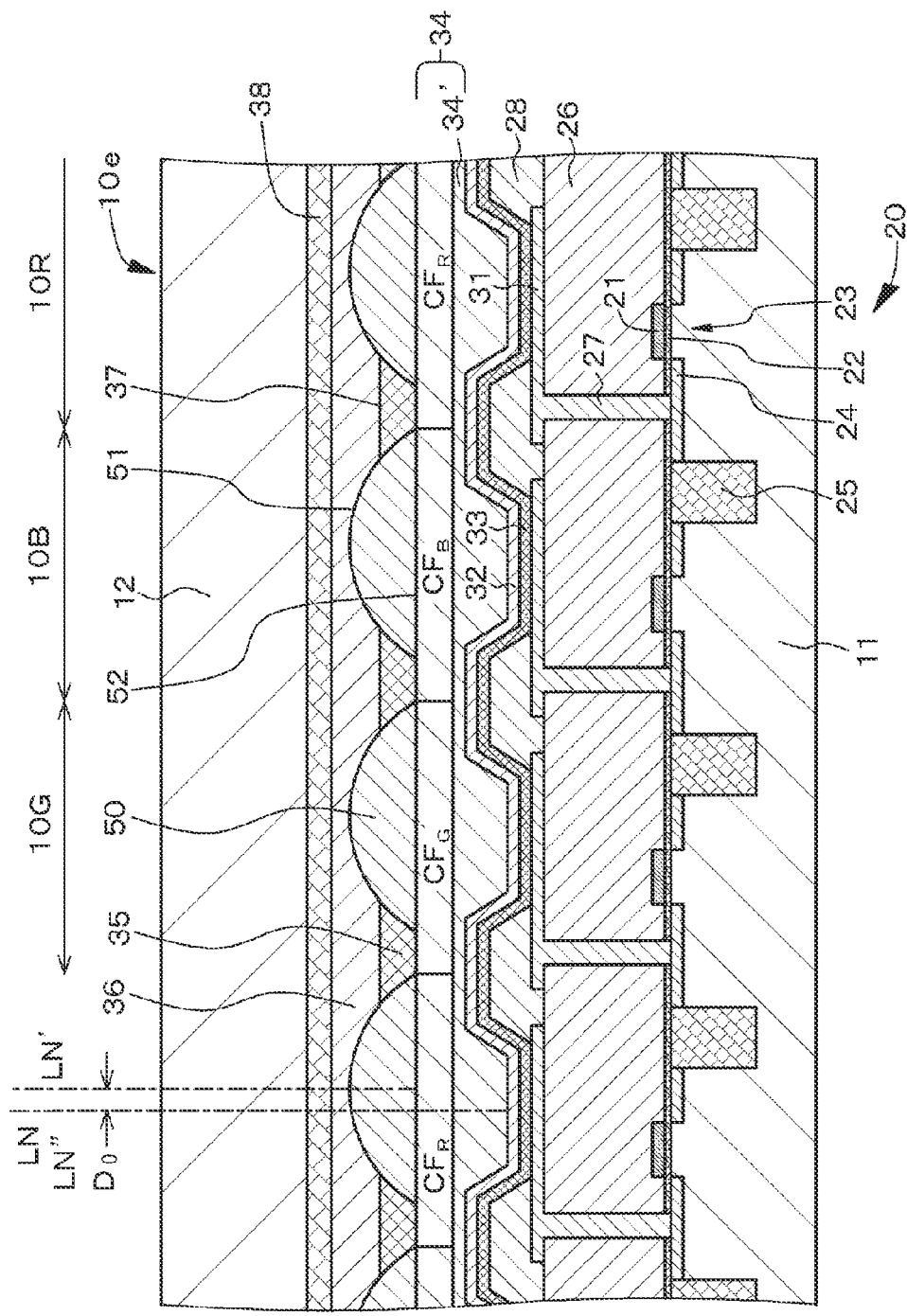
FIG. 9 is a schematic partial cross-sectional view of a display device of Example 5.

FIG. 9 illustrates a schematic partial cross-sectional view of the display device of Example 5.

In Example 5, if a distance (offset amount) between the normal LN passing through the center of the light emitting portion and the normal LN' passing through the center of the optical path control unit 50 is represented by Do, in at least some of the light emitting elements 10e included in a display panel constituting the display device, values of distance (offset amount) Do are not 0. In the display device, a reference point (reference region) is assumed, and the distance Do depends on the distance $D_1$ from the reference point (reference region) to the normal LN passing through the center of the light emitting portion.

Figure 20A:
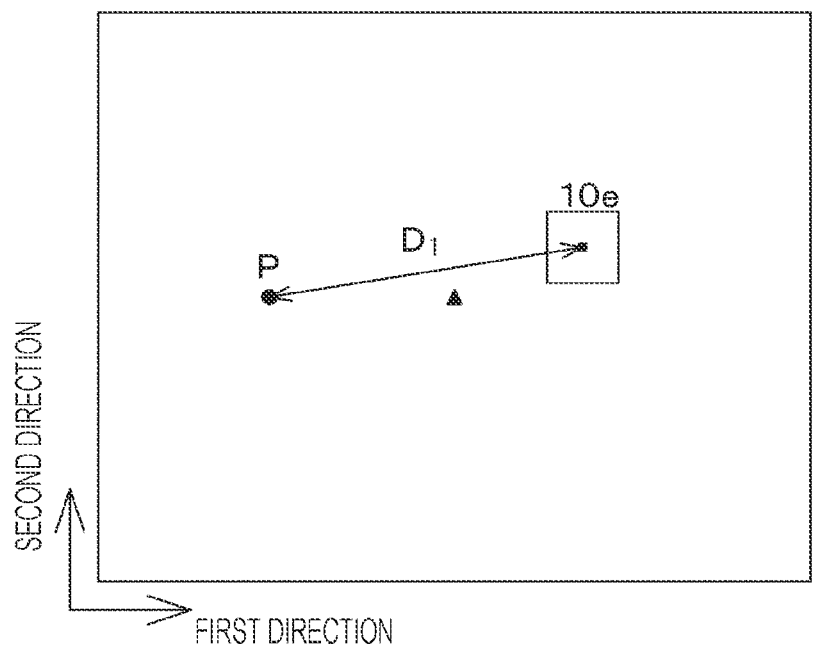
FIGS. 20A and 20B are schematic diagrams illustrating a positional relationship between a light emitting element and a reference point in the display device of Example 5.

In the display device of Example 5, the reference point P is assumed in the display panel. Provided that the reference point P is not located (not included) in the central region of the display panel. In FIGS. 20A, 20B, 21A, and 21B, the central region of the display panel is indicated by a black triangle mark, the light emitting element 10e is indicated by a square mark, the center of the light emitting portion 30 is indicated by a black square mark, and the reference point P is indicated by a black circle. In addition, a positional relationship between the light emitting element 10e and the reference point P is schematically illustrated in FIG. 20A, and one reference point P is assumed. Since the reference point P can spread to some extent, values of distance $D_0$ are 0 in some of the light emitting elements 10e (specifically, one or more light emitting elements 10e included in the reference point P), and values of distance Do are not 0 in the remaining light emitting elements 10e. A value of distance (offset amount) $D_0$ varies depending on a position occupied by the light emitting element on the display panel.

In each of the display devices of Examples, light that has been emitted from the light emitting elements 10e and has passed through the optical path control units 50 converges (is condensed) on a certain region in a space outside the display device. Alternatively, light that has been emitted from the light emitting elements 10e and has passed through the optical path control units 50 is diverged in a space outside the display device. Alternatively, light that has been emitted from the light emitting elements 10e and has passed through the optical path control units 50 is parallel light. Whether light that has passed through the optical path control units 50 is formed into convergent light, divergent light, or parallel light is determined on the basis of specifications required for the display device. Then, it is only required to design the power of the optical path control unit 50 and the like on the basis of the specifications. In a case where light that has passed through the optical path control units 50 is convergent light, the position of the space in which an image emitted from the display device is formed may be present or absent on a normal of the reference point P, and depends on specifications required for the display device. In order to control display dimensions, display positions, and the like of an image emitted from the display device, an optical system through which the image emitted from the display device passes may be disposed. The type of optical system to be disposed also depends on specifications required for the display device, but for example, an imaging lens system may be disposed.

Furthermore, in the display device of Example 5, the reference point P is set, and the plurality of light emitting elements 10e is arranged in a first direction (specifically, an X direction) and a second direction different from the first direction (specifically, a Y direction). In addition, if a distance from the reference point P to the normal LN passing through the center of the light emitting portion 30 is represented by $D_1$, values of distance Do in the first direction (X direction) and the second direction (Y direction) are represented by $D_{0-X}$ and $D_{0-Y}$, respectively, and values of distance $D_1$ in the first direction (X direction) and the second direction (Y direction) are represented by $D_{1-X}$ and $D_{1-Y}$, respectively,

[A] design may be made such that $D_{0-X}$ changes linearly with respect to a change of $D_{1-X}$, and $D_{0-Y}$ changes linearly with respect to a change of $D_{1-Y}$, or

[B] design may be made such that $D_{0-X}$ changes linearly with respect to a change of $D_{1-X}$, and $D_{0-Y}$ changes non-linearly with respect to a change of $D_{1-Y}$, or

[C] design may be made such that $D_{0-X}$ changes non-linearly with respect to a change of $D_{1-X}$, and $D_{0-Y}$ changes linearly with respect to a change of $D_{1-Y}$, or

[D] design may be made such that $D_{0-X}$ changes non-linearly with respect to a change of $D_{1-X}$, and $D_{0-Y}$ changes non-linearly with respect to a change of $D_{1-Y}$.

FIGS. 22A, 22B, 22C, 22D, 23A, 23B, 23C, 23D, 24A, 24B, 24C, 24D, 25A, 25B, 25C, and 25D each schematically illustrate a change of $D_{0-X}$ with respect to a change of $D_{1-X}$ and a change of $D_{0-Y}$ with respect to a change of $D_{1-Y}$. In these drawings, a white arrow indicates a linear change, and a black arrow indicates a non-linear change. Furthermore, a case where an arrow points to the outside of the display panel indicates that light that has passed through the optical path control units 50 is divergent light, and a case where an arrow points to the inside of the display panel indicates that light that has passed through the optical path control units 50 is divergent light or parallel light.

Alternatively, design may be made such that a reference point P is set, and if a distance from the reference point P to the normal LN passing through the center of the light emitting portion 30 is represented by $D_1$, a value of distance Do increases as a value of distance $D_1$ increases.

That is, it is only required to determine changes of $D_{0-X}$ and $D_{0-Y}$ depending on changes of $D_{1-X}$ and $D_{1-Y}$, respectively on the basis of specifications required for the display device.

Figure 20B:
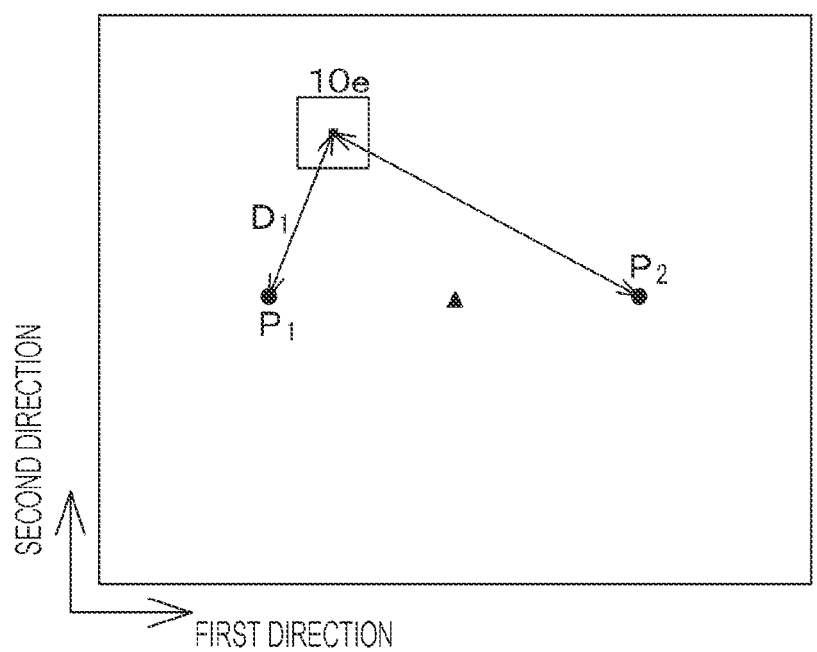

In the display device of Example 5, a plurality of reference points P may be assumed. Note that the plurality of reference points P is located in the display region of the display panel. FIG. 20B schematically illustrates a positional relationship between the light emitting element 10e and reference points $P_1$ and $P_2$, and in the illustrated example, the two reference points $P_1$ and $P_2$ are assumed. Specifically, the two reference points $P_1$ and $P_2$ are located so as to be twice rotationally symmetric with the center of the display panel as a point of symmetry. Here, at least one reference point P is not included in the central region of the display panel. In the illustrated example, the two reference points $P_1$ and $P_2$ are not included in the central region of the display panel. Values of distance $D_0$ are 0 in some of the light emitting elements (specifically, one or more light emitting elements included in the reference point P), and values of distance $D_0$ are not 0 in the remaining light emitting elements. Regarding the distance $D_1$ from the reference point P to the normal LN passing through the center of the light emitting portion 30, a distance from the normal LN passing through the center of a certain light emitting portion 30 to a closer reference point P is defined as the distance $D_1$.

Figure 21A:
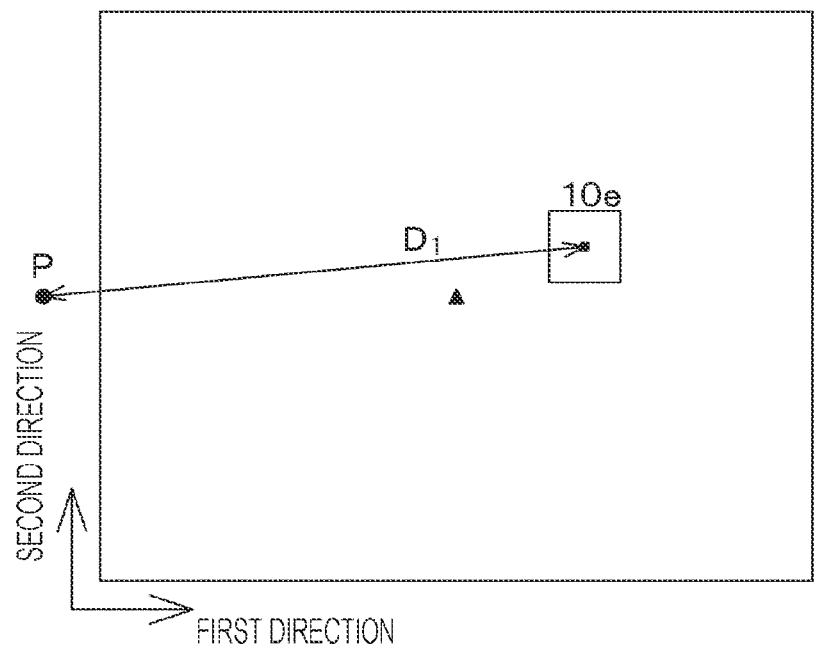
FIGS. 21A and 21B are schematic diagrams illustrating a positional relationship between a light emitting element and a reference point in Modification of the display device of Example 5.
Figure 21B:
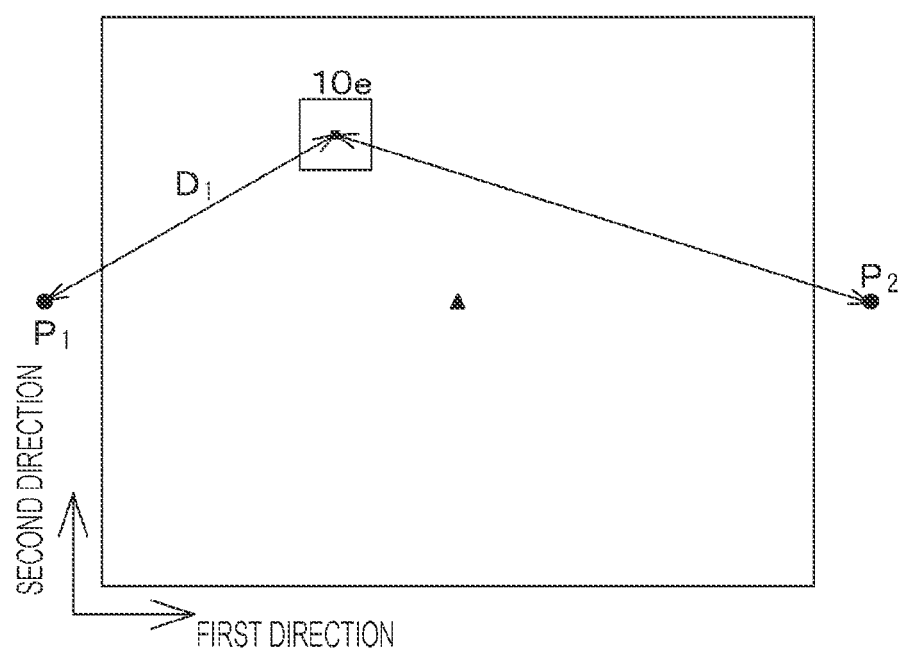
Figure 22A:
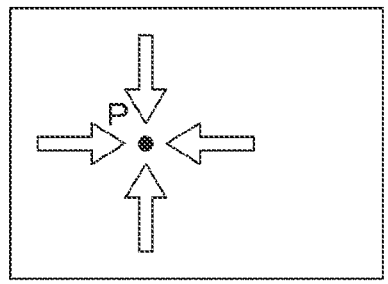
FIGS. 22A, 22B, 22C, and 22D are diagrams schematically illustrating a change of $D_{0\text{-}X}$ with respect to a change of $D_{1\text{-}X}$ and a change of $D_{0\text{-}Y}$ with respect to a change of $D_{1\text{-}Y}$.
Figure 22B:
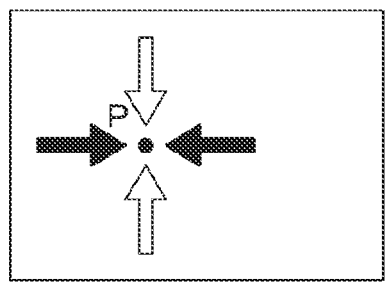
Figure 22C:
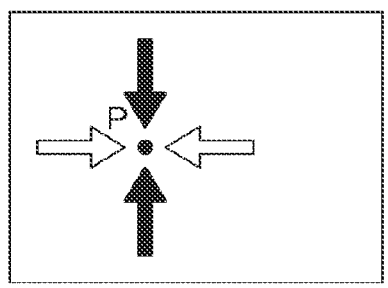
Figure 22D:
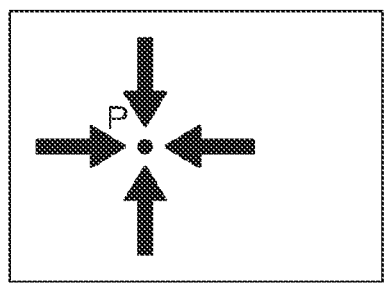
Figure 23A:
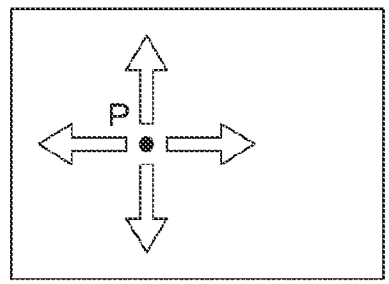
FIGS. 23A, 23B, 23C, and 23D are diagrams schematically illustrating a change of $D_{0\text{-}X}$ with respect to a change of $D_{1\text{-}X}$ and a change of $D_{0\text{-}Y}$ with respect to a change of $D_{1\text{-}Y}$.
Figure 23B:
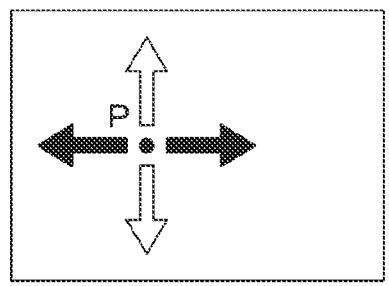
Figure 23C:
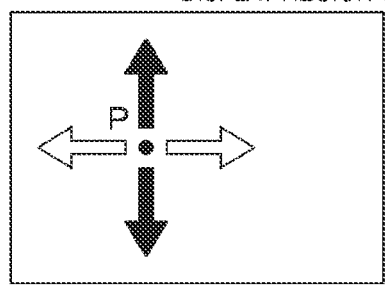
Figure 23D:
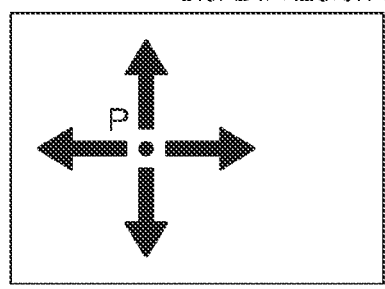
Figure 24A:
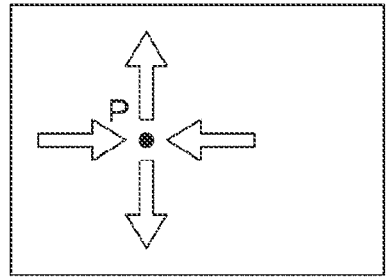
FIGS. 24A, 24B, 24C, and 24D are diagrams schematically illustrating a change of $D_{0\text{-}X}$ with respect to a change of $D_{1\text{-}X}$ and a change of $D_{0\text{-}Y}$ with respect to a change of $D_{1\text{-}Y}$.
Figure 24B:
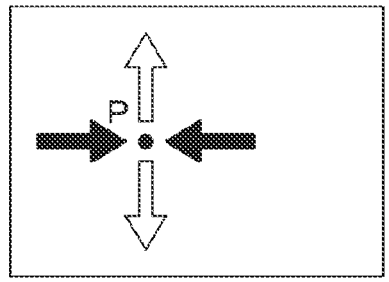
Figure 24C:
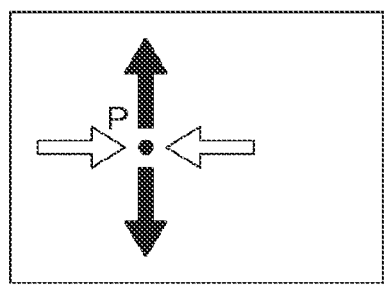
Figure 24D:
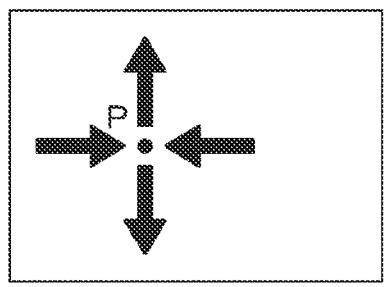
Figure 25A:
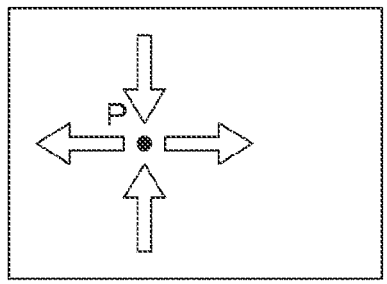
FIGS. 25A, 25B, 25C, and 25D are diagrams schematically illustrating a change of $D_{0\text{-}X}$ with respect to a change of $D_{1\text{-}X}$ and a change of $D_{0\text{-}Y}$ with respect to a change of $D_{1\text{-}Y}$.
Figure 25B:
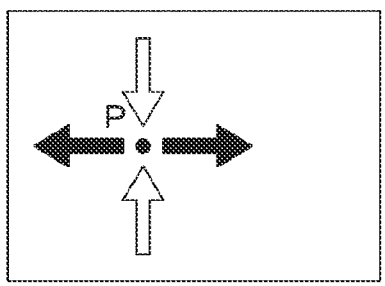
Figure 25C:
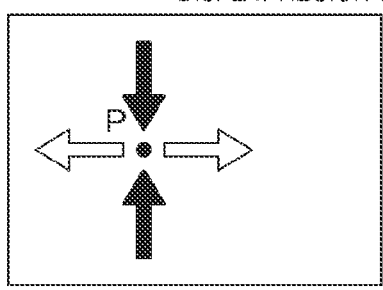
Figure 25D:
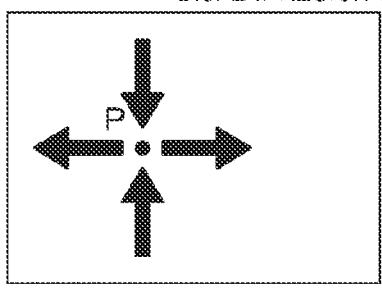

In a display device of Modification of Example 5, the reference point P is assumed to be outside the display panel. FIGS. 21A and 21B each schematically illustrate a positional relationship between the light emitting element 10e and reference points P, $P_1$, and $P_2$. However, one reference point P may be assumed (see FIG. 21A), or a plurality of reference points P (FIG. 21B illustrates two reference points $P_1$ and $P_2$) may be assumed. The two reference points $P_1$ and $P_2$ are located so as to be twice rotationally symmetric with the center of the display panel as a point of symmetry. Values of distance $D_0$ are not 0 in all the light emitting elements. Regarding the distance $D_1$ from the reference point P to the normal LN passing through the center of the light emitting portion 30, a distance from the normal LN passing through the center of a certain light emitting portion 30 to a closer reference point P is defined as the distance $D_1$. In addition, in these cases, light that has been emitted from the light emitting elements 10e and has passed through the optical path control units 50 converges (is condensed) on a certain region in a space outside the display device. Alternatively, light that has been emitted from the light emitting elements 10e and has passed through the optical path control units 50 is diverged in a space outside the display device.

Figure 26A:
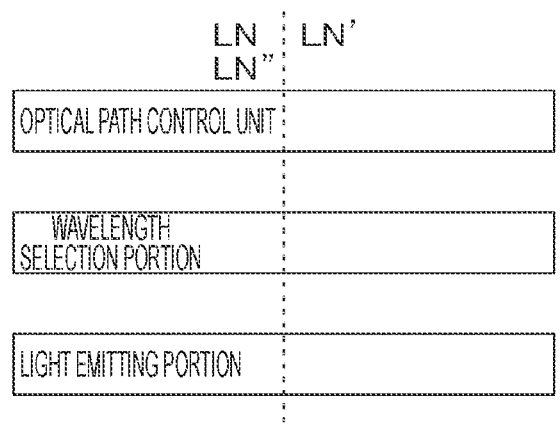
FIGS. 26A, 26B, and 26C are conceptual diagrams for explaining a relationship among a normal LN passing through the center of a light emitting portion, a normal LN' passing through the center of an optical path control unit, and a normal LN" passing through the center of a wavelength selection portion.

As illustrated in FIG. 26A for a conceptual diagram, the normal LN passing through the center of the light emitting portion, the normal LN" passing through the center of the wavelength selection portion, and the normal LN' passing through the center of the optical path control unit 50 may coincide with each other. That is, $D_0=d_0=0$ is satisfied. Note that as described above, do is a distance (offset amount) between the normal LN passing through the center of the light emitting portion and the normal LN" passing through the center of the wavelength selection portion.

Figure 26B:
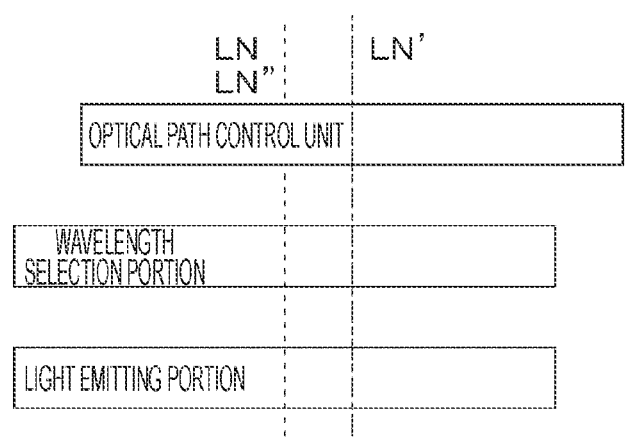
Figure 26C:
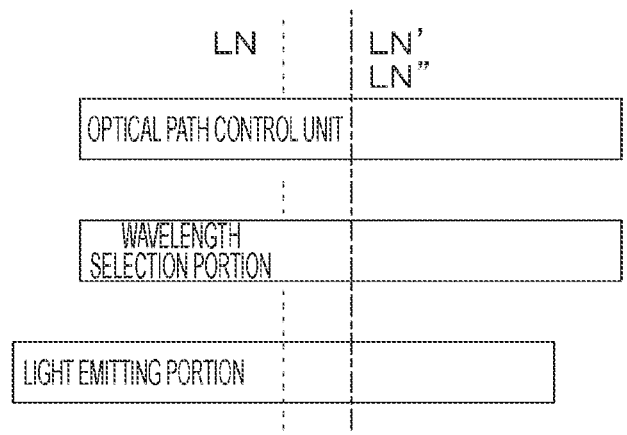

Furthermore, in the example illustrated in FIG. 9, as illustrated in FIG. 26B for a conceptual diagram, the normal LN passing through the center of the light emitting portion coincides with the normal LN" passing through the center of the wavelength selection portion, but the normal LN passing through the center of the light emitting portion and the normal LN" passing through the center of the wavelength selection portion do not coincide with the normal LN' passing through the center of the optical path control unit 50. That is, $D_0 \neq d_0=0$ is satisfied Moreover, as illustrated in FIG. 26C for a conceptual diagram, the normal LN passing through the center of the light emitting portion does not coincide with the normal LN" passing through the center of the wavelength selection portion and the normal LN' passing through the center of the optical path control unit 50, and the normal LN" passing through the center of the wavelength selection portion may coincide with the normal LN' passing through the center of the optical path control unit 50. That is, $D_0=d_0>0$ is satisfied.

Figure 27:
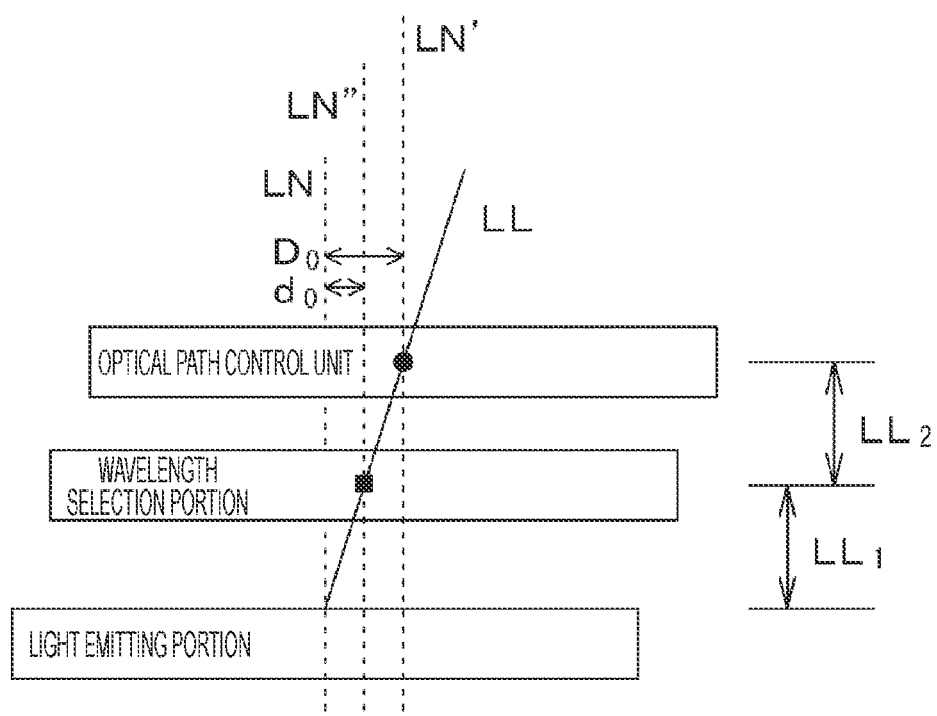
FIG. 27 is a conceptual diagram for explaining a relationship among a normal LN passing through the center of a light emitting portion, a normal LN' passing through the center of an optical path control unit, and a normal LN" passing through the center of a wavelength selection portion.

Furthermore, as illustrated in FIG. 27 for a conceptual diagram, the normal LN passing through the center of the light emitting portion does not coincide with the normal LN" passing through the center of the wavelength selection portion and the normal LN' passing through the center of the optical path control unit 50, and the normal LN' passing through the center of the optical path control unit 50 does not necessarily coincide with the normal LN passing through the center of the light emitting portion and the normal LN" passing through the center of the wavelength selection portion. Here, the center of the wavelength selection portion (indicated by a black square in FIG. 27) is preferably located on a straight line LL connecting the center of the light emitting portion and the center of the optical path control unit 50 (indicated by a black circle in FIG. 27). Specifically, if a distance from the center of the light emitting portion in the thickness direction to the center of the wavelength selection portion is represented by $LL_1$, and a distance from the center of the wavelength selection portion in the thickness direction to the center of the optical path control unit 50 is represented by $LL_2$, $$D_0 > d_0 > 0$$

is satisfied, and in consideration of manufacturing variations, $$d_0 : D_0 = LL_1 : (LL_1 + LL_2)$$

is preferably satisfied.

Figure 28A:
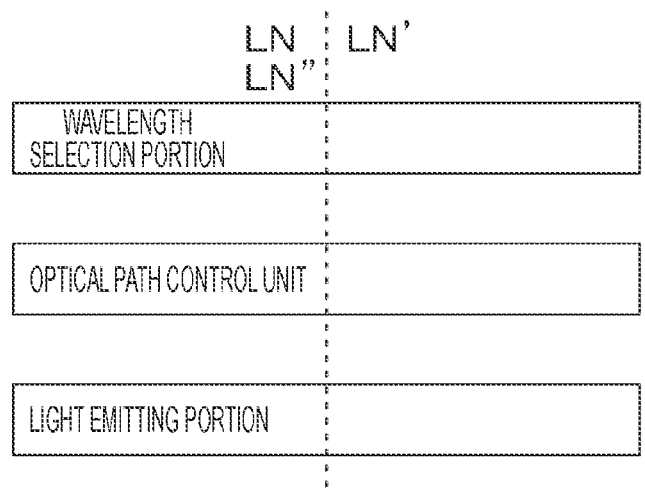
FIGS. 28A and 28B are conceptual diagrams for explaining a relationship among a normal LN passing through the center of a light emitting portion, a normal LN' passing through the center of an optical path control unit, and a normal LN" passing through the center of a wavelength selection portion.

Alternatively, as illustrated in FIG. 28A for a conceptual diagram, the normal LN passing through the center of the light emitting portion, the normal LN" passing through the center of the wavelength selection portion, and the normal LN' passing through the center of the optical path control unit 50 may coincide with each other. That is, $D_0=d_0=0$ is satisfied.

Figure 28B:
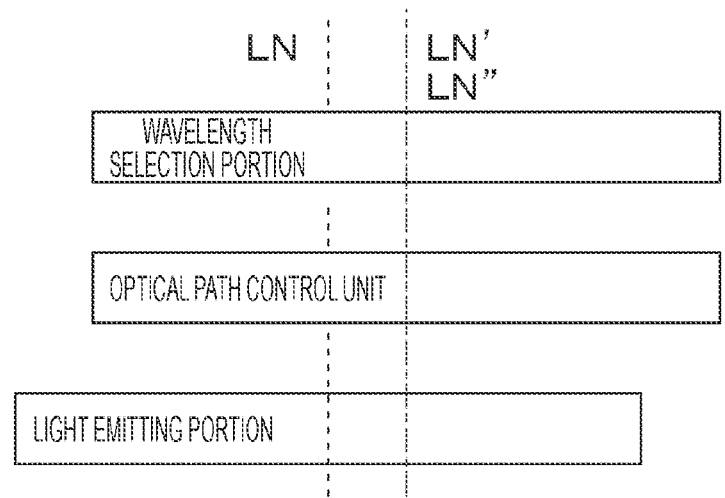
Figure 29:
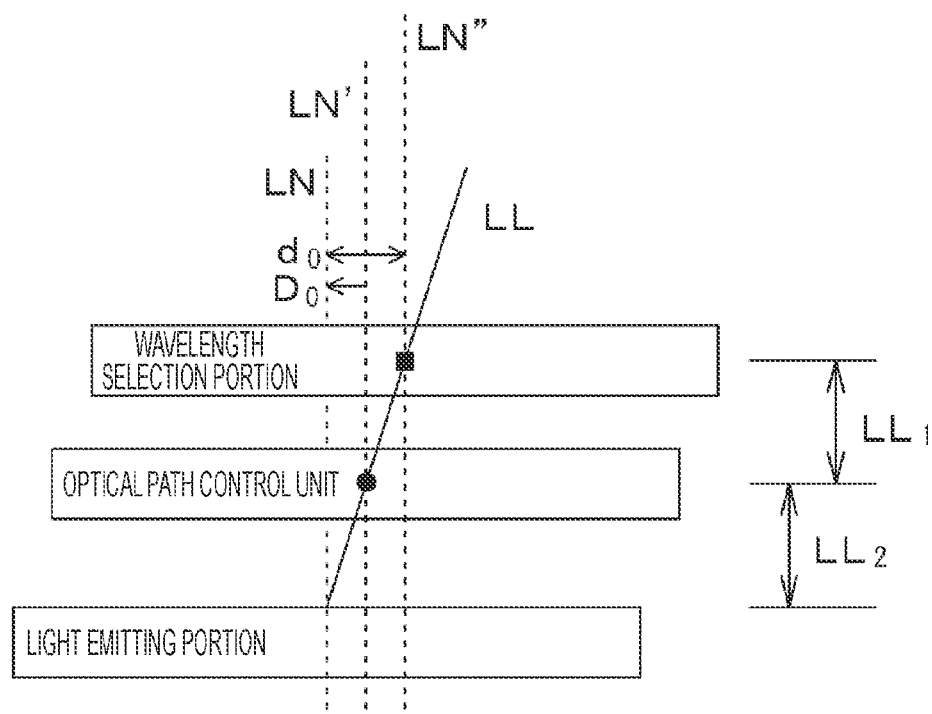
FIG. 29 is a conceptual diagram for explaining a relationship among a normal LN passing through the center of a light emitting portion, a normal LN' passing through the center of an optical path control unit, and a normal LN" passing through the center of a wavelength selection portion.

Furthermore, as illustrated in FIG. 28B for a conceptual diagram, the normal LN passing through the center of the light emitting portion does not coincide with the normal LN"

passing through the center of the wavelength selection portion and the normal LN' passing through the center of the optical path control unit 50, and the normal LN" passing through the center of the wavelength selection portion may coincide with the normal LN' passing through the center of the optical path control unit 50. That is, $D_0=d_0>0$ is satisfied Moreover, as illustrated in FIG. 29 for a conceptual diagram, the normal LN passing through the center of the light emitting portion does not coincide with the normal LN" passing through the center of the wavelength selection portion and the normal LN' passing through the center of the optical path control unit 50, and the normal LN' passing through the center of the optical path control unit 50 does not necessarily coincide with the normal LN passing through the center of the light emitting portion and the normal LN" passing through the center of the wavelength selection portion. Here, the center of the wavelength selection portion is preferably located on a straight line LL connecting the center of the light emitting portion and the center of the optical path control unit 50. Specifically, if a distance from the center of the light emitting portion in the thickness direction to the center of the wavelength selection portion (indicated by a black square in FIG. 29) is represented by $LL_1$, and a distance from the center of the wavelength selection portion in the thickness direction to the center of the optical path control unit 50 (indicated by a black circle in FIG. 29) is represented by $LL_2$, $$d_0>D_0>0$$

is satisfied, and in consideration of manufacturing variations, $$D_0:d_0=LL_2:(LL_1+LL_2)$$

is preferably satisfied.

In a case where a resonator structure is disposed, as described above, a resonator structure may be formed in which the organic layer 33 is used as a resonance portion sandwiched between the first electrode 31 and the second electrode 32, or a resonator structure may be formed in which a light reflecting layer 40 is formed below the first electrode 31 (on the first substrate 11 side), and the organic layer 33 is used as a resonance portion sandwiched between the light reflecting layer 40 and the second electrode 32. That is, in a case where the light reflecting layer 40 is disposed on the base body 26, an interlayer insulating layer 41 is disposed on the light reflecting layer 40, and the first electrode 31 is disposed on the interlayer insulating layer 41, it is only required to constitute the first electrode 31, the light reflecting layer 40, and the interlayer insulating layer 41 by the above-described materials. The light reflecting layer 40 may be connected to the contact hole (contact plug) 27, or does not have to be connected thereto.

Figure 32A:
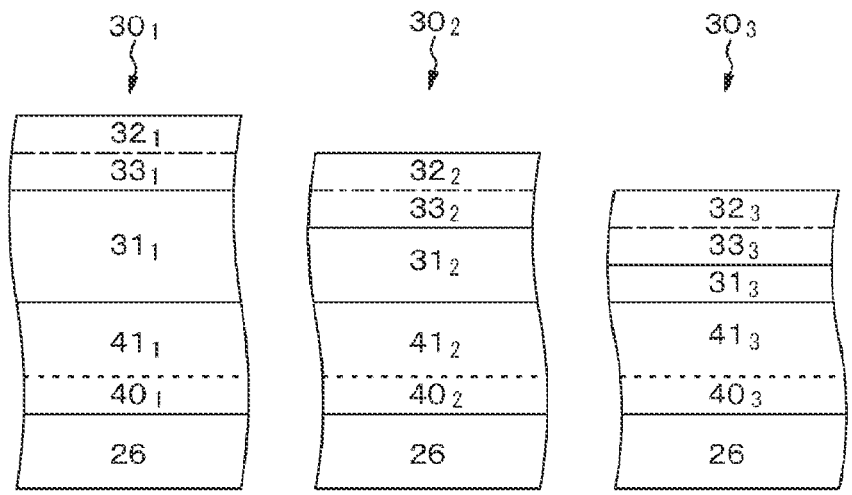
FIGS. 32A and 32B are conceptual diagrams of light emitting elements of a fifth example and a sixth example each having a resonator structure.
Figure 32B:
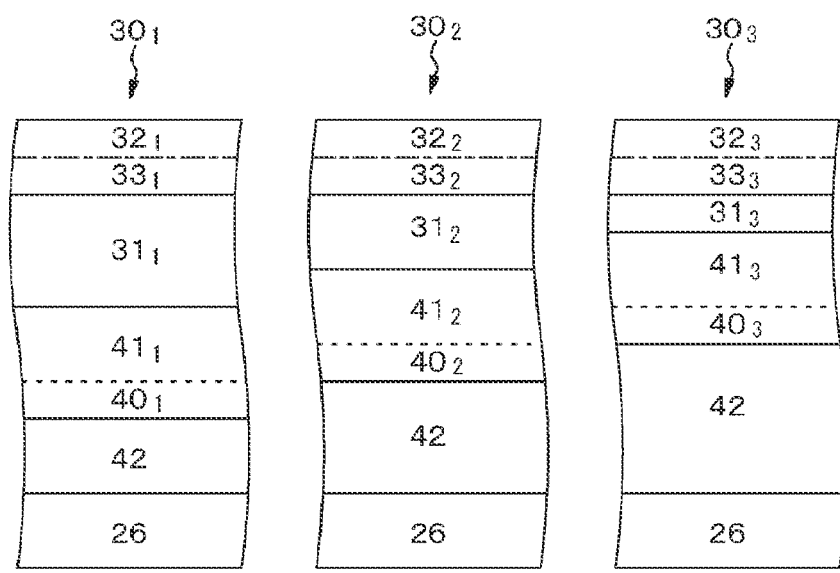
Figure 33A:
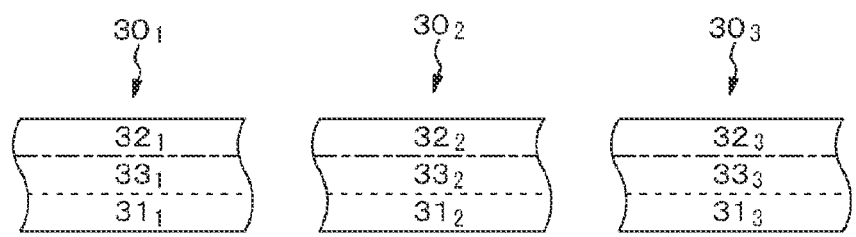
FIG. 33A is a conceptual diagram of a light emitting element of a seventh example having a resonator structure.
Figure 33B:
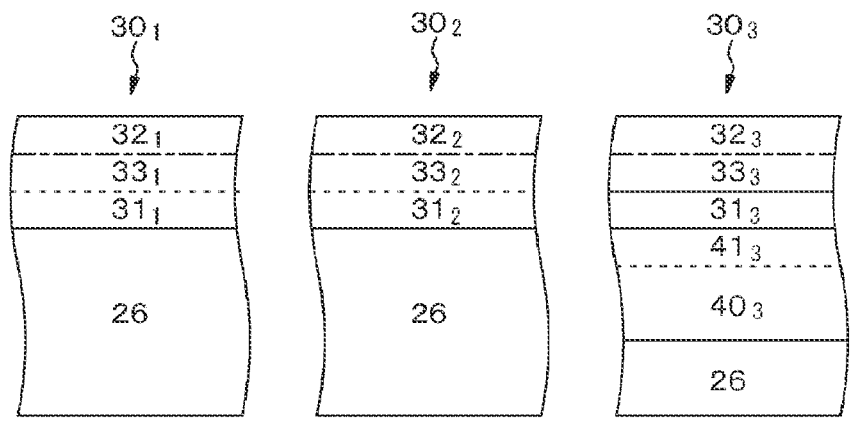
FIGS. 33B and 33C are conceptual diagrams of a light emitting element of an eighth example having a resonator structure.
Figure 33C:
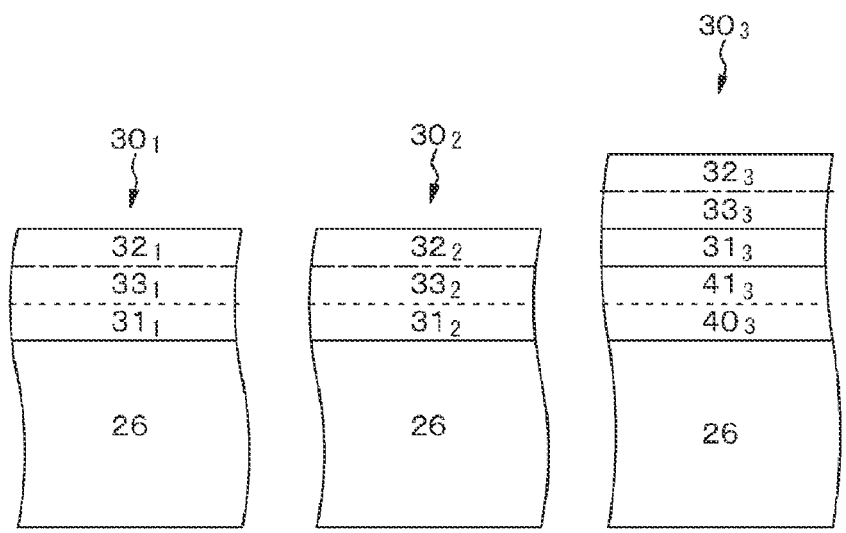

Hereinafter, the resonator structure will be described on the basis of first to eighth examples with reference to FIG. 30A (first example), FIG. 30B (second example), FIG. 31A (third example), FIG. 31B (fourth example), FIG. 32A (fifth example), FIG. 32B (sixth example), FIG. 33A (seventh example), and FIGS. 33B and 33C (eighth example). Here, in the first to fourth and seventh examples, the thickness of a first electrode is the same, and the thickness of a second electrode is the same in light emitting portions. Meanwhile, in the fifth and sixth examples, the thickness of the first electrode is different among the light emitting portions, and the thickness of the second electrode is the same in the light emitting portions. Furthermore, in the eighth example, the thickness of the first electrode may be different among the light emitting portions or may be the same in the light emitting portions, and the thickness of the second electrode is the same in the light emitting portions.

Note that in the following description, light emitting portions constituting a first light emitting element $10e_1$, a second light emitting element $10e_2$, and a third light emitting element $10e_3$ are represented by reference numerals $30_1$, $30_2$, and $30_3$, respectively, a first electrode is represented by reference numeral $31_1$, $31_2$, $31_3$, a second electrode is represented by reference numeral $32_1$, $32_2$, $32_3$, an organic layer is represented by reference numeral $33_1$, $33_2$, $33_3$, a light reflecting layer is represented by reference numeral $40_1$, $40_2$, $40_3$, and an interlayer insulating layer is represented by reference numeral $41_1$, $41_2$, $41_3$, $41_{1'}$, $41_{2'}$, $41_{3'}$. In the following description, materials used are illustrative and can be changed appropriately.

In the illustrated examples, the resonator lengths of the first light emitting element $10e_1$, the second light emitting element $10e_2$, and the third light emitting element $10e_3$ derived from formulas (1-1) and (1-2) become shorter in order of the first light emitting element $10e_1$, the second light emitting element $10e_2$, and the third light emitting element $10e_3$. That is, a value of $L_0$ becomes shorter in order of the first light emitting element $10e_1$, the second light emitting element $10e_2$, and the third light emitting element $10e_3$. However, the present disclosure is not limited thereto, and it is only required to determine optimum resonator lengths by appropriately setting values of $m_1$ and $m_2$.

Figure 30A:
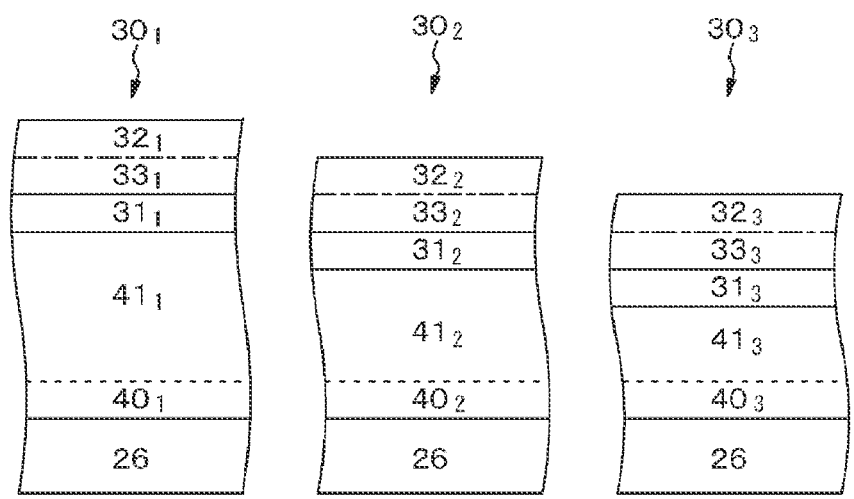
FIGS. 30A and 30B are conceptual diagrams of light emitting elements of a first example and a second example each having a resonator structure.
Figure 30B:
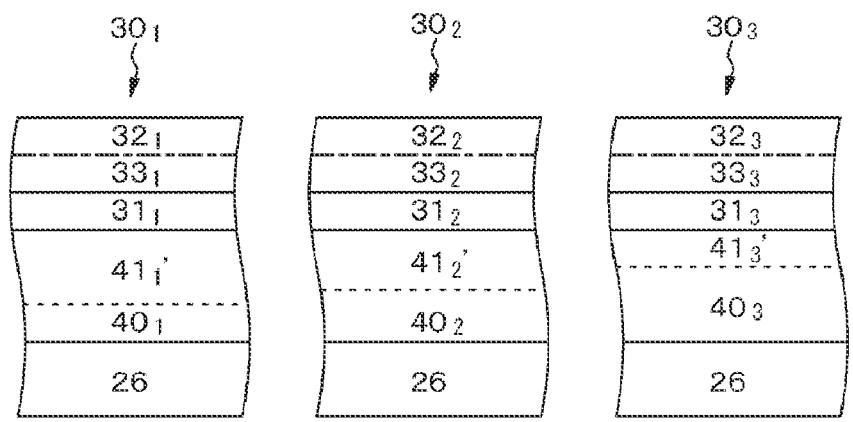
Figure 31A:
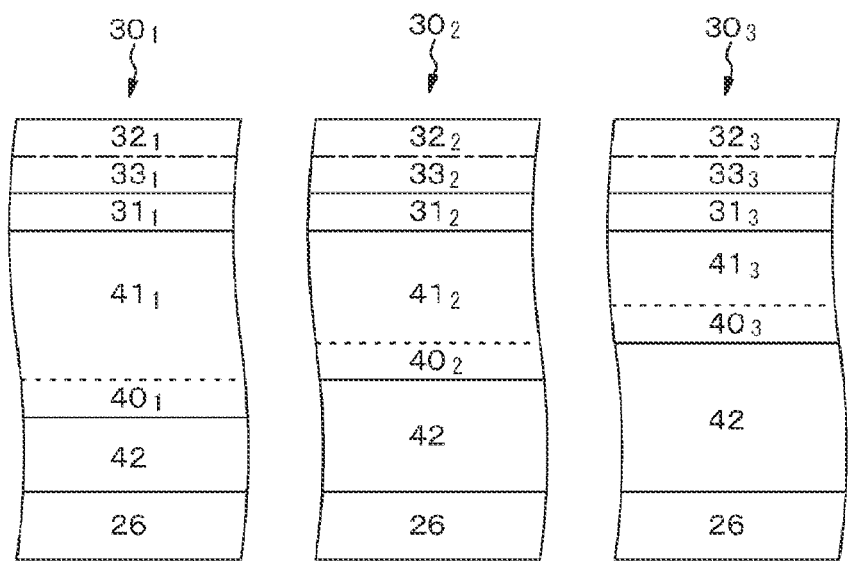
FIGS. 31A and 31B are conceptual diagrams of light emitting elements of a third example and a fourth example each having a resonator structure.
Figure 31B:
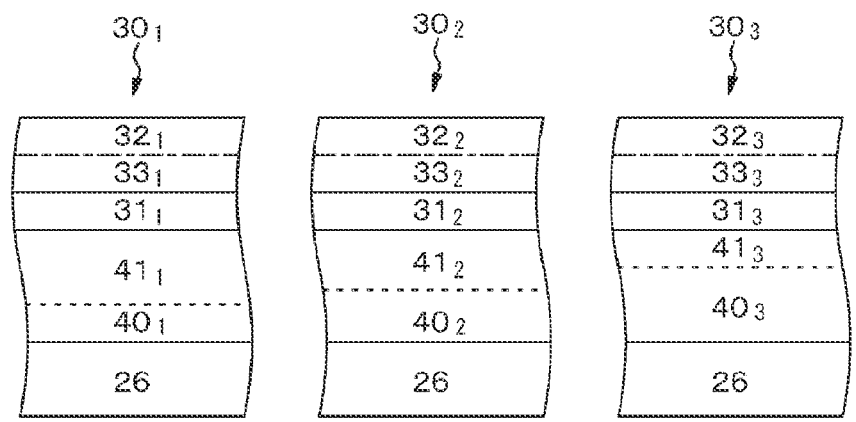

A conceptual diagram of a light emitting element having the first example of the resonator structure is illustrated in FIG. 30A, a conceptual diagram of a light emitting element having the second example of the resonator structure is illustrated in FIG. 30B, a conceptual diagram of a light emitting element having the third example of the resonator structure is illustrated in FIG. 31A, and a conceptual diagram of a light emitting element having the fourth example of the resonator structure is illustrated in FIG. 31B. In some of the first to sixth and eighth examples, the interlayer insulating layer 41, 41' is formed under the first electrode 31 of the light emitting portion 30, and the light reflecting layer 40 is formed under the interlayer insulating layer 41, 41'. In the first to fourth examples, the thickness of the interlayer insulating layer 41, 41' is different among the light emitting portions $30_1$, $30_2$, and $30_3$. In addition, by appropriately setting the thickness of the interlayer insulating layer $41_1$, $41_2$, $41_3$, $41_{1'}$, $41_{2'}$, $41_{3'}$, it is possible to set an optical distance that causes optimum resonance with respect to an emission wavelength of the light emitting portion 30.

In the first example, the level of a first interface (indicated by a dotted line in the drawings) is the same in the light emitting portions $30_1$, $30_2$, and $30_3$, while the level of a second interface (indicated by an alternate long and short dash line in the drawings) is different among the light emitting portions $30_1$, $30_2$, and $30_3$. Furthermore, in the second example, the level of the first interface is different among the light emitting portions $30_1$, $30_2$, and $30_3$, while the level of the second interface is the same in the light emitting portions $30_1$, $30_2$, and $30_3$.

In the second example, the interlayer insulating layer $41_{1'}$, $41_{2'}$, $41_{3'}$ is constituted by an oxide film in which a surface of the light reflecting layer 40 is oxidized. The interlayer insulating layer 41' constituted by an oxide film is constituted by, for example, aluminum oxide, tantalum oxide, titanium oxide, magnesium oxide, zirconium oxide, and the like depending on a material constituting the light reflecting layer 40. Oxidation of the surface of the light reflecting layer 40 can be performed by, for example, the following method. That is, the first substrate 11 on which the light reflecting layer 40 is formed is immersed in an electrolytic solution filled in a container. Furthermore, a cathode is disposed so as to face the light reflecting layer 40. Then, the light reflecting layer 40 is anodized with the light reflecting layer 40 as an anode. The film thickness of the oxide film obtained by anodization is proportional to a potential difference between the light reflecting layer 40, which is an anode, and a cathode. Therefore, the light reflecting layers $40_1$, $40_2$, and $40_3$ are anodized in a state where voltages corresponding to the light emitting portions $30_1$, $30_2$, and $30_3$ are applied to the light reflecting layers $40_1$, $40_2$, and $40_3$, respectively. This makes it possible to collectively form the interlayer insulating layers $41_1'$, $41_2'$, and $41_3'$ constituted by oxide films having different thicknesses on a surface of the light reflecting layer 40. The thickness of the light reflecting layer $40_1$, $40_2$, $40_3$ and the thickness of the interlayer insulating layer $41_1'$, $41_2'$, $41_3'$ are different among the light emitting portions $30_1$, $30_2$, and $30_3$.

In the third example, a base film 42 is disposed under the light reflecting layer 40, and the thickness of the base film 42 is different among the light emitting portions $30_1$, $30_2$, and $30_3$. That is, in the illustrated example, the thickness of the base film 42 becomes thicker in order of the light emitting portion $30_1$, the light emitting portion $30_2$, and the light emitting portion $30_3$.

In the fourth example, the thickness of the light reflecting layer $40_1$, $40_2$, $40_3$ at the time of film formation is different among the light emitting portions $30_1$, $30_2$, and $30_3$. In the third and fourth examples, the level of the second interface is the same in the light emitting portions $30_1$, $30_2$, and $30_3$, while the level of the first interface is different among the light emitting portions $30_1$, $30_2$, and $30_3$.

In the fifth and sixth examples, the thickness of the first electrode $31_1$, $31_2$, $31_3$ is different among the light emitting portions $30_1$, $30_2$, and $30_3$. The thickness of the light reflecting layer 40 is the same in the light emitting portions 30.

In the fifth example, the level of the first interface is the same in the light emitting portions $30_1$, $30_2$, and $30_3$, while the level of the second interface is different among the light emitting portions $30_1$, $30_2$, and $30_3$.

In the sixth example, the base film 42 is disposed under the light reflecting layer 40, and the thickness of the base film 42 is different among the light emitting portions $30_1$, $30_2$, and $30_3$. That is, in the illustrated example, the thickness of the base film 42 becomes thicker in order of the light emitting portion $30_1$, the light emitting portion $30_2$, and the light emitting portion $30_3$. In the sixth example, the level of the second interface is the same in the light emitting portions $30_1$, $30_2$, and $30_3$, while the level of the first interface is different among the light emitting portions $30_1$, $30_2$, and $30_3$.

In the seventh example, the first electrode $31_1$, $31_2$, $31_3$ also serves as a light reflecting layer, and the optical constant (specifically, phase shift amount) of a material constituting the first electrode $31_1$, $31_2$, $31_3$ is different among the light emitting portions $30_1$, $30_2$, and $30_3$. For example, it is only required to constitute the first electrode $31_1$ of the light emitting portion $30_1$ by copper (Cu), and it is only required to constitute the first electrode $31_2$ of the light emitting portion $30_2$ and the first electrode $31_3$ of the light emitting portion $30_3$ by aluminum (Al).

Furthermore, in the eighth example, the first electrode $31_1$, $31_2$ also serves as a light reflecting layer, and the optical constant (specifically, phase shift amount) of a material constituting the first electrode $31_1$, $31_2$ is different among the light emitting portions $30_1$ and $30_2$. For example, it is only required to constitute the first electrode $31_1$ of the light emitting portion $30_1$ by copper (Cu), and it is only required to constitute the first electrode $31_2$ of the light emitting portion $30_2$ and the first electrode $31_3$ of the light emitting portion $30_3$ by aluminum (Al). In the eighth example, for example, the seventh example is applied to the light emitting portions $30_1$ and $30_2$, and the first example is applied to the light emitting portion $30_3$. The thicknesses of the first electrodes $31_1$, $31_2$, and $31_3$ may be different from or the same as each other.

Hitherto, the present disclosure has been described on the basis of the preferable Examples. However, the present disclosure is not limited to these Examples. The configurations and structures of the display device (organic EL display device) and the light emitting element (organic EL element) described in Examples are illustrative and can be changed appropriately. The method for manufacturing the display device is also illustrative and can be changed appropriately. In some cases, in the light emitting element of second configuration or the light emitting element of fourth configuration, the optical path control unit may be disposed on the second substrate side, and the first substrate and the second substrate may be bonded to each other. In Examples, the light emitting element driving unit is constituted by MOSFET, but can be also constituted by TFT. The first electrode and the second electrode may each have a single layer structure or a multilayer structure.

Figure 10:
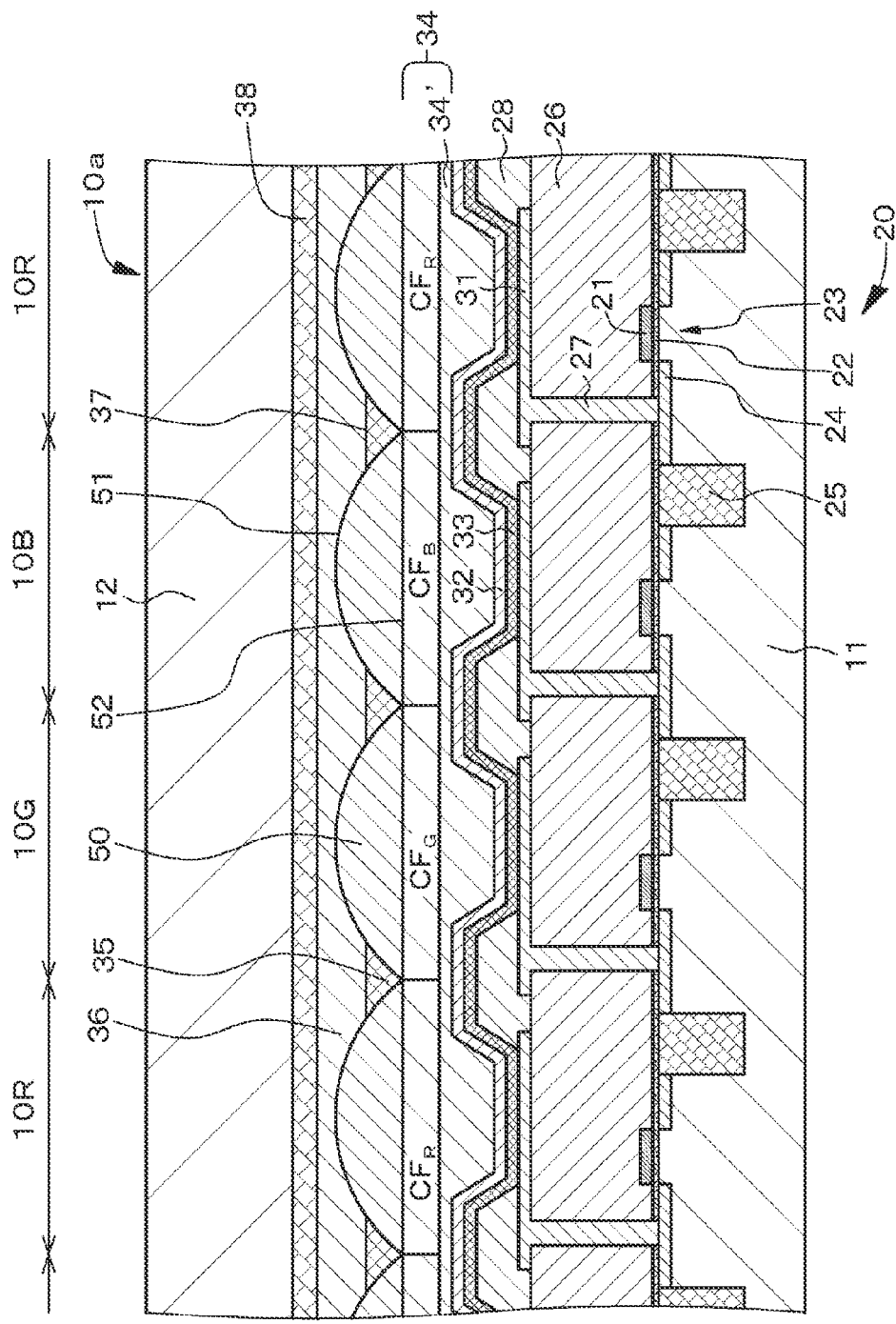
FIG. 10 is a schematic partial cross-sectional view of Modification-1 of the display device of Example 1.
Figure 11:
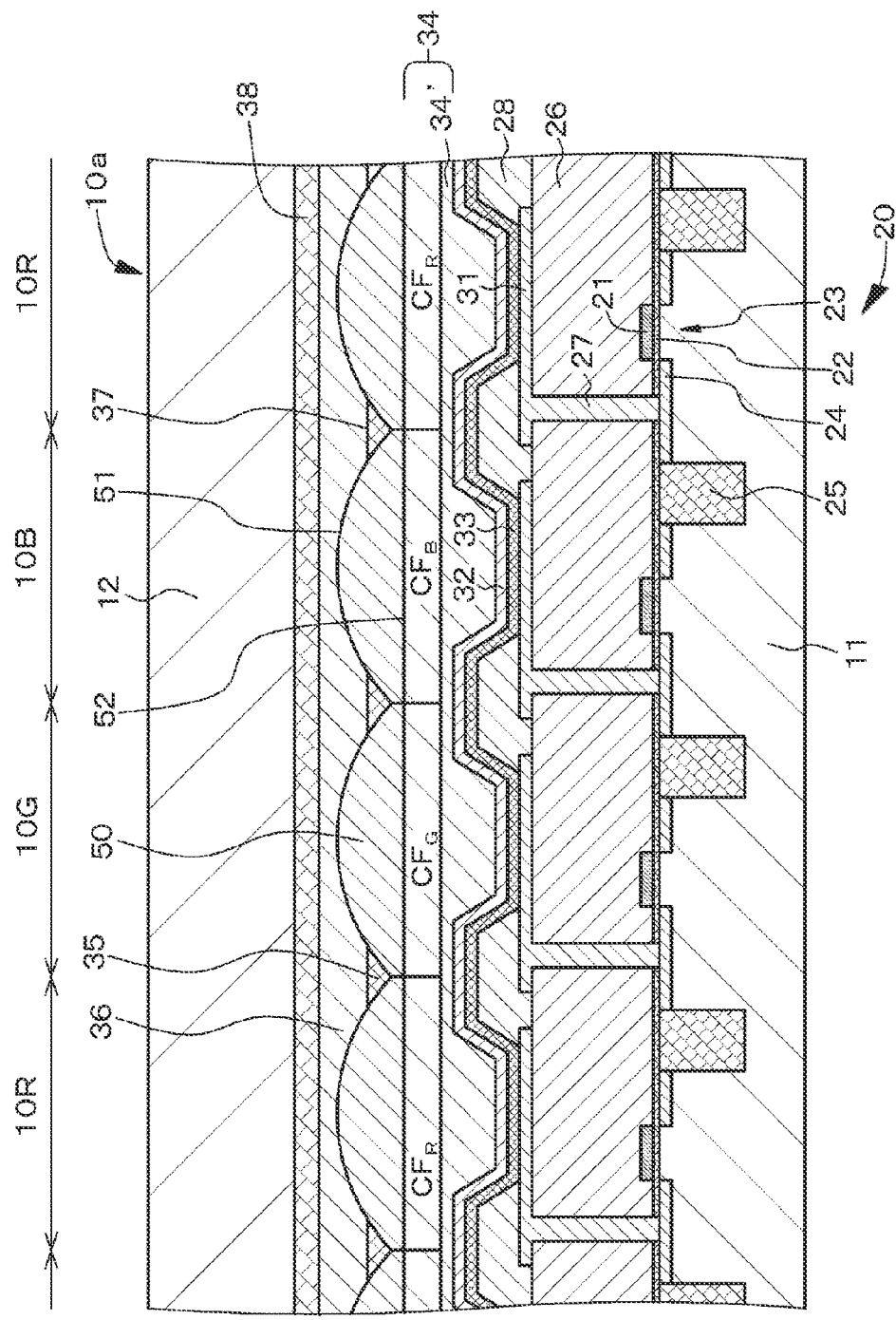
FIG. 11 is a schematic partial cross-sectional view of Modification-2 of the display device of Example 1.

As Modification-1 of Example 1, as illustrated in FIG. 10 for a schematic partial cross-sectional view, an optical path control unit and an optical path control unit constituting adjacent light emitting elements may be in contact with each other. In some cases, as Modification 2 of Example 1, as illustrated in FIG. 11 for a schematic partial cross-sectional view, an optical path control unit and an optical path control unit constituting adjacent light emitting elements may overlap each other.

Figure 12:
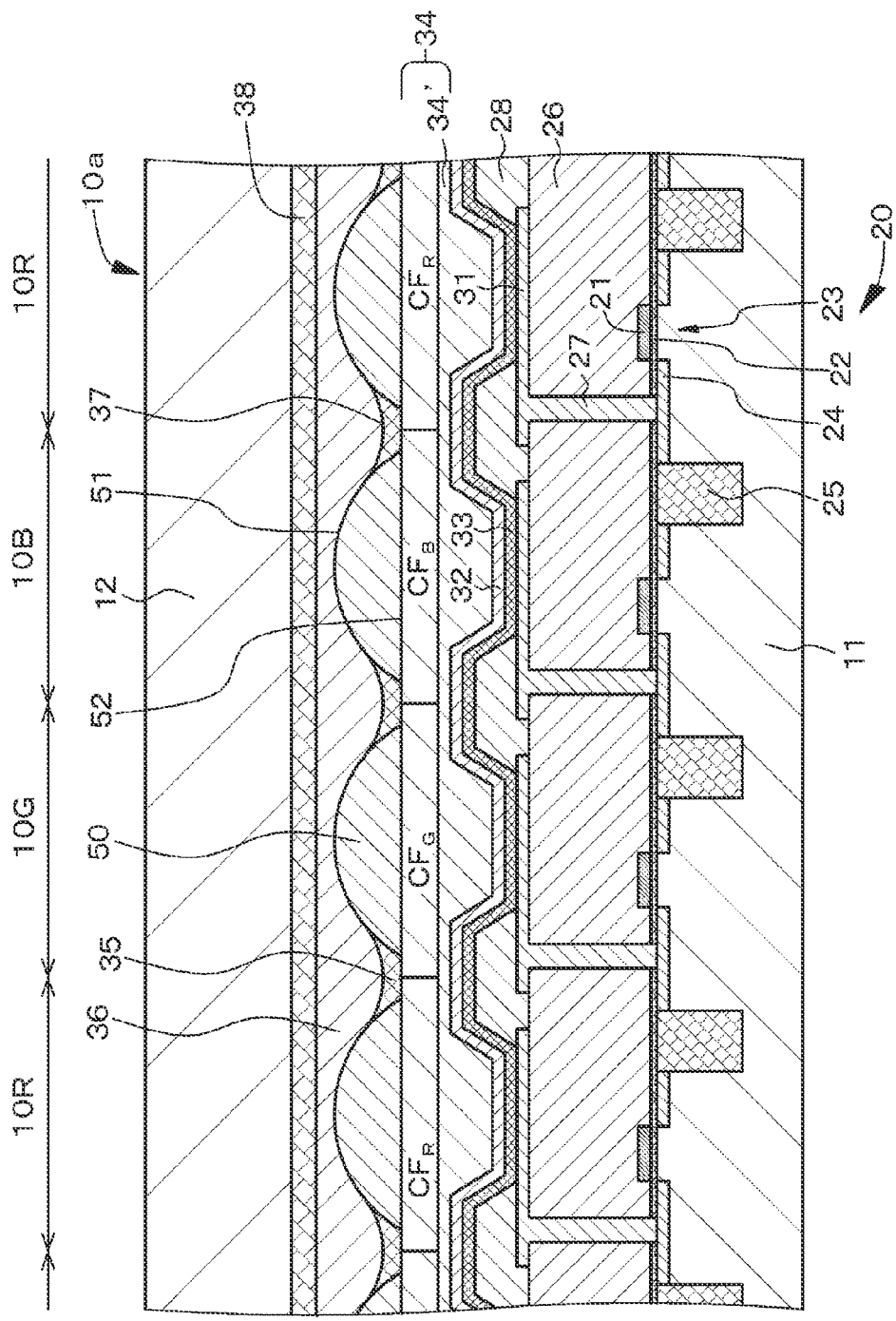
FIG. 12 is a schematic partial cross-sectional view of Modification-3 of the display device of Example 1.

In Examples, the form in which the top surface (interface 37 between the first coating layer 35 and the second coating layer 36) of the first coating layer 35 is flat has been described. However, depending on a material constituting the first coating layer 35 or a method for forming the first coating layer 35, as illustrated in FIG. 12 for a schematic partial cross-sectional view of Modification-3 of Example 1, the top surface (interface 37) of the first coating layer 35 may be concave toward the intermediate layer 34. In this case, by forming the first coating layer 35 constituted by a hollow silica-containing fluorine-based low refractive index transparent resin in which the amount of a leveling agent added is adjusted on the basis of a spin coating method, and forming the second coating layer 36 constituted by a fluorine-based low refractive index transparent resin on the basis of the spin coating method, it is possible to obtain a state in which the top surface (interface 37) of the first coating layer 35 is concave toward the intermediate layer 34.

Figure 13:
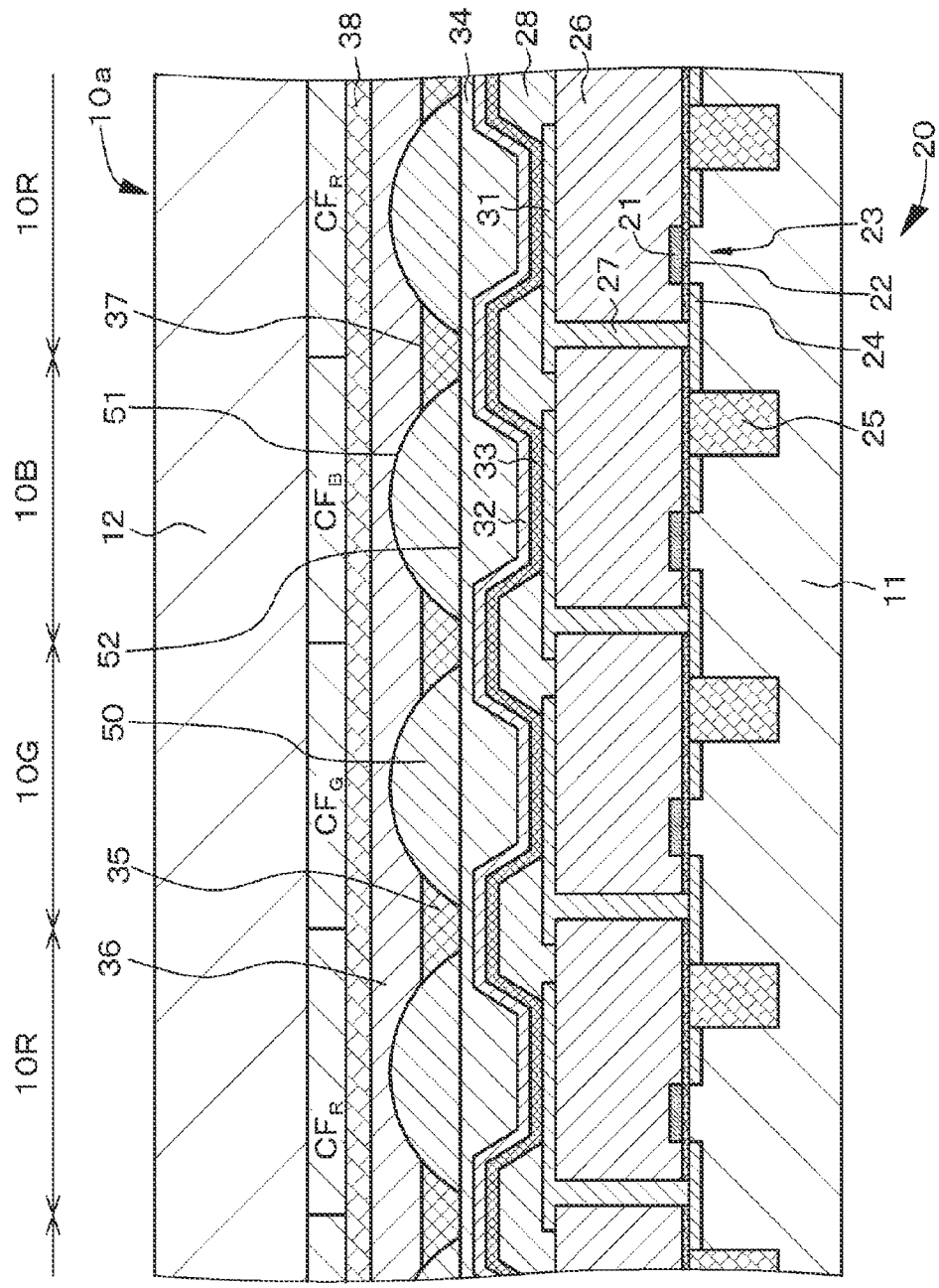
FIG. 13 is a schematic partial cross-sectional view of Modification-4 of the display device of Example 1.

As illustrated in FIG. 13 for a schematic partial cross-sectional view of Modification-4 of Example 1, a color filter layer CF may be formed on a light emitting side of the optical path control unit 50 and the coating layers 35 and 36. The optical path control unit 50 and the first coating layer 35 are formed on the intermediate layer 34.

Figure 14:
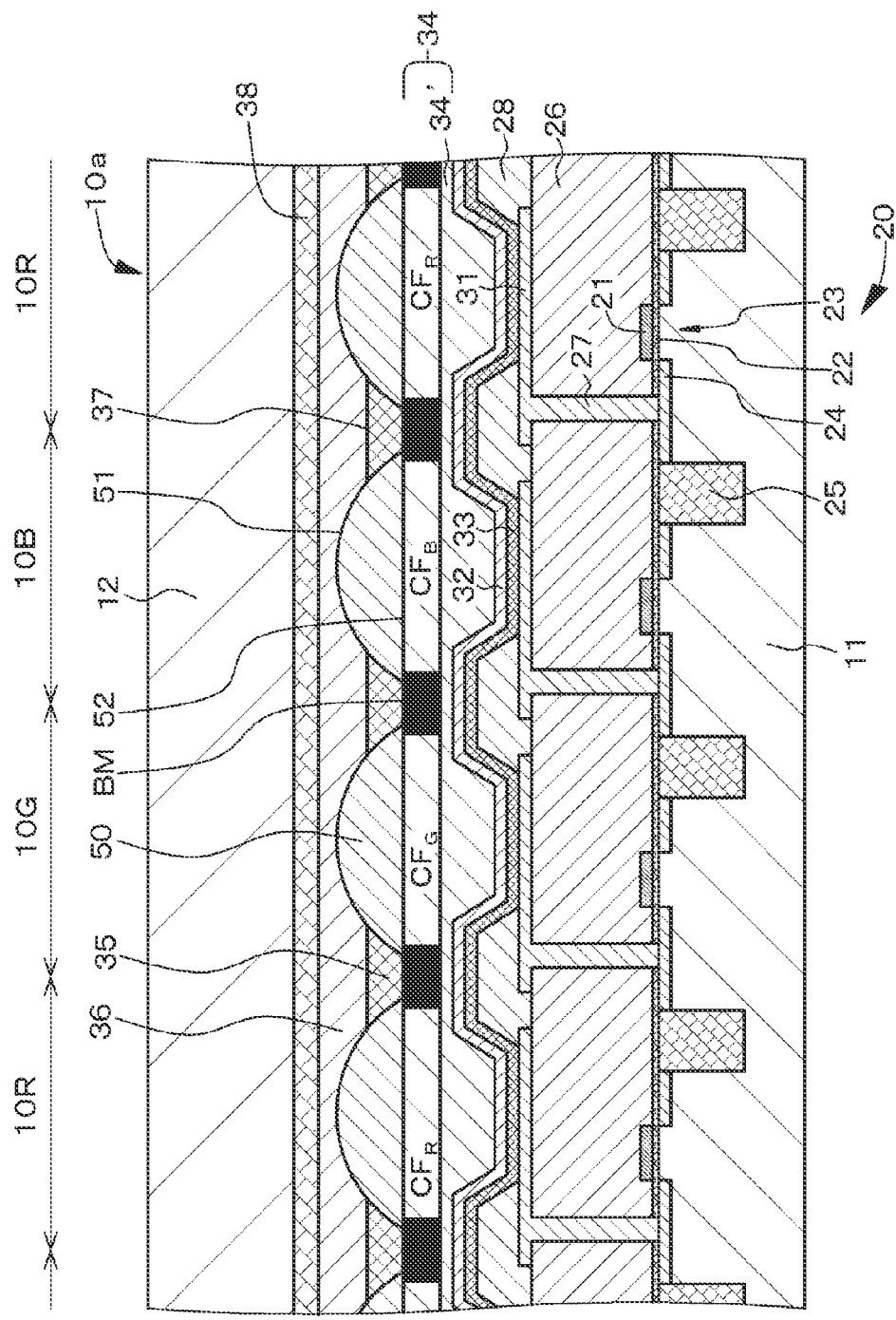
FIG. 14 is a schematic partial cross-sectional view of Modification-5 of the display device of Example 1.
Figure 15:
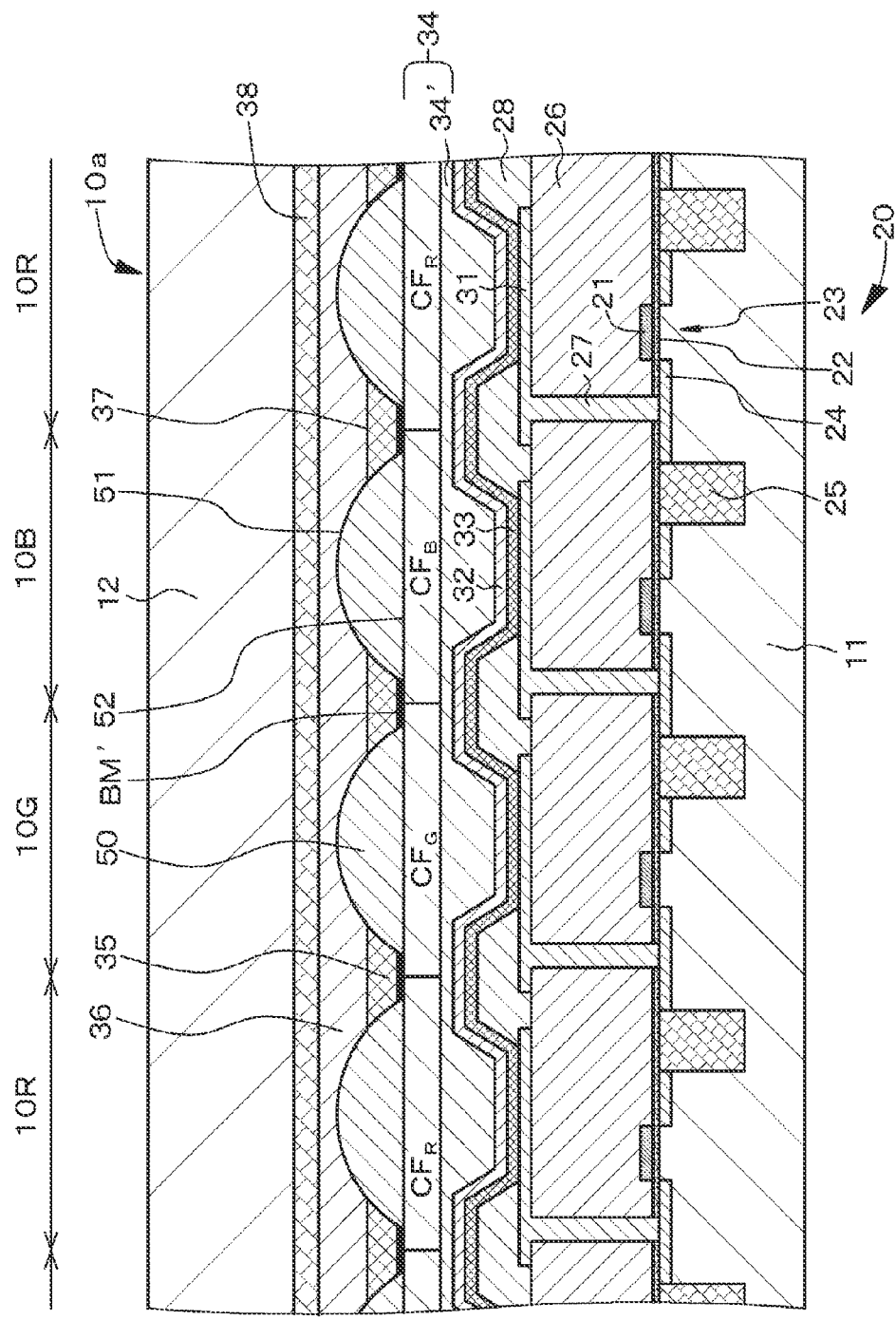
FIG. 15 is a schematic partial cross-sectional view of Modification-6 of the display device of Example 1.

As illustrated in FIG. 14 for a schematic partial cross-sectional view of a light emitting element constituting Modification-5 of the display device of Example 1, a light absorption layer (black matrix layer) BM may be formed between color filter layers CF of adjacent light emitting elements. The black matrix layer BM is constituted by, for example, a black resin film (specifically, for example, a black polyimide-based resin) having an optical density of 1 or more, mixed with a black coloring agent. Furthermore, as illustrated in FIG. 15 for a schematic partial cross-sectional view of a light emitting element constituting Modification-6 of the display device of Example 1, a light absorption layer (black matrix layer) BM' may be formed between the optical path control units 50 of adjacent light emitting elements. Furthermore, Modification-5 and Modification-6 can be combined with each other.

Modifications described above can also be applied to Examples 2 to 4.

Figure 16:
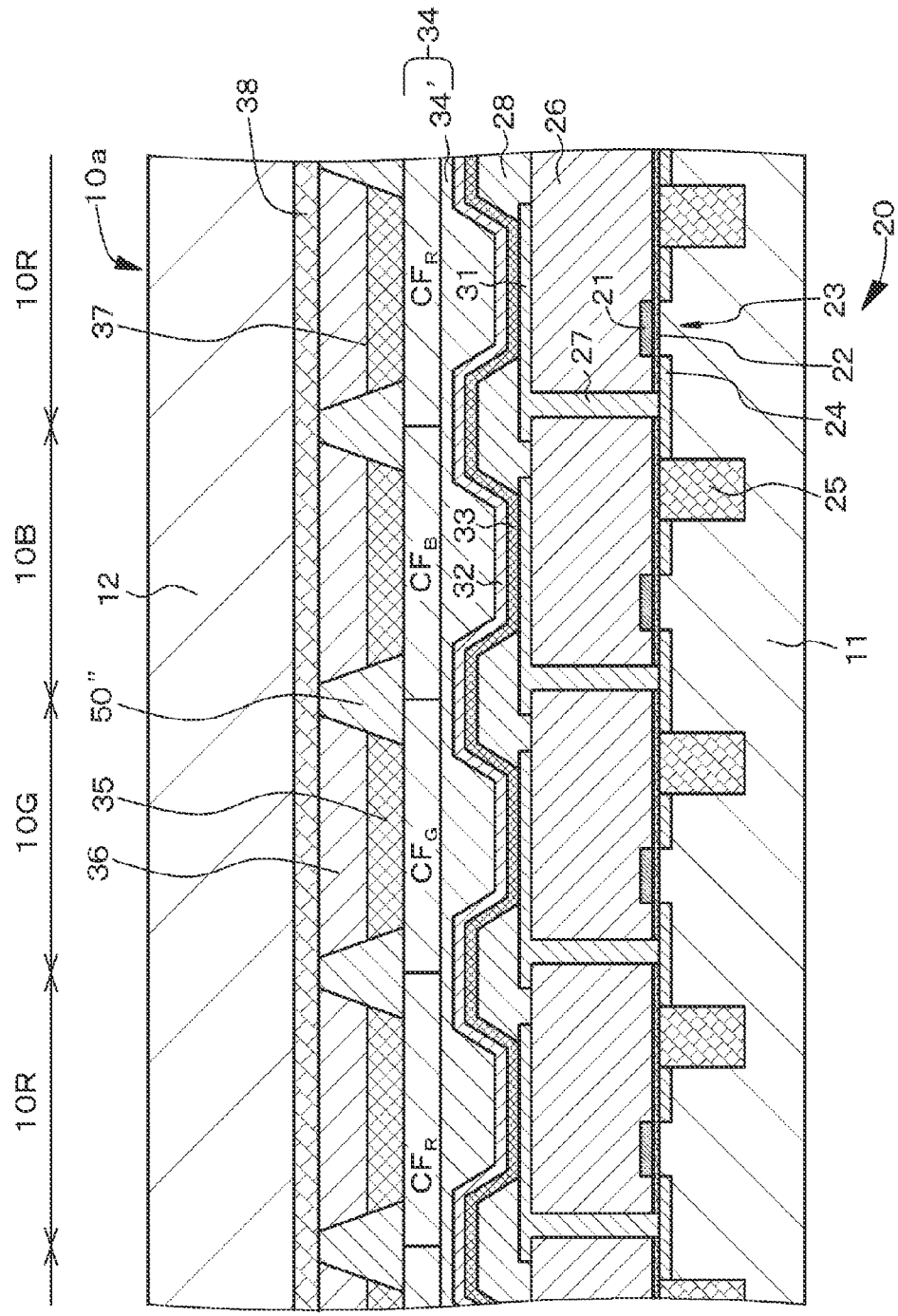
FIG. 16 is a schematic partial cross-sectional view of a display device in which an optical path control unit is constituted by a light reflecting member.

As illustrated in FIG. 16 for a schematic partial cross-sectional view, the optical path control unit can also be constituted by a light reflecting member 50". Examples of the light reflecting member 50" include a simple metal or an alloy of a metal such as aluminum (Al) or silver (Ag) and a dielectric multilayer film. Alternatively, examples of the light reflecting member 50" include a material having a refractive index $n_3$ that makes light emitted from the light emitting portion 30 totally reflected by the light reflecting member 50" when the light passes through the intermediate layer 34 and the first coating layer 35 or the first coating layer 35 and the second coating layer 36, and collides with the light reflecting member 50" (for example, $SiO_2$ having $n_3=1.52$). Specifically, the light reflecting member 50" constituting the optical path control unit fills a space between the coating layer 35, 36 and the coating layer 35, 36. The light reflecting member 50" has a forward taper shape (a shape extending from a light incident surface side toward a light emitting surface side). A cross section of a forward-tapered slope obtained by cutting the light reflecting member 50" in a virtual plane including an axis of the light reflecting member 50" may be constituted by a curved line or a line segment as illustrated in FIG. 16.

In Examples, one optical path control unit is disposed for one light emitting portion, but in some cases, one optical path control unit may be shared by a plurality of light emitting elements. For example, a light emitting element may be disposed at each of vertices of an equilateral triangle (three light emitting elements are disposed in total), and one optical path control unit may be shared by these three light emitting elements. Alternatively, a light emitting element may be disposed at each of vertices of a rectangle (four light emitting elements are disposed in total), and one optical path control unit may be shared by these four light emitting elements. Alternatively, a plurality of optical path control units may be disposed for one light emitting portion.

A light shielding portion may be disposed between a light emitting element and a light emitting element in order to prevent light emitted from a certain light emitting element from entering a light emitting element adjacent to the certain light emitting element to cause optical crosstalk. That is, a groove may be formed between a light emitting element and a light emitting element, and the groove may be filled with a light shielding material to form the light shielding portion. By disposing the light shielding portion in this way, it is possible to reduce a ratio at which light emitted from a certain light emitting element enters an adjacent light emitting element, and to suppress occurrence of a phenomenon that color mixing occurs and chromaticity of the entire pixels is shifted from desired chromaticity. In addition, color mixing can be prevented. Therefore, color purity increases when monochromatic light is emitted from a pixel, and a chromaticity point is deep. Therefore, a color gamut is widened, and a range of color expression of the display device is widened. Furthermore, a color filter layer is disposed for each pixel in order to improve color purity. In some configurations of the light emitting element, it is possible to reduce the film thickness of the color filter layer or to omit the color filter layer, and it is possible to extract light absorbed by the color filter layer. As a result, this leads to improvement of luminous efficiency. Alternatively, a light shielding property may be imparted to the light absorption layer (black matrix layer).

Figure 19A:
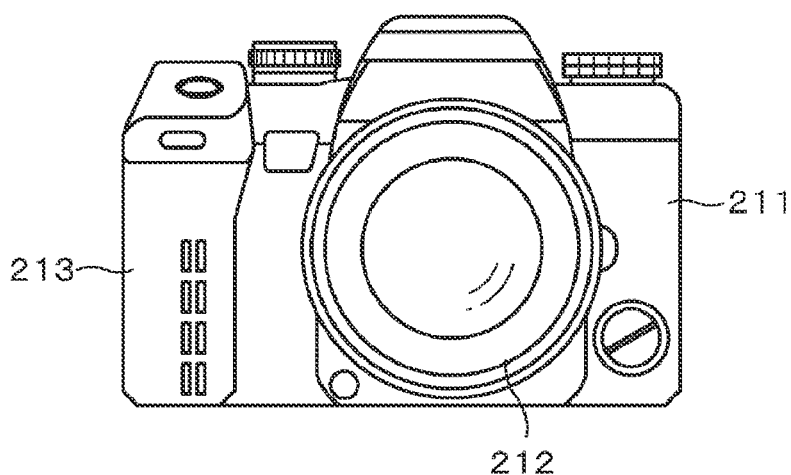
FIGS. 19A and 19B illustrate an example in which the display device of the present disclosure is applied to a lens interchangeable mirrorless type digital still camera.
Figure 19B:
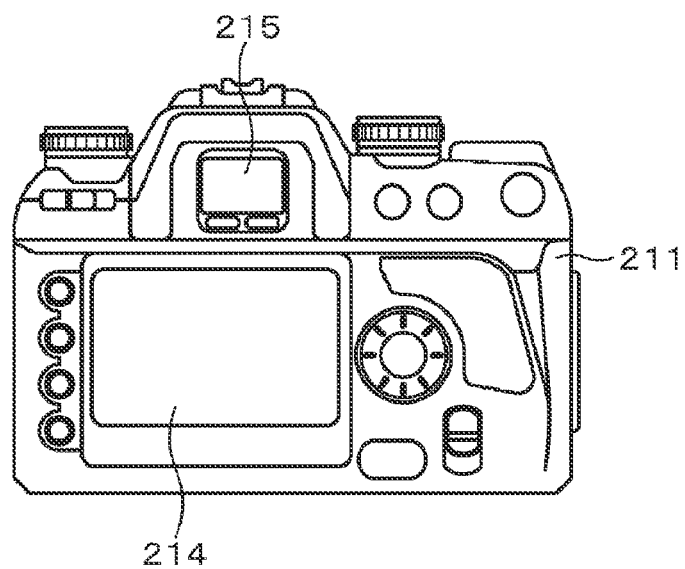

The display device of the present disclosure can be applied to a lens interchangeable mirrorless type digital still camera. FIG. 19A illustrates a front view of the digital still camera, and FIG. 19B illustrates a rear view thereof. This lens interchangeable mirrorless type digital still camera has, for example, an interchangeable imaging lens unit (interchangeable lens) 212 on the front right side of a camera body 211, and has a grip portion 213 to be gripped by an imaging person on the front left side thereof. In addition, a monitor device 214 is disposed at substantially the center of a rear surface of the camera body 211. An electronic viewfinder (eyepiece window) 215 is disposed above a monitor device 214. By looking through the electronic viewfinder 215, an imaging person can visually confirm a light image of a subject guided from the imaging lens unit 212 and determine a composition. In the lens interchangeable mirrorless type digital still camera having such a configuration, the display device in the present disclosure can be used as the electronic viewfinder 215.

Note that the present disclosure can have the following configurations.

[A01] <<Light Emitting Element: First Aspect>>

A light emitting element including:

a light emitting portion;

an intermediate layer covering the light emitting portion;

an optical path control unit disposed on or above the intermediate layer; and a coating layer covering at least the optical path control unit, in which light emitted from the light emitting portion passes through the intermediate layer, enters the optical path control unit, and exits from the optical path control unit, the coating layer includes a first coating layer and a second coating layer, the first coating layer covers a part of an outer surface of the optical path control unit on the intermediate layer side, the second coating layer covers the first coating layer and the rest of the outer surface of the optical path control unit, and a value $n_0$ of a refractive index of a material constituting the optical path control unit, a value $n_1$ of a refractive index of a material constituting the first coating layer, and a value $n_2$ of a refractive index of a material constituting the second coating layer are different from each other.

[A02] <<Light Emitting Element of First Configuration>>

The light emitting element according to [A01], in which a light emitting surface of the optical path control unit is convex with respect to a top surface of the intermediate layer.

[A03] The light emitting element according to [A02], in which a light incident surface of the optical path control unit is in contact with the top surface of the intermediate layer.

[A04] The light emitting element according to [A02] or [A03], in which the first coating layer covers a part of the light emitting surface of the optical path control unit on the intermediate layer side, and the second coating layer covers the first coating layer and the rest of the light emitting surface of the optical path control unit.

[A05] The light emitting element according to [A04], in which the first coating layer further covers the intermediate layer.

[A06] The light emitting element according to any one of [A02] to [A05], in which the optical path control unit has a positive optical power.

[A07] The light emitting element according to any one of [A02] to [A05], in which the optical path control unit is constituted by a convex lens member or has a convex lens shape.

[A08] <<Light Emitting Element of Second Configuration>>
The light emitting element according to [A01], in which a light incident surface of the optical path control unit is convex toward a top surface of the intermediate layer.

[A09] The light emitting element according to [A08], in which a light emitting surface of the optical path control unit is flat.

[A10] The light emitting element according to [A08] or [A09], in which
the first coating layer covers a part of the light incident surface of the optical path control unit on the intermediate layer side, and
the second coating layer covers the first coating layer and the rest of the light incident surface of the optical path control unit.

[A11] The light emitting element according to any one of [A08] to [A10], in which the optical path control unit has a positive optical power.

[A12] The light emitting element according to any one of [A08] to [A10], in which the optical path control unit is constituted by a convex lens member or has a convex lens shape.

[A13] The light emitting element according to any one of [A02] to [A12], in which
if the refractive index of air is represented by $n_{air}$, in a case where a light emitting surface of the optical path control unit is convex with respect to a top surface of the intermediate layer, $$n_{air} < n_1 < n_2 < n_0$$

is satisfied, and
in a case where a light incident surface of the optical path control unit is convex toward the top surface of the intermediate layer, $$n_{air} < n_2 < n_1 < n_0$$

is satisfied.

[A14] The light emitting element according to [A13], in which
in a case where a light emitting surface of the optical path control unit is convex with respect to a top surface of the intermediate layer, $$0.25 \leq n_0 - n_1 \leq 0.50,$$

$$0.15 \leq n_0 - n_2 \leq 0.30, \text{ and}$$

$$0.10 \leq n_2 - n_1 \leq 0.30$$

are satisfied, and in a case where a light incident surface of the optical path control unit is convex toward the top surface of the intermediate layer, $$0.25 \leq n_0 - n_1 \leq 0.50,$$

$$0.15 \leq n_0 - n_2 \leq 0.30, \text{ and}$$

$$0.10 \leq n_2 - n_1 \leq 0.30$$

are satisfied.

[A15] <<Light Emitting Element of Third Configuration>>
The light emitting element according to [A01], in which a light emitting surface of the optical path control unit is concave with respect to a top surface of the intermediate layer.

[A16] The light emitting element according to [A15], in which a light incident surface of the optical path control unit is in contact with the top surface of the intermediate layer.

[A17] The light emitting element according to [A15] or [A16], in which
the first coating layer covers a part of the light emitting surface of the optical path control unit on the intermediate layer side, and
the second coating layer covers the first coating layer and the rest of the light emitting surface of the optical path control unit.

[A18] The light emitting element according to any one of [A15] to [A17], in which the optical path control unit has a negative optical power.

[A19] The light emitting element according to any one of [A15] to [A17], in which the optical path control unit is constituted by a concave lens member or has a concave lens shape.

[A20] <<Light Emitting Element of Fourth Configuration>>
The light emitting element according to [A01], in which a light incident surface of the optical path control unit is concave toward a top surface of the intermediate layer.

[A21] The light emitting element according to [A20], in which a light emitting surface of the optical path control unit is flat.

[A22] The light emitting element according to [A20] or [21], in which
the first coating layer covers a part of the light incident surface of the optical path control unit on the intermediate layer side, and
the second coating layer covers the first coating layer and the rest of the light incident surface of the optical path control unit.

[A23] The light emitting element according to any one of [A20] to [A22], in which the optical path control unit has a negative optical power.

[A24] The light emitting element according to any one of [A20] to [A22], in which the optical path control unit is constituted by a concave lens member or has a concave lens shape.

[A25] The light emitting element according to any one of [A15] to [A24], in which
if the refractive index of air is represented by $n_{air}$, in a case where a light emitting surface of the optical path control unit is concave with respect to a top surface of the intermediate layer, $$n_{air} < n_0 < n_1 < n_2$$

is satisfied, and
in a case where a light incident surface of the optical path control unit is concave toward the top surface of the inter-mediate layer, $$n_{air} < n_0 < n_2 < n_1$$

is satisfied.

[A26] The light emitting element according to [A25], in which
in a case where a light emitting surface of the optical path control unit is concave with respect to a top surface of the intermediate layer, $$0.15 \leq n_1 - n_0 \leq 0.30,$$

$$0.25 \leq n_2 - n_0 \leq 0.50, \text{ and}$$

$$0.10 \leq n_2 - n_1 \leq 0.30$$

are satisfied, and in a case where a light incident surface of the optical path control unit is concave toward the top surface of the intermediate layer, $0.15 \leq n_2 - n_0 \leq 0.30$, $0.25 \leq n_1 - n_0 \leq 0.50$, and $0.10 \leq n_1 - n_2 \leq 0.30$ are satisfied.

[A27] The light emitting element according to any one of [A01] to [A26], in which
if the height of the optical path control unit is represented by $H_0$ and a minimum distance between optical path control units constituting adjacent light emitting elements is represented by $L_0$, $0 \leq L_0/H_0 \leq 0.5$ is satisfied.

[A28] The light emitting element according to any one of [A01] to [A27], in which
if the size of a light emitting element is 1.00, a minimum distance $L_0$ between optical path control units constituting adjacent light emitting elements is 0.1 or less.

[A29] The light emitting element according to any one of [A01] to [A28], in which
the height of the optical path control unit is represented by $H_0$ and the thickness of the first coating layer covering a part of an outer surface of the optical path control unit on the intermediate layer side is represented by $H_1$, $0.10 \leq H_1/H_0 \leq 0.90$ is satisfied, and desirably, $0.30 \leq H_1/H_0 \leq 0.70$ is satisfied.

[A30] The light emitting element according to any one of [A01] to [A29], in which
the light emitting portion includes an organic electroluminescence layer.

[A31] The light emitting element according to any one of [A01] to [A30], in which
an optical path control unit and an optical path control unit constituting adjacent light emitting element are in contact with each other.

[A32] The light emitting element according to any one of [A01] to [A30], in which
an optical path control unit and an optical path control unit constituting adjacent light emitting element are separated from each other.

[A33] The light emitting element according to any one of [A01] to [A32], in which the intermediate layer includes a color filter layer.

[A34] The light emitting element according to any one of [A01] to [A32], in which a color filter layer is formed on a light emitting side of the optical path control unit and the coating layer.

[A35] The light emitting element according to any one of [A01] to [A34], in which a top surface of the first coating layer is flat or concave toward the intermediate layer.

[B01] <<Light Emitting Element: Second Aspect>>
A light emitting element including:
a light emitting portion;
an intermediate layer covering the light emitting portion;
an optical path control unit disposed on or above the intermediate layer; and
a coating layer covering at least the optical path control unit, in which
light emitted from the light emitting portion passes through the intermediate layer, enters the optical path control unit, and exits from the optical path control unit,
the coating layer includes a first coating layer and a second coating layer,
the first coating layer covers a part of an outer surface of the optical path control unit on the intermediate layer side,
the second coating layer covers the first coating layer and the rest of the outer surface of the optical path control unit, and
the first coating layer is constituted by a material different from a material constituting the second coating layer.

[B02] <<Light Emitting Element: Third Aspect>>
A light emitting element including:
a light emitting portion;
an intermediate layer covering the light emitting portion;
an optical path control unit disposed on or above the intermediate layer; and
a coating layer covering at least the optical path control unit, in which
light emitted from the light emitting portion passes through the intermediate layer, enters the optical path control unit, and exits from the optical path control unit,
the coating layer includes a first coating layer and a second coating layer,
the first coating layer is in contact with an outer edge side of the optical path control unit on an outer surface of the optical path control unit,
the second coating layer is in contact with a central side of the optical path control unit on the outer surface of the optical path control unit, and
a value $n_0$ of a refractive index of a material constituting the optical path control unit, a value $n_1$ of a refractive index of a material constituting the first coating layer, and a value $n_2$ of a refractive index of a material constituting the second coating layer are different from each other, or
the first coating layer is constituted by a material different from a material constituting the second coating layer.

[C01] <<Light Emitting Element of First Configuration>>
The light emitting element according to [B01] or [B02], in which a light emitting surface of the optical path control unit is convex with respect to a top surface of the intermediate layer.

[C02] The light emitting element according to [C01], in which a light incident surface of the optical path control unit is in contact with the top surface of the intermediate layer.

[C03] The light emitting element according to [C01] or [C02], in which
the first coating layer covers a part of the light emitting surface of the optical path control unit on the intermediate layer side, and
the second coating layer covers the first coating layer and the rest of the light emitting surface of the optical path control unit.

[C04] The light emitting element according to [C03], in which the first coating layer further covers the intermediate layer.

[C05] The light emitting element according to any one of [C01] to [C04], in which the optical path control unit has a positive optical power.

[C06] The light emitting element according to any one of [C01] to [C04], in which the optical path control unit is constituted by a convex lens member or has a convex lens shape.

[C07] <<Light Emitting Element of Second Configuration>>

The light emitting element according to [B01] or [B02], in which a light incident surface of the optical path control unit is convex toward a top surface of the intermediate layer.

[C08] The light emitting element according to [C07], in which a light emitting surface of the optical path control unit is flat.

[C09] The light emitting element according to [C07] or [C08], in which the first coating layer covers a part of the light incident surface of the optical path control unit on the intermediate layer side, and the second coating layer covers the first coating layer and the rest of the light incident surface of the optical path control unit.

[C10] The light emitting element according to any one of [C07] to [C09], in which the optical path control unit has a positive optical power.

[C11] The light emitting element according to any one of [C07] to [C09], in which the optical path control unit is constituted by a convex lens member or has a convex lens shape.

[C12] The light emitting element according to any one of [C01] to [C11], in which if the refractive index of air is represented by $n_{air}$, in a case where a light emitting surface of the optical path control unit is convex with respect to a top surface of the intermediate layer, $n_{air} < n_1 < n_2 < n_0$ is satisfied, and in a case where a light incident surface of the optical path control unit is convex toward the top surface of the intermediate layer, $n_{air} < n_2 < n_1 < n_0$ is satisfied.

[C13] The light emitting element according to [C12], in which in a case where a light emitting surface of the optical path control unit is convex with respect to a top surface of the intermediate layer, $0.25 \leq n_0 - n_1 \leq 0.50$, $0.15 \leq n_0 - n_2 \leq 0.30$, and $0.10 \leq n_2 - n_1 \leq 0.30$ are satisfied, and in a case where a light incident surface of the optical path control unit is convex toward the top surface of the intermediate layer, $0.25 \leq n_0 - n_2 \leq 0.50$, $0.15 \leq n_0 - n_1 \leq 0.30$, and $0.10 \leq n_1 - n_2 \leq 0.30$ are satisfied.

[C14] <<Light Emitting Element of Third Configuration>>

The light emitting element according to [B01] or [B02], in which a light emitting surface of the optical path control unit is concave with respect to a top surface of the intermediate layer.

[C15] The light emitting element according to [C14], in which a light incident surface of the optical path control unit is in contact with the top surface of the intermediate layer.

[C16] The light emitting element according to [C14] or [C15], in which the first coating layer covers a part of the light emitting surface of the optical path control unit on the intermediate layer side, and the second coating layer covers the first coating layer and the rest of the light emitting surface of the optical path control unit.

[C17] The light emitting element according to any one of [C14] to [C16], in which the optical path control unit has a negative optical power.

[C18] The light emitting element according to any one of [C14] to [C16], in which the optical path control unit is constituted by a concave lens member or has a concave lens shape.

[C19] <<Light Emitting Element of Fourth Configuration>>

The light emitting element according to [B01] or [B02], in which a light incident surface of the optical path control unit is concave toward a top surface of the intermediate layer.

[C20] The light emitting element according to [C19], in which a light emitting surface of the optical path control unit is flat.

[C21] The light emitting element according to [C19] or [C20], in which the first coating layer covers a part of the light incident surface of the optical path control unit on the intermediate layer side, and the second coating layer covers the first coating layer and the rest of the light incident surface of the optical path control unit.

[C22] The light emitting element according to any one of [C19] to [C21], in which the optical path control unit has a negative optical power.

[C23] The light emitting element according to any one of [C19] to [C21], in which the optical path control unit is constituted by a concave lens member or has a concave lens shape.

[C24] The light emitting element according to any one of [C19] to [C23], in which if the refractive index of air is represented by $n_{air}$, in a case where a light emitting surface of the optical path control unit is concave with respect to a top surface of the intermediate layer, $n_{air} < n_0 < n_1 < n_2$ is satisfied, and in a case where a light incident surface of the optical path control unit is concave toward the top surface of the intermediate layer, $n_{air} < n_0 < n_2 < n_1$ is satisfied.

[C25] The light emitting element according to [C24], in which in a case where a light emitting surface of the optical path control unit is concave with respect to a top surface of the intermediate layer, $0.15 \leq n_1 - n_0 \leq 0.30$, $0.25 \leq n_2 - n_0 \leq 0.50$, and $0.10 \leq n_2 - n_1 \leq 0.30$ are satisfied, and in a case where a light incident surface of the optical path control unit is concave toward the top surface of the intermediate layer, $0.15 \leq n_2 - n_0 \leq 0.30$, $0.25 \leq n_1 - n_0 \leq 0.50$, and $0.10 \leq n_1 - n_2 \leq 0.30$ are satisfied.

[C26] The light emitting element according to any one of [B01] to [C25], in which
if the height of the optical path control unit is represented by $H_0$ and a minimum distance between optical path control units constituting adjacent light emitting elements is represented by $L_0$, $0 \leq L_0/H_0 \leq 0.5$ is satisfied.

[C27] The light emitting element according to any one of [B01] to [C26], in which
if the size of a light emitting element is 1.00, a minimum distance $L_0$ between optical path control units constituting adjacent light emitting elements is 0.1 or less.

[C28] The light emitting element according to any one of [B01] to [C27], in which
the height of the optical path control unit is represented by $H_0$ and the thickness of the first coating layer covering a part of an outer surface of the optical path control unit on the intermediate layer side is represented by $H_1$, $0.10 \leq H_1/H_0 \leq 0.90$ is satisfied, and desirably,
$0.30 \leq H_1/H_0 \leq 0.70$
is satisfied.

[C29] The light emitting element according to any one of [B01] to [C28], in which
the light emitting portion includes an organic electroluminescence layer.

[C30] The light emitting element according to any one of [B01] to [C29], in which
an optical path control unit and an optical path control unit constituting adjacent light emitting element are in contact with each other.

[C31] The light emitting element according to any one of [B01] to [C29], in which
an optical path control unit and an optical path control unit constituting adjacent light emitting element are separated from each other.

[C32] The light emitting element according to any one of [B01] to [C31], in which the intermediate layer includes a color filter layer.

[C33] The light emitting element according to any one of [B01] to [C31], in which a color filter layer is formed on a light emitting side of the optical path control unit and the coating layer.

[C34] The light emitting element according to any one of [B01] to [C33], in which a top surface of the first coating layer is flat or concave toward the intermediate layer.

[D01] <<Display Device: First Aspect>>
A display device including:
a first substrate and a second substrate; and
a plurality of light emitting elements formed between the first substrate and the second substrate, in which
each of the light emitting elements includes:
a light emitting portion;
an intermediate layer covering the light emitting portion;
an optical path control unit disposed on or above the intermediate layer; and
a coating layer covering at least the optical path control unit, in each of the light emitting elements,
light emitted from the light emitting portion passes through the intermediate layer, enters the optical path control unit, and exits from the optical path control unit,
the coating layer includes a first coating layer and a second coating layer,
the first coating layer covers a part of an outer surface of the optical path control unit on the intermediate layer side,
the second coating layer covers the first coating layer and the rest of the outer surface of the optical path control unit, and
a value $n_0$ of a refractive index of a material constituting the optical path control unit, a value $n_1$ of a refractive index of a material constituting the first coating layer, and a value $n_2$ of a refractive index of a material constituting the second coating layer are different from each other, or
the first coating layer is constituted by a material different from a material constituting the second coating layer.

[D02] <<Display Device: Second Aspect>>
A display device including:
a first substrate and a second substrate; and
a plurality of light emitting elements formed between the first substrate and the second substrate, in which
each of the light emitting elements includes:
a light emitting portion;
an intermediate layer covering the light emitting portion;
an optical path control unit disposed on or above the intermediate layer; and
a coating layer covering at least the optical path control unit, in each of the light emitting elements,
light emitted from the light emitting portion passes through the intermediate layer, enters the optical path control unit, and exits from the optical path control unit,
the coating layer includes a first coating layer and a second coating layer,
the first coating layer is in contact with an outer edge side of the optical path control unit on an outer surface of the optical path control unit,
the second coating layer is in contact with a central side of the optical path control unit on the outer surface of the optical path control unit, and
a value $n_0$ of a refractive index of a material constituting the optical path control unit, a value $n_1$ of a refractive index of a material constituting the first coating layer, and a value $n_2$ of a refractive index of a material constituting the second coating layer are different from each other, or
the first coating layer is constituted by a material different from a material constituting the second coating layer.

[D03] <<Display Device: Third Aspect>>
A display device including:
a first substrate and a second substrate; and
a plurality of light emitting elements formed between the first substrate and the second substrate, in which
each the light emitting elements is the light emitting element according to any one of [A01] to [C34].

[E01] The display device according to [D03], in which if a distance between a normal passing through the center of the light emitting portion and a normal passing through the center of the optical path control unit is represented by $D_0$, in at least some of the light emitting elements included in a display panel, values of distance $D_0$ are not 0.

[E02] The display device according to [E01], in which a reference point P is assumed, and the distance $D_0$ depends on a distance $D_1$ from the reference point P to the normal passing through the center of the light emitting portion.

[E03] The display device according to [E01] or [E02], in which the reference point P is assumed in the display panel.

[E04] The display device according to [E03], in which the reference point P is not located in the central region of the display panel.

[E05] The display device according to [E03] or [E04], in which a plurality of reference points P is assumed.

[E06] The display device according to [E03], in which in a case where one reference point P is assumed, the reference point P is not included in the central region of the display panel, and in a case where a plurality of reference points P is assumed, at least one reference point P is not included in the central region of the display panel.

[E07] The display device according to [E01] or [E02], in which the reference point P is assumed outside the display panel.

[E08] The display device according to [E07], in which a plurality of reference points P is assumed.

[E09] The display device according to any one of [E01] to [E08], in which light that has been emitted from the light emitting elements and has passed through the optical path control units converges (is condensed) on a certain region in a space outside the display device.

[E10] The display device according to any one of [E01] to [E08], in which light that has been emitted from the light emitting elements and has passed through the optical path control units is diverged in a space outside the display device.

[E11] The display device according to any one of [E01] to [E06], in which light that has been emitted from the light emitting elements and has passed through the optical path control units is parallel light.

[E12] The display device according to any one of [E01] to [E11], in which a reference point P is set, the plurality of light emitting elements is arranged in a first direction and a second direction different from the first direction, and if a distance from the reference point P to the normal passing through the center of the light emitting portion is represented by $D_1$, values of distance $D_0$ in the first and second directions are represented by $D_{0-X}$ and $D_{0-Y}$, respectively, and values of distance $D_1$ in the first and second directions are represented by $D_{1-X}$ and $D_{1-Y}$, respectively, $D_{0-X}$ changes linearly with respect to a change of $D_{1-X}$, and $D_{0-Y}$ changes linearly with respect to a change of $D_{1-Y}$, or $D_{0-X}$ changes linearly with respect to a change of $D_{1-X}$, and $D_{0-Y}$ changes non-linearly with respect to a change of $D_{1-Y}$, or $D_{0-X}$ changes non-linearly with respect to a change of $D_{1-X}$, and $D_{0-Y}$ changes linearly with respect to a change of $D_{1-Y}$, or $D_{0-X}$ changes non-linearly with respect to a change of $D_{1-X}$, and $D_{0-Y}$ changes non-linearly with respect to a change of $D_{1-Y}$.

[E13] The display device according to any one of [E01] to [E12], in which a reference point P is set, and if a distance from the reference point P to the normal passing through the center of the light emitting portion is represented by $D_1$, a value of distance $D_0$ increases as a value of distance $D_1$ increases.

[E14] The display device according to any one of [E01] to [E13], in which a wavelength selection portion is disposed on a light incident side or a light emitting side of the optical path control unit.

[E15] The display device according to [E14], in which an orthophoto image of the optical path control unit coincides with an orthophoto image of the wavelength selection portion, or is included in the orthophoto image of the wavelength selection portion.

[E16] The display device according to [E14] or [E15], in which in a light emitting element in which a value of distance $D_0$ is not 0, a normal passing through the center of the wavelength selection portion coincides with the normal passing through the center of the light emitting portion.

[E17] The display device according to [E14] or [E15], in which in a light emitting element in which a value of distance $D_0$ is not 0, a normal passing through the center of the wavelength selection portion coincides with the normal passing through the center of the optical path control unit.

[E18] The display device according to [E14], in which an orthophoto image of the optical path control unit is included in an orthophoto image of the wavelength selection portion, and in a light emitting element in which a value of distance $D_0$ is not 0, a normal passing through the center of the wavelength selection portion coincides with the normal passing through the center of the light emitting portion.

[E19] The display device according to [E14], in which an orthophoto image of the optical path control unit is included in an orthophoto image of the wavelength selection portion, and in a light emitting element in which a value of distance $D_0$ is not 0, a normal passing through the center of the wavelength selection portion coincides with the normal passing through the center of the optical path control unit.

[E20] The display device according to [E14], in which an orthophoto image of the optical path control unit coincides with an orthophoto image of the wavelength selection portion, and in a light emitting element in which a value of distance $D_0$ is not 0, a normal passing through the center of the wavelength selection portion coincides with the normal passing through the center of the optical path control unit.

[E21] The display device according to any one of [E14] to [E17], in which a light absorption layer is formed between wavelength selection portions of adjacent light emitting elements.

[E22] The display device according to any one of [E01] to [E21], in which a light absorption layer is formed between adjacent optical path control units.

REFERENCE SIGNS LIST 10, 10R, 10G, 10B, 10W, 10*a*, 10*b*, 10*c*, 10*d*, 10*e* Light emitting element
11 First substrate
12 Second substrate
20 Transistor
21 Gate electrode
22 Gate insulating layer
23 Channel forming region
24 Source/drain region
25 Element isolating region
26 Base body (interlayer insulating layer)
27 Contact plug
28 Insulating layer
30 Light emitting portion 31 First electrode
32 Second electrode
33 Organic electroluminescence layer (light emitting layer)
34 Intermediate layer
35 First coating layer
36 Second coating layer
37 Interface between first coating layer and second
38 coating layer
40 Sealing resin layer
41 Light reflecting layer
42 Interlayer insulating layer
42 Base film
50, 50' Optical path control unit
50" Optical path control unit (light reflecting member)
51 Light emitting surface (outer surface) of optical path control unit in light emitting element of Example 1
52 Light incident surface of optical path control unit in light emitting element of Example 1
53 Light incident surface (outer surface) of optical path control unit in light emitting element of Example 2
54 Light emitting surface of optical path control unit in light emitting element of Example 2
55 Light emitting surface (outer surface) of optical path control unit in light emitting element of Example 3
56 Light incident surface of optical path control unit in light emitting element of Example 3
57 Light incident surface (outer surface) of optical path control unit in light emitting element of Example 4
58 Light emitting surface of optical path control unit in light emitting element of Example 4
60 Lens member forming layer
61 Resist material layer
$CF$, $CF_R$, $CF_G$, $CF_B$ Color filter layer

The invention claimed is:

1. A light emitting element comprising:
a light emitting portion;
an intermediate layer covering the light emitting portion;
an optical path control unit disposed on or above the intermediate layer; and
a coating layer covering at least the optical path control unit, wherein
light emitted from the light emitting portion passes through the intermediate layer, enters the optical path control unit, and exits from the optical path control unit,
the coating layer includes a first coating layer and a second coating layer,
the first coating layer covers a part of an outer surface of the optical path control unit on the intermediate layer side,
the second coating layer covers the first coating layer and a rest of the outer surface of the optical path control unit, and
a value $n_0$ of a refractive index of a material constituting the optical path control unit, a value $n_1$ of a refractive index of a material constituting the first coating layer, and a value $n_2$ of a refractive index of a material constituting the second coating layer are different from each other,
wherein the value $n_1$ is less than the value $n_0$,
wherein a light emitting surface of the optical path control unit is concave with respect to a top surface of the intermediate layer,
wherein the first coating layer covers a part of the light emitting surface of the optical path control unit on the intermediate layer side, and
wherein the second coating layer covers the first coating layer and a rest of the light emitting surface of the optical path control unit.

2. The light emitting element according to claim 1, wherein
the optical path control unit has a negative optical power.

3. The light emitting element according to claim 1, wherein
the light emitting portion includes an organic electroluminescence layer.

4. A light emitting element comprising:
a light emitting portion;
an intermediate layer covering the light emitting portion;
an optical path control unit disposed on or above the intermediate layer; and
a coating layer covering at least the optical path control unit, wherein
light emitted from the light emitting portion passes through the intermediate layer, enters the optical path control unit, and exits from the optical path control unit,
the coating layer includes a first coating layer and a second coating layer,
the first coating layer covers a part of an outer surface of the optical path control unit on the intermediate layer side,
the second coating layer covers the first coating layer and a rest of the outer surface of the optical path control unit, and
a value $n_0$ of a refractive index of a material constituting the optical path control unit, a value $n_1$ of a refractive index of a material constituting the first coating layer, and a value $n_2$ of a refractive index of a material constituting the second coating layer are different from each other,
wherein the value $n_1$ is less than the value $n_0$,
wherein a light incident surface of the optical path control unit is concave toward a top surface of the intermediate layer,
wherein the first coating layer covers a part of the light incident surface of the optical path control unit on the intermediate layer side, and
wherein the second coating layer covers the first coating layer and a rest of the light incident surface of the optical path control unit.

5. The light emitting element according to claim 4, wherein
the optical path control unit has a negative optical power.

6. A light emitting element comprising:
a light emitting portion;
an intermediate layer covering the light emitting portion;
an optical path control unit disposed on or above the intermediate layer; and
a coating layer covering at least the optical path control unit, wherein
light emitted from the light emitting portion passes through the intermediate layer, enters the optical path control unit, and exits from the optical path control unit,
the coating layer includes a first coating layer and a second coating layer,
the first coating layer covers a part of an outer surface of the optical path control unit on the intermediate layer side,
the second coating layer covers the first coating layer and a rest of the outer surface of the optical path control unit, and the first coating layer is constituted by a first material different from a second material constituting the second coating layer, and the first material has a refractive index that is lower than a refractive index associated with a third material of the optical path control unit, wherein a light emitting surface of the optical path control unit is concave with respect to a top surface of the intermediate layer, wherein the first coating layer covers a part of the light emitting surface of the optical path control unit on the intermediate layer side, and wherein the second coating layer covers the first coating layer and a rest of the light emitting surface of the optical path control unit.

7. The light emitting element according to claim 6, wherein
the optical path control unit has a negative optical power.

8. The light emitting element according to claim 6, wherein
the light emitting portion includes an organic electroluminescence layer.

9. A light emitting element comprising:
a light emitting portion;
an intermediate layer covering the light emitting portion;
an optical path control unit disposed on or above the intermediate layer; and
a coating layer covering at least the optical path control unit, wherein
light emitted from the light emitting portion passes through the intermediate layer, enters the optical path control unit, and exits from the optical path control unit,
the coating layer includes a first coating layer and a second coating layer,
the first coating layer is in contact with an outer edge side of the optical path control unit on an outer surface of the optical path control unit,
the second coating layer is in contact with a central side of the optical path control unit on the outer surface of the optical path control unit, and
a value $n_0$ of a refractive index of a material constituting the optical path control unit, a value $n_1$ of a refractive index of a material constituting the first coating layer, and a value $n_2$ of a refractive index of a material constituting the second coating layer are different from each other, wherein the value $n_1$ is less than the value $n_0$, or
the first coating layer is constituted by a first material different from a second material constituting the second coating layer, and wherein the first material has a refractive index that is lower than a refractive index associated with a third material of the optical path control unit,
wherein a light emitting surface of the optical path control unit is concave with respect to a top surface of the intermediate layer,
wherein the first coating layer covers a part of the light emitting surface of the optical path control unit on the intermediate layer side, and
wherein the second coating layer covers the first coating layer and a rest of the light emitting surface of the optical path control unit.

10. The light emitting element according to claim 9, wherein
the optical path control unit has a negative optical power.

11. The light emitting element according to claim 9, wherein
the light emitting portion includes an organic electroluminescence layer.

12. A display device comprising:
a first substrate and a second substrate; and a plurality of light emitting elements formed between the first substrate and the second substrate, wherein
each of the plurality of light emitting elements includes:
a light emitting portion;
an intermediate layer covering the light emitting portion;
an optical path control unit disposed on or above the intermediate layer; and
a coating layer covering at least the optical path control unit, in each of the plurality of light emitting elements,
light emitted from the light emitting portion passes through the intermediate layer, enters the optical path control unit, and exits from the optical path control unit,
the coating layer includes a first coating layer and a second coating layer,
the first coating layer covers a part of an outer surface of the optical path control unit on the intermediate layer side,
the second coating layer covers the first coating layer and a rest of the outer surface of the optical path control unit, and
a value $n_0$ of a refractive index of a material constituting the optical path control unit, a value $n_1$ of a refractive index of a material constituting the first coating layer, and a value $n_2$ of a refractive index of a material constituting the second coating layer are different from each other, wherein the value $n_1$ is less than the value $n_0$, or
the first coating layer is constituted by a first material different from a second material constituting the second coating layer, and wherein the first material has a refractive index that is lower than a refractive index associated with a third material of the optical path control unit,
wherein a light emitting surface of the optical path control unit is concave with respect to a top surface of the intermediate layer,
wherein the first coating layer covers a part of the light emitting surface of the optical path control unit on the intermediate layer side, and
wherein the second coating layer covers the first coating layer and a rest of the light emitting surface of the optical path control unit.

13. The display device according to claim 12, wherein
the optical path control unit has a negative optical power.

14. The display device according to claim 12, wherein
the light emitting portion includes an organic electroluminescence layer.

15. A display device comprising:
a first substrate and a second substrate; and
a plurality of light emitting elements formed between the first substrate and the second substrate, wherein
each of the plurality of light emitting elements includes:
a light emitting portion;
an intermediate layer covering the light emitting portion;

an optical path control unit disposed on or above the intermediate layer; and a coating layer covering at least the optical path control unit, in each of the plurality of light emitting elements, light emitted from the light emitting portion passes through the intermediate layer, enters the optical path control unit, and exits from the optical path control unit, the coating layer includes a first coating layer and a second coating layer, the first coating layer is in contact with an outer edge side of the optical path control unit on an outer surface of the optical path control unit, the second coating layer is in contact with a central side of the optical path control unit on the outer surface of the optical path control unit, and a value $n_0$ of a refractive index of a material constituting the optical path control unit, a value $n_1$ of a refractive index of a material constituting the first coating layer, and a value $n_2$ of a refractive index of a material constituting the second coating layer are different from each other, wherein the value $n_1$ is less than the value $n_0$, or the first coating layer is constituted by a first material different from a second material constituting the second coating layer, and wherein the first material has a refractive index that is lower than a refractive index associated with a third material of the optical path control unit, wherein a light emitting surface of the optical path control unit is concave with respect to a top surface of the intermediate layer, wherein the first coating layer covers a part of the light emitting surface of the optical path control unit on the intermediate layer side, and wherein the second coating layer covers the first coating layer and a rest of the light emitting surface of the optical path control unit.

16. The display device according to claim 15, wherein the optical path control unit has a negative optical power.

17. The display device according to claim 15, wherein the light emitting portion includes an organic electroluminescence layer.

* * * * *